(12) United States Patent
Kodama

(10) Patent No.: US 7,109,533 B2
(45) Date of Patent: Sep. 19, 2006

(54) ELECTROSTATIC DISCHARGE PROTECTION DEVICE

(75) Inventor: Noriyuki Kodama, Kanagawa (JP)

(73) Assignee: Nec Electronics Corporation, Kanagawa (JP)

( * ) Notice: Subject to any disclaimer, the term of this patent is extended or adjusted under 35 U.S.C. 154(b) by 715 days.

(21) Appl. No.: 10/394,179

(22) Filed: Mar. 24, 2003

(65) Prior Publication Data

US 2003/0179523 A1 Sep. 25, 2003

(30) Foreign Application Priority Data

Mar. 25, 2002 (JP) ............................. 2002-083250

(51) Int. Cl.
H01L 29/74 (2006.01)

(52) U.S. Cl. .............. 257/173; 257/141; 257/162; 257/167; 257/355; 257/360; 257/362

(58) Field of Classification Search ............... None
See application file for complete search history.

(56) References Cited

U.S. PATENT DOCUMENTS

| 5,012,317 A | | 4/1991 | Rountre |
| 5,270,565 A | * | 12/1993 | Lee et al. ............... 257/358 |
| 5,465,189 A | | 11/1995 | Polgreen et al. |
| 5,747,834 A | | 5/1998 | Chen et al. |
| 5,856,214 A | * | 1/1999 | Yu ............................ 438/133 |
| 6,433,393 B1 | | 8/2002 | Narita |
| 6,541,801 B1 | * | 4/2003 | Vashchenko et al. ....... 257/119 |

FOREIGN PATENT DOCUMENTS

JP 2001-085534 A 3/2001

OTHER PUBLICATIONS

Mergens et al., "High Holding Current SCRs (HHI-SCR) for ESD Protection and Latch-up Immune IC Operation," *EOS/ESD Symposium*, 2002, © Sarnoff and ESD Association.
Russ et al., "GGSCRs: GGNMOS Triggered Silicon Controlled Rectifiers for ESD Protection in Deep Sub-Micron CMOS Processes," *EOS/ESD Symposium* 2001, © Sarnoff and ESD Association.
Wu et al., "Breakdown and Latent Damage of Ultra-Thin Gate Oxides under ESD Stress Conditions," *EOS/ESD Symposium*, 2000.

* cited by examiner

Primary Examiner—Wai-Sing Louie
(74) Attorney, Agent, or Firm—Foley & Lardner LLP

(57) ABSTRACT

There is provided an electrostatic discharge protection device comprising a P conductive type first P well region 101 formed in a P type epitaxial layer 31 being deposited on a surface of a P+ substrate 30 having a prescribed thickness, an N conductive type first N well 101 a periphery thereof being brought into direct contact with and surrounded by a first P well region 101, P conductive type first P diffusion regions 121a and 121b, a P conductive type third P diffusion region 125, and an N conductive type second N diffusion region 223 arranged within a first P well region 101, and a P conductive type second P diffusion region 123 and an N conductive type first N diffusion region 221 arranged within a first N well 201.

33 Claims, 30 Drawing Sheets

FIRST TRIGGER DEVICE
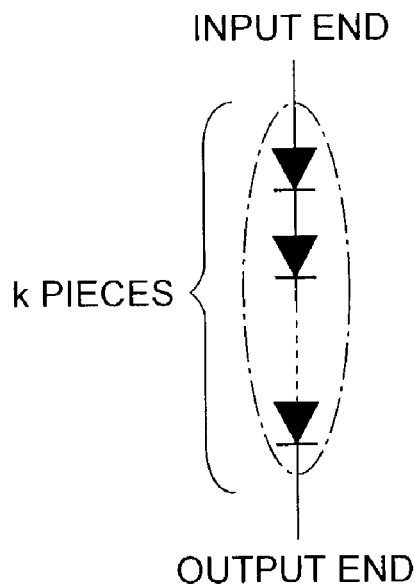
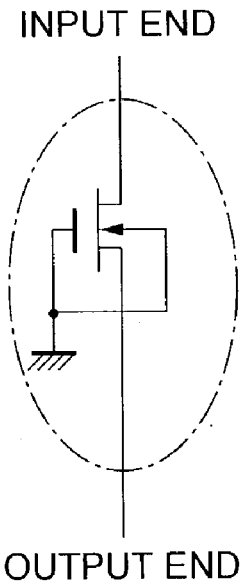
FIG. 17A    FIG. 17B
SECOND TRIGGER DEVICE
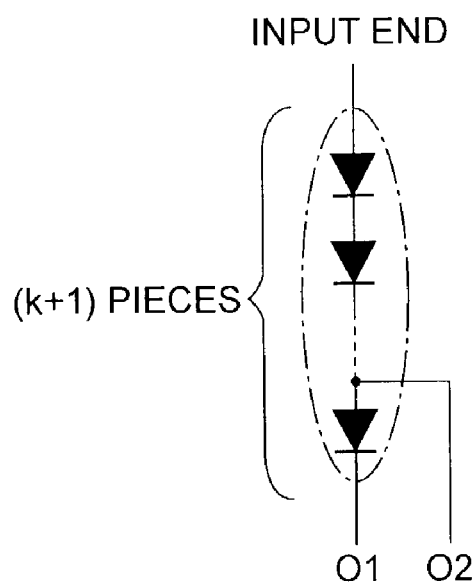
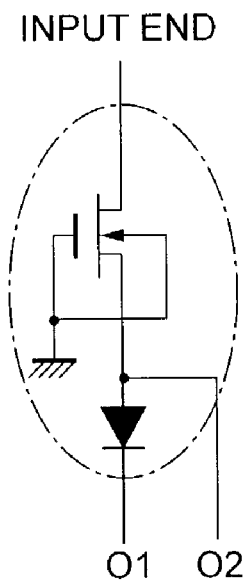
FIG. 17C    FIG. 17D

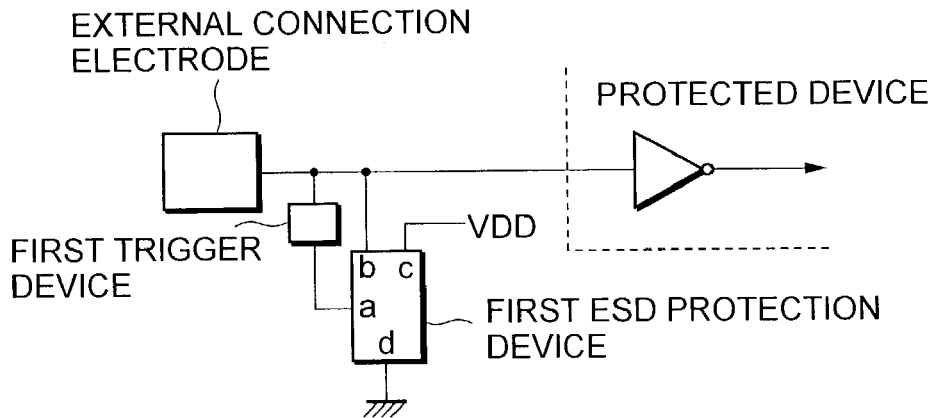

a THIRD P DIFFUSION REGION, FOURTH P DIFFUSION REGION
b SECOND P DIFFUSION REGION, FIFTH P DIFFUSION REGION
c FIRST N DIFFUSION REGION, FIFTH N DIFFUSION REGION
d FIRST P DIFFUSION REGION, SECOND N DIFFUSION REGION

FIG. 18A

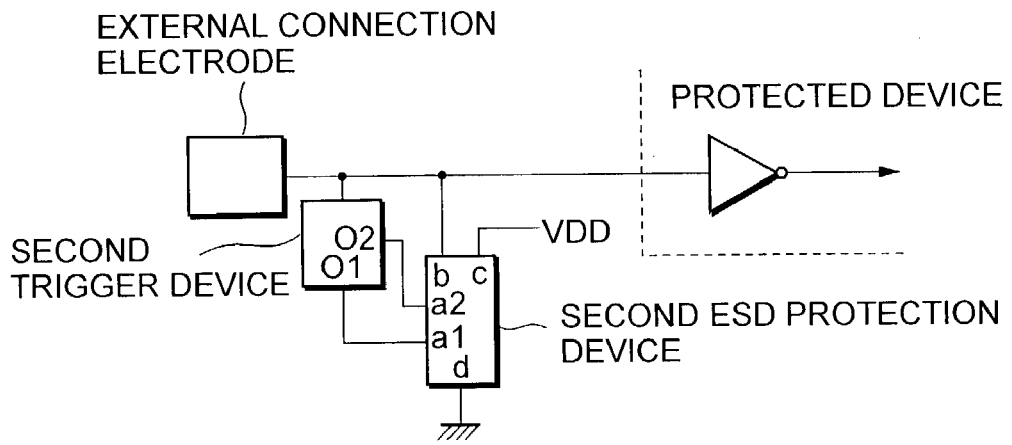

a1  THIRD P DIFFUSION REGION
a2  FOURTH P DIFFUSION REGION
b   SECOND P DIFFUSION REGION
c   FIRST N DIFFUSION REGION
d   FIRST P DIFFUSION REGION, SECOND N DIFFUSION REGION
O1  FIRST OUTPUT END
O2  SECOND OUTPUT END

FIG. 18B

FIRST CURRENT - - - ▷
SECOND CURRENT ──▷

ELECTROSTATIC DISCHARGE PROTECTION DEVICE

BACKGROUND OF THE INVENTION

1. Field of the Invention

The present invention relates to an electrostatic discharge protection device of a semiconductor device (hereinafter, referred to as LSI), more particularly to an electrostatic discharge protection device which is formed in an LSI chip, and performs as a Silicon Controlled Rectifier (SCR) type operation when respective circuit devices in the LSI are protected from electrostatic discharge.

2. Description of the Prior Art

Recently, a function of an LSI has been complicated, moreover, its packaging density has been formed into high density. Further, during the fabricating process, assembling process, and others of the LSI, the LSI is liable to be easily broken because of ESD (electrostatic discharge). Therefore, an electrostatic discharge protection device (hereinafter, referred to as ESD protection device) has been used for protecting circuit devices from ESD by discharging static electricity efficiently and with a safety pass.

At the beginning of a study of ESD, a human body charge model (HBM) has stood for a breakdown mechanism caused by flowing an electric charge into LSI from an external body. A test for evaluating an electrostatic withstand amount has been performed by HBM.

Further, the breakdown mechanism of LSI due to electrostatic discharge has been explained as a phenomenon to discharge the electric charge built-up in LSI from actual detailed analysis of failure of LSI, or the electric charge electrostatically induced to an external metallic body. That is, the breakdown mechanism is explained as a charged device model (CDM). By a test corresponding to that, the electrostatic withstand amount of the ESD protection device has been evaluated and made to be an index.

A discharge current waveform of the HBM is enormously different from a discharge current waveform of the CDM. For example, a pulse rise time of the current waveform in the HBM is set as 2–10 nanoseconds (hereinafter, referred to as ns). In contrast thereto, the pulse rise time of the current waveform in the CDM is set as several hundreds picoseconds (hereinafter, referred to as ps), and a time period of the CDM is to be set extremely short period of time of approximately 1 ns. Consequently, the ESD protection device is imposed with a condition of having to operate at a very wide frequency band.

For example, a protection resistor or a diode is used for a conventional ESD protection circuit of a CMOSLSI. The conventional ESD protection circuit having these resistors and diodes, utilizes a snap-back phenomenon of a MOSFET, which has a lower resistance and an excellent performance of a voltage clamp. However, recently, in a specific application field, the above-mentioned ESD protection circuit of CMOSLSI has been replaced by such devices as a parasitic NPN bipolar junction transistor (hereinafter, referred to as NPNTr), a parasitic PNP bipolar junction transistor (hereinafter, referred to as PNPTr), a thyristor, or a silicon controlled rectifier (SCR).

In particular, in case of the CMOSLSI, a progress of fabrication of such devices has made a thickness of a gate oxide film of the MOS transistor of the CMOSLSI extremely thin. As a result, breakdown withstand voltage of the gate oxide film has been lowered, so that the gate oxide film is extremely sensitive to the electrostatic discharge. That is, a voltage when the ESD protection device is starting at a low impedance (trigger voltage) has been closely to a withstand voltage of the gate oxide film. Accordingly, it is indicated that when a large amount of discharge currents flow, a voltage exceeding an allowable limit is applied to the gate oxide film, and a danger to cause the breakdown of the gate oxide film has been enhanced. That is, for the ESD protection device, a low trigger voltage is required.

As LSI has further advanced performance, it needs to operate at higher speed. Generally, an input circuit included in a circuitry required to operate at high speed should have a reduced RC delay. In addition, when a protection circuit for protection of circuit from damage due to electrostatic charge or over-voltage application is applied to the circuitry, it increases parasitic capacitance of LSI.

The circuitry required to operate at high speed needs to suppress increase in parasitic capacitance (additional capacitance). Furthermore, to enable the circuitry to operate at high speed, a protection resistor widely used in known products and having a large resistance cannot be employed in the circuitry. That is, when having to ensure high-speed circuit operation, the circuitry subjects extremely to restriction on the protection circuit. Moreover, in terms of reduction of manufacturing cost of LSI, an area occupied on a chip by the protection circuit needs to be reduced.

A Silicon Controlled Rectifier (SCR) has been employed to address such a requirement directed to an electrostatic charge protection circuit.

U.S. Pat. No. 5,012,317 discloses a technique employing an SCR as a parasitic element and an ESD protection element to protect a CMOS integrated circuit from damage.

Based on the above-stated publication, how an SCR operates will be explained below. As shown in FIGS. 1A to 1C, the SCR disclosed in U.S. Pat. No. 5,012,317 includes: an N-type well 32 formed in a surface region of a P-type semiconductor substrate 44; and a P.sup.+ type diffusion region 1048 as an anode of the SCR and an N.sup.+ type diffusion region, both being formed in the N-type well 1032. An input pad 1012 is connected to the P.sup.+ type diffusion region 1048 and the N.sup.+ type diffusion region 50 within the N-type well 1032.

When a positive current surge is applied to the input pad 1012 connected to the SCR, the potential of the N-type well 1032 momentarily rises after a time interval on the order of about 1 nanoseconds elapses from application of the surge. When the voltage applied to the N-type well 1032 exceeds tolerable breakdown voltage (typically, 40 to 50 V) between the N-type well 1032 and the substrate, an PN junction there between is brought into an avalanche-breakdown and then an avalanche-breakdown current begins to flow into the substrate and the N-type well.

That is, the current flowing into the substrate causes to increase the potential of a region (base region) of the P-type substrate, which region is positioned below the lower surface of an PN junction between N.sup.+ type diffusion region of a lateral NPN transistor consisting of the N.sup.+ type diffusion region as a cathode, the P-type substrate and the N.sup.+ type diffusion region, and the P-type semiconductor substrate to increase, allowing current to pass through the NPN transistor.

Likewise, the current flowing into the N-type well causes the potential of a region as a base region of a PNP transistor within the N-type well, which region is positioned near the N.sup.+ type diffusion region and the P.sup.+ type diffusion region within P.sup.+ type diffusion region to decrease, allowing current to pass through the vertical PNP transistor consisting of P-type diffusion region, N-type well and P-type semiconductor substrate.

Consequently, both the NPN transistor and the PNP transistor operates so that collector currents of both transistors are increased by the positive feedback loop so as to let the SCR operate in a low resistance mode (latch-up mode), allowing the currents to flow through the SCR consequently protecting the internal circuit.

An SCR initially invented begins to protect associated circuits or components operate when an input signal exceeding the tolerable breakdown voltage between the N-type well and the substrate, and the tolerable breakdown voltage is typically so high in the range of 40 to 50 V . That is, the tolerable breakdown voltage of SCR usually exceeds that of circuits or components to be protected, resulting in difficulty in practical use of SCR. In order to address such a problem, a variety of techniques (such as a triggering technique) for making an SCR operate in a preferable mode have been proposed. For instance, U.S. Pat. No. 5,465,189 discloses a technique employing a MOS transistor to pass current through a substrate and/or an N-type well. The SCR of this type is called a low voltage triggered SCR (LVSCR).

As shown in a diagram indicating the characteristics of SCR, the trigger voltage of the low voltage triggered SCR can be lowered down to a snap back voltage at which the MOS transistor of the trigger element is snapped back (a parasitic bipolar transistor begins to operate and then enters into a low impedance mode).

A holding voltage at which the LVSCR stays operating is about 1 to 3 V, which is lower than the holding voltage, i. e., 4 to 6V, at which a typical MOS protection element stays operating. Furthermore, the dynamic resistance of the LVSCR is also far lower than that of other protection elements and in effect, the dynamic resistance of a typical LVSCR having a width of 50 micrometers is about 1 ohm. Accordingly, the LVSCR is advantageously able to keep a clamp voltage applied to elements to be protected upon injection of surge current into the elements low. As a result, when the LVSCR is employed to protect elements disposed as an input for LSI, the LVSCR is advantageously able to lower its protection resistance.

Furthermore, when the clamp voltage applied to elements to be protected is low, power consumption (the amount of heat generation during protecting operation) during operation can be kept low. It is also said that since SCR is constructed such that heat generated within an element spreads over the substrate incorporating therein the element, temperature increase due to the heat generation, which is locally confined in a protection element of MOS IC, is not confined in a local area of the substrate and therefore, the element is rarely destroyed by the thermal melt upon injection of surge current into the element.

However, as is reported in Japanese Patent Application No. 2001-85534 or the publication entitled "Breakdown and latent damage of ultra-thin gate oxide under ESD stress conditions", the journal Electrical Overstress/Electrostatic Discharge Symposium Proceedings 2000, pp. 287–295 (2000), when discharge is completed in a very short period of time as is the case of destroy in a CDM model, overshoot voltage is large and lowers the protection performance of protection element.

This is because an NMOS transistor as a trigger element is brought into an avalanche-breakdown before SCR turns on. At this moment, the NMOS transistor should turn on to allow sufficient current to pass therethrough in order to initiate latch operation of an SCR device.

However, it takes some hundreds picoseconds to some nanoseconds for SCR to exhibit low resistance (a transition time). The transition time required for transition of SCR depends on parameters such as a base width of bipolar transistor and carrier distribution within the base thereof. In this case, when the transition time is long as compared to the rise time of surge current, SCR cannot absorb enough fraction of surge current and the trigger element has to allow almost all part of surge current to pass therethrough. However, since the trigger element has not ability to allow large current to pass therethrough (i.e., has high impedance), an overshoot voltage applied to the circuit destroys elements to be protected.

To address the aforementioned problem, elements of the circuit are correctly disposed within the circuit taking into account the geometrical region to which current flowing into the substrate should be delivered and this approach to disposing elements in correct regions is disclosed in the publication, entitled "GGSCRs: GGNMOS triggered Silicon Controlled Rectifiers for ESD Protection in Deep Submicron CMOS Process", the journal Electrical Overstress/Electrostatic Discharge Symposium Proceedings 2001, pp. 22–31 (2001).

In this approach, as shown in FIG. 3, the cathode of SCR is disposed between regions that are produced by dividing the cathode region for triggering. The cathode disposed therebetween is most close to the base of SCR(2), enabling efficient supply of current to the base.

Generally, SCR is unfavorably and potentially brought into a latch-up condition by noise on the system. Some publications describe a high trigger current SCR that makes trigger current extremely large.

Whether trigger current for triggering a trigger element is large or small affects an extent to which the potential of a region surrounding an anode and/or cathode is increased by the current and therefore, is determined by where the trigger element is disposed and/or how the resistance of a region close to the trigger element is ranged.

In effect, noise on system takes various forms and sometimes cannot be predicted. However, when taking into account the fact that current injected from an IO buffer adjacent to the trigger element into the substrate passes through different path than that the current generated by the trigger element passes through, whether trigger current for triggering a trigger element is large or small does not have the correlation with immunity to noise.

That is, when increasing trigger current for triggering a trigger element in a circuit configured to not control the easiness of latch-up of the circuit, the circuit faces critical risk.

The SCR clamp voltage is defined as the following in FIG. 2, such that the SCR clamp voltage is determined about 1V corresponding to 2 times forward voltage VF of diode by extrapolating the linear line on I-V curve in the TURN-ON region to the axis of abscissas. Accordingly, to ensure complete protection of elements to be protected, the SCR clamp voltage is set higher than the power supply voltage. Furthermore, since the voltage potential of the SCR is determined by the product of the current and the resistance of a path through which the current passes, when holding current holding the latch-up of SCR is made large, the desired SCR clamp voltage at the holding current can be set.

As can be seen from the equivalent circuit for SCR, it can be concluded that when highlighting resistive elements within SCR and further if SCR is configured to have a substrate and an N-type well formed in low resistance, holding current can be made high. Therefore, when the characteristics of bipolar transistor and a positional relationship between anode, cathode and edge of N-type well are previously determined, catching clearly correlation between N-type well resistance, substrate resistance and SCR clamp voltage enables achievement of desired SCR performance.

For instance, when employing a P on P.sup.+ substrate, which enables a silicon substrate to have extremely low resistance, to form SCR, adjustment of SCR (as an ESD protection element) clamp voltage is carried out in a relatively easy manner by elongating a distance between anode and cathode of SCR.

The P on P.sup.+ substrate has its substrate resistance determined only by parameters associated with a distance between a P-type well below a cathode and P.sup.+ substrate, weakly depending on other primary parameters. This is because the P on P.sup.+ substrate has substrate resistance easily determined by changing SCR structure as compared to a substrate having high resistance.

However, when employing a substrate having high resistance, potentials around the anode and cathode of SCR become significantly complicated. As can be clearly seen from the cross sectional view, when viewing a lateral bipolar element from the side of edge, next to an N-type well, of an N.sup.+ diffusion layer as a cathode, the resistance of substrate consists of a P-type well below the N.sup.+ diffusion layer and a region ranging from Shallow Trench Isolation (STI) to P.sup.+ diffusion layer as a ground electrode.

For example, when current flows to the P.sup.+ diffusion layer connected to ground potential, since typically the current flows primarily through the region near the cathode, the resistance value per unit area cannot simply produce a resistance value through computation. Moreover, since the actual length of STI is short, using the resistance determined based on STI having a long length causes a significant distortion from the correct value of a resistance to be determined. In addition, typically, SCR has a P.sup.+ guard ring in the periphery thereof for prevention of latch-up of SCR and determining accurately the substrate resistance while taking into account the resistance associated with the P.sup.+ guard ring becomes difficult.

As described above, the substrate resistance needs to be determined taking into account current distribution calculated based on the impurity profile in a direction of a depth from the surface of substrate.

Additionally, in terms of reduction of process steps and facility for the manufacture of SCR, margin of elements spaced from one another needs to be enlarged to eliminated influence of variations in the resistance value of a resistor below STI within a wafer, which variations are due to large variations in the depth of STI.

Moreover, when a difference in manufacturing conditions occurs between plants, layout pattern associated with arrangement of diffusion layers for elements needs to be changed. In this case, reticles used in the steps after completion of formation of diffusion layers need to be modified. This unfavorably forces a manufacturer to pay enormous money for modification and/or design for rework.

To avoid those problems, the techniques disclosed in U.S. Pat. No. 5,012,317 that adjusts the characteristics of SCR using an external resistor and U.S. Pat. No. 5,747,834 that adjusts the clamp voltage using a resistive element need to previously lower resistances of substrate and well so that those resistances are easily adjusted.

However, in many cases, the resistance of a substrate having large resistance cannot be lowered using normal layout method (used in the conventional technique) because of size of diffusion layer and limitation on design. For instance, when calculating the resistance of substrate based on the resistance of a resistor below an N.sup.+ diffusion layer as a cathode of SCR, the resistance of STI, and the resistance of a path ranging from a P.sup.+ diffusion layer to the bottom of STI, the resistance of substrate actually cannot be made lower than 500 ohm per 1 micrometer along SCR.

How to reduce the resistance of substrate is proposed in "High Holding Current SCRs (HHI-SCR) for ESD Protection and Latch-up Immune for IC Operation" Electrical Overstress/Electrostatic Discharge Symposium proceeding, 2002, 1A.3.1.

According to the aforementioned publication, as shown in the associated FIG. 6, the layout technique reduces the effective well (or NPN/PNP bipolar base) resistances $R_{pw,eff}/R_{nw,eff}$: the shorter the length of the anode and cathode stripe, LA and LC, the lower $R_{pw,eff}/R_{nw,eff}$ respectively, the higher the SCR holding current.

A P.sup.+ diffusion layer around SCR is connected to ground potential via a polysilicon resistor of 1 to 10 ohm and adjusting the resistance of the polysilicon resistor allows holding current to be adjusted. A trigger signal for SCR is supplied from an N-type MOS transistor connected to the P.sup.+ diffusion layer.

Although a ggSCR as the aforementioned SCR for controlling holding current is configured to divide a cathode into two sub-cathodes, an HHI-SCR is configured to divide a cathode into a number of sub-cathodes to reduce the resistance of substrate.

SCR varies its performance depending not only on the resistances of substrate and well but on a distance between an anode and an N-type well and a distance between a cathode and an N-type well. Accordingly, when dividing the anode and the cathode into a number of sub-anodes and sub-cathodes, the corners of sub-anodes and sub-cathodes are rounded in the steps of exposure and etching and the profile of sub-anodes and sub-cathodes is difficult to control.

Since the dynamic resistance represents the resistance of a path along which current flows between electrodes, when effective spacing therebetween is elongated, the dynamic resistance becomes large accordingly. In addition, since speed at which SCR operates and SCR clamp voltage largely depend on the distance between a cathode and an N-type well, dividing a cathode causes many problems.

In consideration of the aforementioned problems, the present invention is directed to SCR having improved triggering performance such as low trigger voltage and high-speed triggering. In more detail, SCR includes a trigger element having lowered resistance of a path along which charges discharged by the trigger element flow and contains a number of locations within SCR through which locations trigger current is supplied.

Furthermore, in order to address the aforementioned problems observed when dividing an anode and a cathode into a number of sub-regions, the invention provides SCR configured to form a comb-shaped cathode and P.sup.+ diffusion layers for triggering are inserted into the cum of the cathode. The invention also provides SCR for supplying trigger current configured to divide SCR into fine sub-SCRs and P.sup.+ diffusion layers are inserted into the sub-SCRs. In addition to the above-described SCRs, the invention is directed to SCR, achieved by applying the invention thereto, for controlling holding current.

In the conventional SCR, the resistance of substrate and well cannot be lowered because whether or not current flowing through SCR destroys SCR depends on the number of contacts and large number of contacts are required for prevention of destroy of SCR, enlarging the area of anode and cathode. Moreover, since the resistance of substrate is determined by the resistance of a path between the lower portion of an N.sup.+ diffusion layer and a P.sup.+ diffusion layer for controlling the resistance of substrate, the invention also provides SCR having an anode within an N-type well and an N-type well contact formed in a cum-shape to reduce the resistance of N-type well.

SUMMARY OF THE INVENTION

It is an object of the present invention to provide an ESD protection device which, when a surge current is applied, protects an LSI by restraining overshooting of the voltage as less as possible by tuning on the SCR operation in a very short period of time, and discharging an electrostatic discharge current pulse by forming a safe and discharge passage with low resistance for circuit devices at inside of the LSI.

The ESD protection device of the present invention is a SCR type ESD protection device generating a SCR operation at a moment of protecting operation. In particular, the ESD protection device of the present invention is a SCR of a type supplying a trigger current for generate the SCR operation, a supply method of the trigger current is devised by arranging supply portion of the trigger current. The trigger current is more efficiently operated for starting the SCR operation, start of the SCR operation is accelerated and overshooting of the voltage is restrained.

Consequently, according to the first aspect of the invention, there is provided of an ESD protection device comprising:

a P conducive type first P well region formed in a P conductive type semiconductor layer of a semiconductor substrate having the P conductive type semiconductor layer having a prescribed thickness on a surface thereof; and an N conductive type first N well, a periphery thereof being surrounded by the first P well region, a second N diffusion region, P conductive type first P diffusion regions, and a P conductive type third P diffusion region arranged within the first P well; and a P conductive type second P diffusion region and N conductive type first N diffusion region arranged in the first N well, wherein the second N diffusion region is arranged between the first P diffusion regions and the first N well by being opposed thereto, a first boundary side constituting a boundary between the first N well and the first P well region and opposed to the second N diffusion region includes a first recessed portion incised on a side of the first N well, wherein the second P diffusion region is arranged between the first N diffusion region and the first boundary side, the third P diffusion region is arranged between the second N diffusion region and the first boundary side such that at least a part thereof is brought into the first recessed portion, wherein the first N diffusion region is connected to a high potential side electric source, both of the second N diffusion region and the first P diffusion regions are connected to a low potential side electric source, the second P diffusion region is connected to a desired external connection electrode, and the third P diffusion region is connected to an output end of a first trigger device an input end thereof being connected to the external connection electrode.

Further, according to the second aspect of the invention, there is provided an ESD protection device comprising:

a P conductive type second P well and P conductive type first P diffusion regions formed in a P type semiconductor layer of a semiconductor substrate having the P conductive type semiconductor layer having a prescribed thickness on a surface thereof;

an N conductive type second N well being brought into direct contact with the second P well;

P conductive type third P diffusion regions and N conductive type second N diffusion regions arranged within the second P well; and a P conductive type second P diffusion region and an N conductive type first N diffusion region arranged within the second N well, wherein the third P diffusion regions are arranged at k portions (where k denotes an integer of 2 or more), the first diffusion regions and the second N diffusion regions are arranged respectively at (k+1) portions, wherein the first P diffusion regions are arranged at (k+1) portions on a first straight line while are brought into direct contact with the second P well at an outside of the second P well, and the second N diffusion regions are arranged at (k+1) portions on a second straight line being in parallel with the first straight line, wherein a second boundary side constituting a boundary where the second P well and the second N well is brought into contact with includes first recessed portions disposed in k portions incised on a side of the second N well, wherein the second P diffusion regions are arranged between the first N diffusion region and the second boundary side, wherein the second N diffusion regions of (k+1) portions are arranged respectively between a portion the second N well of the second boundary side constituting projected portions and the first P diffusion regions and by corresponding the single second N diffusion region to the single first P diffusion region, wherein by corresponding, the single first recessed portion to the single third P diffusion region at least a part of respective third P diffusion regions is arranged to enter the first recessed portion, wherein the first N diffusion region is connected to a high potential side electric source, both of the second N diffusion regions and the first P diffusion regions are connected to a low potential side electric source, the second P diffusion region is connected to a desired external connection electrode, and the third P diffusion regions are connected to output ends of a first trigger device an input end thereof being connected to the external connection electrode. In that case, it is preferable that the third P diffusion regions further include an overlapped portion including a case where the third P diffusion regions are brought into contact with a straight line extending along the boundary opposed to the second N well of the second N diffusion regions.

Furthermore, according to the third aspect of the present invention, there is provided an ESD protection device comprising:

a P conductive type first P well region formed on a P type semiconductor layer of a semiconductor substrate having the P conductive type semiconductor layer having a prescribed thickness on a surface thereof;

a plurality of N conductive type third N wells peripheries thereof being surrounded by the first P well region;

a P conductive type first P diffusion regions, a P conductive type third P diffusion region, and N conductive type second N diffusion region arranged in the first P well region; and P conductive type second P diffusion regions and N conductive type first N diffusion regions respectively arranged within the third N wells, wherein the plurality of third N wells are arranged on a first straight line by being isolated therefrom, wherein the second N diffusion region is arranged between the third N wells and the first P diffusion regions by being isolated from and opposed to any of the plurality of the third N wells, wherein the first N diffusion regions and the second P diffusion regions are arranged respectively in the third N wells by aligning in a direction orthogonal to a direction of a first straight line so that the second P diffusion regions come closer to the second N diffusion region, wherein the third P diffusion region is arranged between the plurality of third N wells, wherein the first N diffusion regions are connected to a high potential side electric source, both of the second N diffusion region and the first P diffusion regions are connected to a low potential side electric source, the second P diffusion regions are connected to desired external connection electrodes, and the third P diffusion region is connected to an output end of a first trigger device an input end thereof being connected to the external connection electrode. In that case, it is preferable that the third P diffusion region is arranged such that the straight line being existed in the first straight line direction crossing simultaneously with the second P diffusion regions.

Furthermore according to the fourth aspect of the present invention, there is provided an ESD protection device comprising:

a P conductive type first P well region formed in a P type semiconductor layer of a semiconductor substrate having the P conductive type semiconductor layer having a prescribed thickness on the surface thereof;

a N conductive type fourth N well a periphery thereof being surrounded by the first P well region;

a P conductive type first P diffusion region and N conductive type second N diffusion region arranged within the first P well region;

a P conductive type second P diffusion region and N conductive type first N diffusion region arranged within the fourth N well; and a plurality of first blank portions being exposed the first P well region provided in the second N diffusion region, and third P diffusion regions arranged in the first blank portions, wherein the fourth N well is arranged between the first P diffusion region and the second N diffusion region by being opposed thereto and isolated therefrom, wherein the first N diffusion region and the second P diffusion region are arranged side by side so that the first N diffusion region comes closer to a side of the first P diffusion region, and the second P diffusion region comes closer to a side of the second N diffusion region, wherein the first blank portions are arranged along a third boundary side constituting a boundary between the second N diffusion region and the first P well region and, by being opposed to the fourth N well and isolated therefrom, wherein the first N diffusion region is connected to a high potential side electronic source, both of the second N diffusion region and the first P diffusion region are connected to a low potential side electronic source, and the second P diffusion region is connected to a desired external connection electrode, and the third P diffusion regions are connected to an output end of a first trigger device an input end thereof being connected to the external connection electrode. In that case, it is preferable that contact holes connecting to the second N diffusion region is formed in a region on an opposite side of a side of the third boundary side with respect to a straight line in a direction orthogonal to the third boundary side passing through the boundary on a side of the third boundary side of the first blank portions.

Furthermore according to the fifth aspect of the present invention, there is provided an ESD protection device comprising:

a P conductive type third P well region formed in a P type semiconductor layer of a semiconductor substrate having the P conductive type semiconductor layer having a prescribed thickness on a surface thereof;

an N conductive type third N diffusion region and a N conductive type fourth N diffusion region;

a gate region;

an N conductive type fourth N well a periphery thereof being surrounded by the third P well region;

a P conductive type first P diffusion region and a P conductive type third P diffusion region being arranged within the third P well region;

a P conductive type second P diffusion region and a N conductive type first N diffusion region being arranged within the fourth N well; and a second N diffusion region arranged by striding over a fourth boundary side constituting a boundary between the third P well region and a P type semiconductor layer region, wherein the fourth N well is arranged between the first P diffusion region and the second N diffusion region being opposed thereto and directions of respective boundaries opposing thereto being in parallel with the fourth boundary side, wherein the first N diffusion region and the second P diffusion region are arranged side by side so that the first N diffusion region coming closer to a side of the first P diffusion region and the second P diffusion region coming closer to a side of the second N diffusion region, wherein the second N diffusion region includes respectively a plurality of projected portions reaching to the P type semiconductor layer region and a plurality of recessed portions reaching to the third P well region on a boundary of on opposite side of a third boundary side constituting the boundary between the second N diffusion region and the third P well region and opposed to the fourth N well, wherein the third P diffusion regions are arranged in the third P well region portions of the respective recessed portions, the third N diffusion region is arranged by opposing to a boundary on an opposite side of the third boundary side of the second N diffusion region, the gate region is arranged by being brought into contact with a boundary on an opposite side of the boundary opposed to the second N diffusion region of the third N diffusion region, the fourth N diffusion region is arranged by being opposed to the third N diffusion region via the gate region and being brought into contact with the gate region, and the boundary of the third N diffusion region opposed to the second N diffusion region include projected portions being brought into direct contact with the third P diffusion regions by passing through the recessed portions, wherein the first N diffusion region is connected to a high potential side electric source, all of the second N diffusion region, the first P diffusion region, and the gate electrode provided in the gate region are connected to a low potential side electric source, and both of the second P diffusion region and the fourth P diffusion region are connected to desired external connection electrodes. In that case, the boundary where the third N diffusion region and the fourth N diffusion region are respectively brought into contact with the gate region may constitute a straight line shape along a direction of the fourth boundary side.

Furthermore, according to the sixth aspect of the present invention, there is provided an ESD protection device comprising:

a P conductive type first P well region formed in a P type semiconductor layer of a semiconductor substrate having the P conductive type semiconductor layer having a prescribed thickness on a surface thereof;

an N conductive type fifth N well a periphery thereof being surrounded by the first P well region;

a P conductive type fourth P well a periphery thereof being surrounded by the fifth N well;

a P conductive type first P diffusion region and a N conductive type second N diffusion region arranged within the first P well region;

a P conductive type second P diffusion region and a N conductive type first N diffusion region arranged within the fifth N well; and a third P diffusion region arranged within the fourth P well, wherein the second N diffusion region is arranged between the fifth N well and the first P diffusion region by being opposed thereto, wherein the second P diffusion region is arranged between the first N diffusion region and the second N diffusion region by being opposed thereto, wherein the second P diffusion region surrounds a periphery of the fourth P well, wherein the first N diffusion region is connected to a high potential side electric source, both of the second N diffusion region and the first P diffusion region are connected to a low potential side electric source, the second P diffusion region is connected to a desired external connection electrode, and the third P diffusion region is connected to an output end of a first trigger device an input end thereof being connected to an external connection electrode.

Furthermore, according to the seventh aspect of the present invention, there is provided an ESD protection device comprising:

a P conductive type first P well region formed on the P type semiconductor layer of a semiconductor substrate having the P conductive type semiconductor layer having a prescribed thickness on a surface thereof;

an N conductive type sixth N well and a N conductive type seventh N well peripheries thereof being surrounded respectively by the first P well regions;

a P conductive type first P diffusion region and a N conductive type second N diffusion region arranged within the first P well region;

a second P diffusion region and a first N diffusion region arranged within the sixth N well;

a fourth P diffusion region arranged within the seventh N well, wherein the sixth N well is arranged between the first P diffusion region and the second N diffusion region by opposing thereto, wherein the first N diffusion region is arranged between the first P diffusion region and the second P diffusion region by opposing thereto, wherein the second N diffusion region includes a N—N overlapped portion overlapped with the seventh N well and is arranged by being opposed the N—N overlapped portion to the fourth P diffusion region, wherein the first N diffusion region is connected to a high potential side electric source, both of the second N diffusion region and the first P diffusion region are connected to a low potential side electric source, the second P diffusion region is connected to a desired external connection electrode, and the fourth P diffusion region is connected to an output end of a first trigger device an input end thereof being connected to an external connection electrode. In that case, a boundary of the second N diffusion region opposed to the sixth N well constitutes a straight line side of a straight line shape, the boundary on an opposite side of the straight line side constitutes a first irregularity side having a comb shaped irregularity, and a projected portion of the first irregularity side constitutes an N—N overlapped portion overlapped with the seventh P well, while the fourth P diffusion region is arranged by opposing to the first irregularity side, and the boundary of the fourth P diffusion region opposed to the first irregularity side constitutes a second irregularity side having the comb shaped irregularity, and it is preferable that the second N diffusion region and the fourth P diffusion region are arranged such that one projected portion of the first irregularity side and the second irregularity side being brought into and brought in mesh with other recessed portion thereof.

Furthermore, according to the eighth aspect of the present invention, there is provided an ESD protection device comprising:

a P conductive type first P well region formed in a P type semiconductor layer of a semiconductor substrate having the P conductive type semiconductor layer having a prescribed thickness on a surface thereof, an N conductive type sixth N well and a N conductive type sixth N well respective peripheries thereof are surrounded by the first P well region;

a P conductive type first P diffusion region and P conductive type third P diffusion regions and an N conductive type second N diffusion region arranged within the first P well region;

a second P diffusion region and a first N diffusion region arranged within the sixth N well; and a fourth P diffusion region arranged within the seventh N well, wherein the sixth N well is arranged between the first P diffusion region and the second N diffusion region, wherein the first N diffusion region is arranged between the first P diffusion region and the second P diffusion region by opposing thereto, wherein a boundary of the second N diffusion region opposing to the sixth N well is a straight line shaped straight line side, a boundary on an opposite side to the straight line side constitutes a first irregularity side including a comb shaped irregularity, and a projected portion of the first irregularity side constitutes an N—N overlapped portion overlapped with the seventh N well, wherein the fourth P diffusion region is arranged opposed to the first irregularity side, wherein a boundary of the fourth P diffusion region opposed to the first irregularity side constitutes a second irregularity side having a comb shaped irregularity, and the second N diffusion region and the fourth P diffusion region are arranged such that one projected portion of the first irregularity side and the second irregularity side being brought into and brought in mesh with other recessed portion thereof, wherein the third P diffusion regions are arranged within the first P well region of respective recessed portion of the first irregularity side, wherein the first N diffusion region is connected to a high potential side electric source, both of the second N diffusion region and the first P diffusion region are connected to a low potential side electric source, the second P diffusion region is connected to a desired external connection electrode, and the third P diffusion regions are connected to a first output end of a second trigger device having the first output end and a second output end an input end thereof being connected to an external connection electrode, and the fourth P diffusion region is connected to the second output end. Furthermore, a interconnection for connecting between respective third P diffusion regions may be included.

Furthermore, according to the ninth aspect of the present invention, there is provided an ESD protection device comprising:

a P conductive type first P well region formed in a P type semiconductor layer of a semiconductor substrate having the P conductive type semiconductor layer having a prescribed thickness on a surface thereof;

an N conductive type eighth N well and an N conductive type ninth N well respective peripheries thereof are surrounded by the first P well region;

an N conductive type second N diffusion region arranged within the first P well region; and a second P diffusion region and a first N diffusion region arranged within the eighth N well, and a fourth P diffusion region arranged in the ninth N well, wherein the second N diffusion region is arranged between the eighth N well and the ninth N well, wherein a boundary of the second N diffusion region opposed to the eighth N well constitutes a straight line shaped straight line side, a boundary on an opposite side to the straight line side constitutes a first irregularity side having a comb shaped irregularity, and projected portions of the first irregularity side constitute N—N overlapped portions overlapped with the ninth N well, wherein a boundary where the first N diffusion region and the second P diffusion region opposed to has an irregular shape and one projected portion is brought into and brought in mesh with other recessed portion, wherein the second P diffusion region is arranged between the first N diffusion region and the second N diffusion region by being isolated therefrom, the fourth P diffusion region is arranged by opposing to the first irregularity side, and a boundary of the fourth P diffusion region opposed to the first irregularity side constitutes a second irregularity side having a comb shaped irregularity, wherein the second N diffusion region and the fourth P diffusion region are arranged such that one projected portion of the first irregularity side and the second irregularity side being brought into and brought in mesh with other recessed portion thereof.

wherein the first N diffusion region is connected to a high potential side electric source, the second N diffusion region is connected to a low potential side electric source, the second P diffusion region is connected to a desired external connection electrode, and the fourth P diffusion region is connected to an output end of a first trigger device an input end thereof being connected to an external connection electrode.

Furthermore, according to the tenth aspect of the present invention, there is provided an ESD protection device comprising:

a P conductive type first P well region formed in a P type semiconductor layer of a semiconductor substrate having the P conductive type semiconductor layer having a prescribed thickness on a surface thereof;

an N conductive type tenth N well and a plurality of N conductive type third N wells respective peripheries thereof being surrounded by the first P well region;

first P diffusion regions, third P diffusion regions and fifth P diffusion regions of respective P conductive types and N conductive type second N diffusion regions and a fifth N diffusion region arranged within the first P well region, and a P conductive type second P diffusion region and N conductive type first N diffusion region respectively arranged in the third N well; and a P conductive type sixth P diffusion region and N conductive type sixth N diffusion region arranged within the tenth N well, wherein a plurality of third N wells are arranged in a straight line shape, wherein two directions orthogonal to each other constitute respectively X direction and Y direction, when a direction of arranging of the plurality of third N wells constitute Y direction, wherein the tenth N well is arranged between the third N wells, the second N diffusion regions are arranged between the third N wells and the first P diffusion regions and by being isolated from and opposed to the third N wells in X direction, the first N diffusion regions and the second P diffusion regions are arranged side by side in X direction within respective third N wells by setting the second P diffusion regions on a side of the second diffusion regions, the sixth N diffusion region and the sixth P diffusion region are arranged side by side in X direction with in the tenth N well by setting the sixth P diffusion region on a side of the fifth N diffusion region, and the first P diffusion regions, and being isolated from and opposed to the tenth N well in X direction, the third P diffusion regions arranged between respective third N wells and tenth N well, and the fifth P diffusion regions are arranged on an opposite side to the third P diffusion regions by sandwiching the third N wells in Y direction.

wherein the first N diffusion region and the sixth N diffusion region are connected to high potential electric sources, both of the first P diffusion regions and the second N diffusion regions are connected to a low potential side electric source, the second P diffusion regions and the sixth P diffusion region are connected to desirable external connection electrodes, the third P diffusion regions is connected to an output end of a first trigger device input end thereof being connected to the external connection electrode, and the fifth N diffusion region is connected to the fifth P diffusion regions.

BRIEF DESCRIPTION OF THE DRAWINGS

FIG. 17A depicts a schematic view showing an example of a first trigger device.

FIG. 17B depicts a schematic view showing an example of a first trigger device.

FIG. 17C depicts a schematic view showing an example of a second trigger device.

FIG. 17D depicts a schematic view showing an example of a second trigger device.

FIG. 18A depicts a view showing an example of a constitution for connecting an external connection electrode to an ESD protection device of the present invention.

FIG. 18B depicts a view showing an example of another constitution for connecting an external connection electrode to an ESD protection device of the present invention.

DETAILED DESCRIPTION OF THE PREFERRED EMBODIMENTS

Next, embodiments of the present invention will be explained with reference to the drawings.

An ESD protection device of the present invention is a SCR type ESD protection device generating a SCR operation at the time of a protecting operation, particularly, it is a SCR of a type supplying a trigger current for generating the SCR operation. By contriving arrangement of a supply portion and a supply method of a trigger current, the trigger current is efficiently operated when starting the SCR operation, start of the SCR operation is accelerated and overshooting of voltage is restrained.

Figure 4:
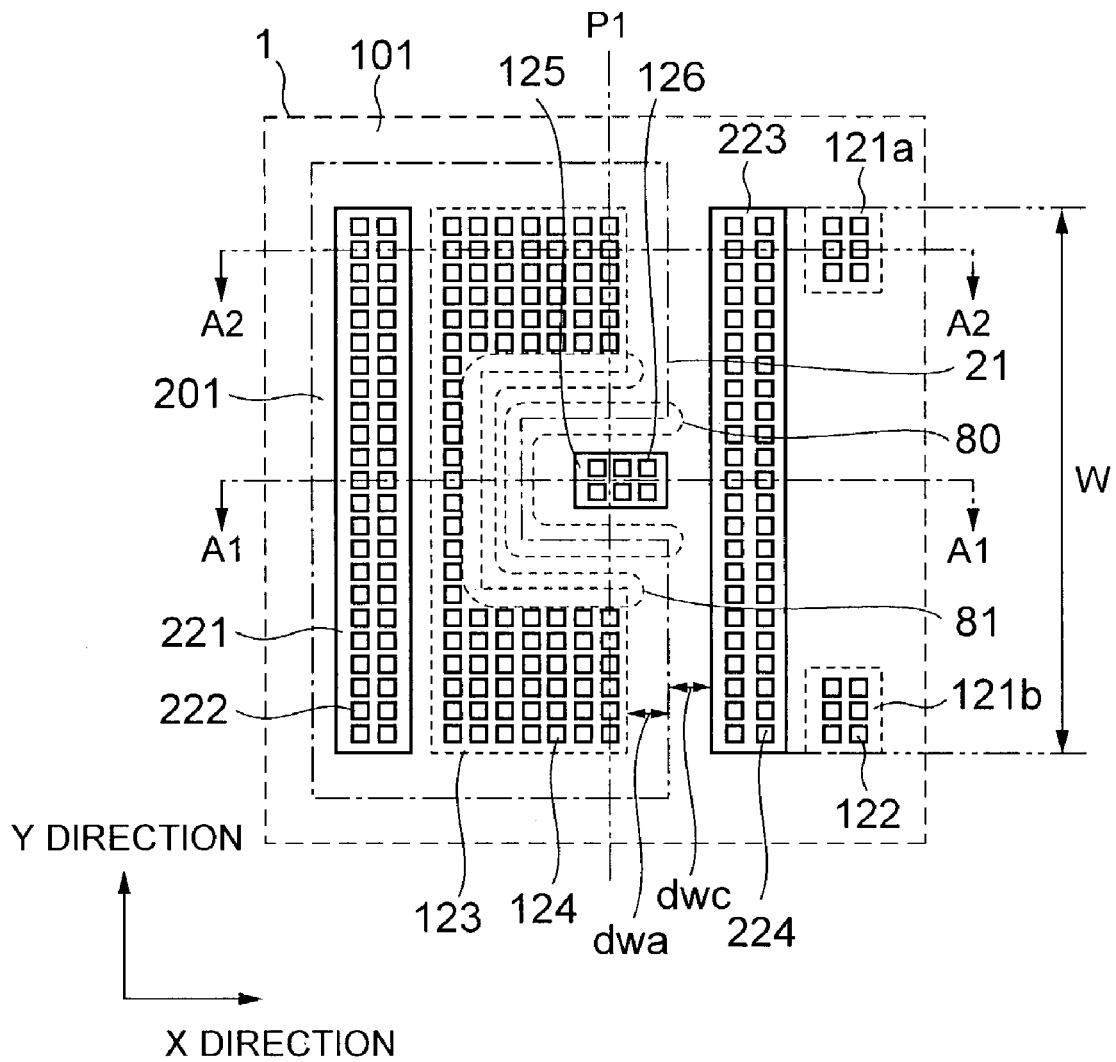
FIG. 4 depicts a schematic plan view showing a planar outline configuration of a first embodiment of an ESD protection device of the present invention.
Figure 5A:
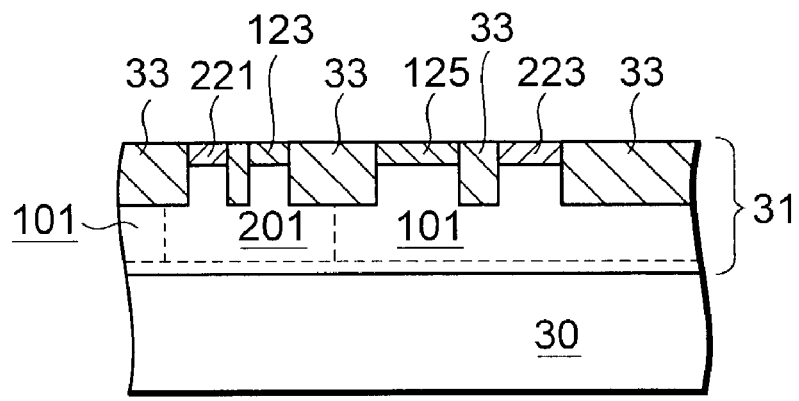
FIG. 5A depicts a sectional view showing a model of a cross section taken on line A1—A1 of FIG. 4.
Figure 5B:
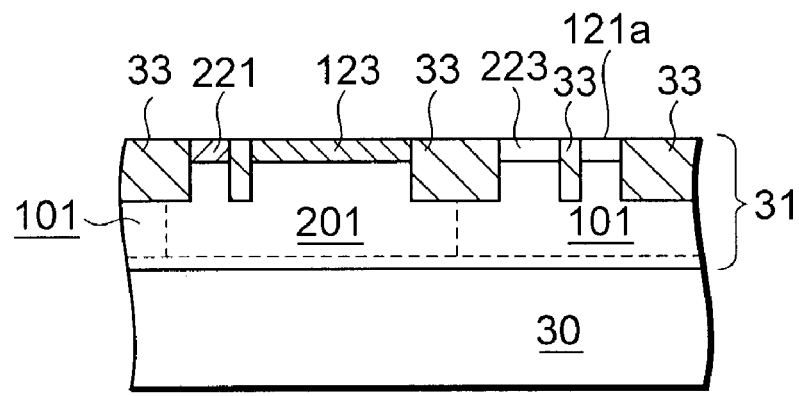
FIG. 5B depicts a sectional view showing a model of a cross section taken on line A2—A2 of FIG. 4.
Figure 5C:
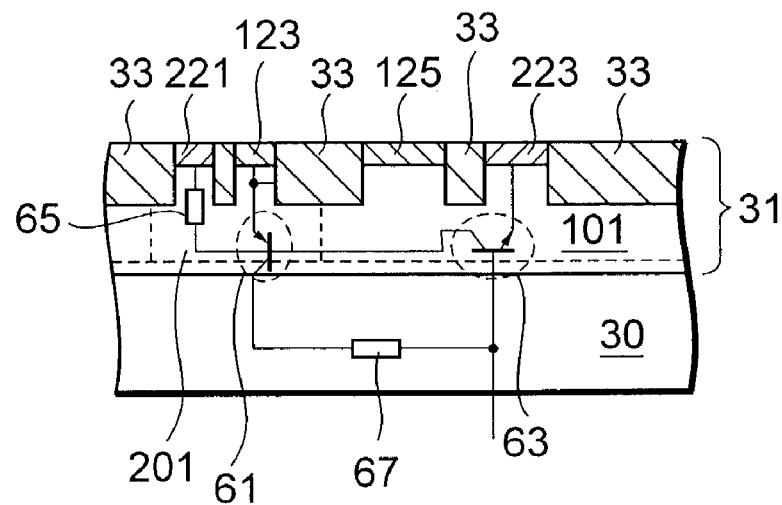
FIG. 5C depicts a view additionally drawing an equivalent transistor and resistor to a view of FIG. 5A for explaining an operation of an ESD protection device of the present invention.

FIG. 4 depicts a schematic plan view showing a planner outer configuration of a first embodiment of the ESD protection device of the present invention. FIG. 5A depicts a sectional view schematically showing a cross section taken on line A1—A1 of FIG. 4, FIG. 5B depicts a sectional view schematically showing a cross section taken on line A2—A2 of FIG. 4. FIG. 5C depicts a view additionally drawing an equivalent transistor and resistor devices to FIG. 5A for explaining an operation of the ESD protection device. Further, in the sectional views FIGS. 5A to 5C, for avoiding complexity and for easy understanding, contact holes being not an essential constitution element of the present invention will be omitted in the drawing. Further, in a description below a conductive type of such as well, well region, or diffusion region of the same reference designation will be a similar conductive type.

Referencing, now, to FIG. 4 and FIGS. 5A to 5C, an ESD protection device 1 of the present embodiment is formed into a P type silicon epitaxial layer (hereinafter, simply referred to as a P type epitaxial layer) 31 constituting a P conductive type semiconductor layer deposited by a prescribed thickness on a surface of a P+ silicon substrate (hereinafter, simply referred to as P+ substrate) 30 functioning as a P conductive type semiconductor substrate. Specifically, the ESD protection device 1 is provided with a P conductive type first P well region 101, an N conductive type first N well 201 a periphery thereof being brought into direct contact with and surrounded by the first P well region 101, P conductive type first P diffusion regions 121a and 121b, a P conductive type third P diffusion region 125 and a N conductive type second N diffusion region 223 all arranged within the first P well region 101, and a P conductive type second P diffusion region 123 and an N conductive type first N diffusion region 221, both are arranged within a first N well 201. Meanwhile, outer configurations of the first P diffusion regions 121a and 121b, the third P diffusion region 125, the first N diffusion region 221 and the second N diffusion region 223 are constituted by a rectangular shape, the outer configuration of the first N well 201 and the second P diffusion region 123 are respectively and substantially constituted by the rectangular shape.

Next, these positional relationships thereof and if necessary, detailed configurations thereof will be explained. First, two directions orthogonal to each other are set respectively as X direction and Y direction, when the direction of arranging therein the first P diffusion regions 121a and 121b is set as Y direction, the second N diffusion region 223 is arranged between the first N well 201 and the first P diffusion regions 121a and 121b by being isolated therefrom and opposed thereto in X direction. In that case, the first P diffusion regions 121a and 121b are arranged to be respectively opposed to both end portions of a boundary in Y direction of the second N diffusion region 223. Further, a first boundary side 21 constituting a boundary to both of the first N well 201 and the first P well region 101 and opposed to the second N diffusion region 223 has a first recessed portion 80 in X direction cut into the first N well 201. Further, other boundaries of the first N well 201 are all in a shape of a straight line. Further, the second P diffusion region 123 arranged within the first N well 201 is arranged between the first N diffusion region 221 and the first N boundary side 21 by being isolated therefrom and opposed thereto. The boundary opposing to the first boundary side 21 is the boundary between the second P diffusion region 123 and the second N well 202 and is in parallel with the first boundary side 21, thus has a second recessed portion 81 along the first recessed portion 80. Further, an interval of a parallel portion between the boundary of the second P diffusion region 123 opposed to the first boundary side 21 and the first boundary side 21 is constituted as constant. Meanwhile, in the second P diffusion region 123, other boundaries including the boundary opposed to the first N diffusion region 221 are all in a shape of a straight line.

The third P diffusion region 125 is arranged between the second N diffusion region 223 and the first boundary side 21 isolated therefrom and the boundaries at least the portion thereof is entered into the first recessed portion 80 and opposed thereto is arranged so as to be in parallel. In FIG. 4, the substantially total body of the third P diffusion region 125 is entered into the first recessed portion 80, and constitutes a position where there exists a straight line P1 in Y direction simultaneously crossing both of the second P diffusion region 213 and the third P diffusion region 125. Further, size in respective Y directions of the first N diffusion region 221, the second P diffusion region 123 and the second N diffusion region 223 are set substantially as being equal.

In the above-described constitution and arrangement, the first N diffusion region 221 is connected to a high potential side electric source interconnection (hereinafter, referred to as a VDD) not shown of an LSI being mounted thereon the ESD protection device 1. Both of the first P diffusion region 121a and 121b and the second N diffusion region 223 are connected to a low potential side electric source interconnection (hereinafter, referred to as a GND) not shown of the LSI being mounted thereon the ESD protection device 1. The second P diffusion region 123 is connected to an external connection electrode (not shown) connected to a protected device, and the third P diffusion region 125 is connected to an output end of a first trigger device not shown.

Further, an input end of the first trigger device is connected to the external connection electrode connected to the protected device. Meanwhile, connection of the interconnection in respective diffusion regions are performed by a multi-contact system. A large number of small contact holes 122, 124, 126, 222, 224 are provided in respective regions, and via the holes, these wire are connected. Further, hereinafter illustration and description of the contact holes will be pertinently omitted including ones in other embodiments, however the connection of the interconnection to respective diffusion regions will be conducted by a similar system.

Next, the protecting operation of the ESD protection device 1 of the present embodiment will be described when a surge current is applied to the external connection electrode of the ESD protection device 1.

The ESD protection device 1 of the present embodiment having the above-described arrangement, is constituted by connecting a vertical type PNPTr 61 and a horizontal type PNPTr 63. The vertical type PNPTr 61 constructed of the second P diffusion region 123, the first N well 201, and the P+ substrate 30 and a horizontal type PNPTr 63 constructed of the second N diffusion region 223, the P+ substrate 30, and the first N well 201 are connected in a state of nesting to each other. Accordingly, when the current flows to the second N diffusion region 223 via the P+ substrate 30, this current turned into a base current of the horizontal type NPNTr 63, by turning the horizontal type NPNTr 63 on and a collector current flows. When the collector current of the horizontal type NPNTr 63 flows, a potential of the first 1 N well 201 is forcedly lowered, a PN junction of the second P diffusion region 123 and the first N well 201 are biased forwardly, the base current of the vertical type PNPTr 61 starts to flow, the vertical type PNPTr 61 is turned on, the collector current of the vertical type PNPTr 61 flows. The collector current of the vertical type PNPTr 61 is constituted as the base current of the horizontal type NPNTr 63, the collector current of the horizontal type NPNTr 63 increases. When the collector current of the horizontal type NPNTr 63 increases, the potential of the first N well 201 is further forcedly lowered. As the result, the base current of the vertical type PNPTr 61 increases.

In this processing, a positive feedback is produced between the vertical type PNPTr 61 and the horizontal type NPNTr 63, generates a state of latch and a current passage of low resistance is formed between the second P diffusion region 123 and the second N diffusion region 223. That is, the SCR operation employing the second P diffusion region 123 and the second N diffusion region 223 respectively as an anode and a cathode is performed.

In the ESD protection device 1 of the present embodiment, at a substantially central portion of the first boundary side 21 opposing the first N well 201 to the second N diffusion region 223, the first recessed portion 80 incised on a side of the first N well 201 is provided. Further, when the surge current is applied, the third P diffusion region 125 is constituting a trigger tap electrode for inputting trigger current output from the trigger device is arranged so as to be entered into this first recessed portion 80.

As a result, from a relationship of the potential in the neighborhood of the third P diffusion region 125, the current flows toward the second N diffusion region 223 serving as the cathode, spread on a side of the second N diffusion region 223, and flowed into the first P diffusion regions 121a and 121b connected to the GND interconnection not illustrated. Therefore the potential of the first P well region 101 in the neighborhood of the second N diffusion region 223 can efficiently be increased.

That is, the trigger current is directly supplied to the side surface of the first P well region 101 between the second N diffusion region 223 constituting a base region of the horizontal type NPNTr 63 requiring an increase of the potential and the first N well 201. Accordingly, even with a small amount of trigger current, current density in the neighborhood of the region is high, and the potential can efficiently be increased. Therefore the SCR operation can be quickly produced, and the overshoot voltage can be restrained.

Figure 1A:
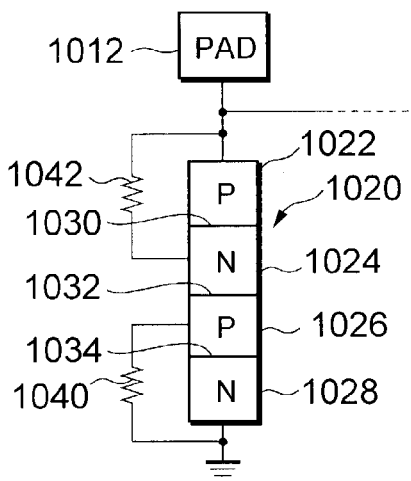
FIG. 1A depicts an equivalent circuit diagram for explaining a conventional SCR type electrostatic discharge protection.
Figure 1B:
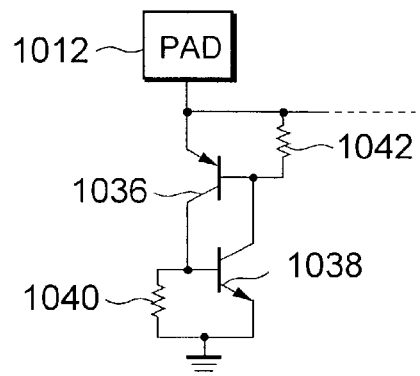
FIG. 1B depicts another equivalent circuit diagram for explaining a conventional SCR type electrostatic discharge protection.
Figure 1C:
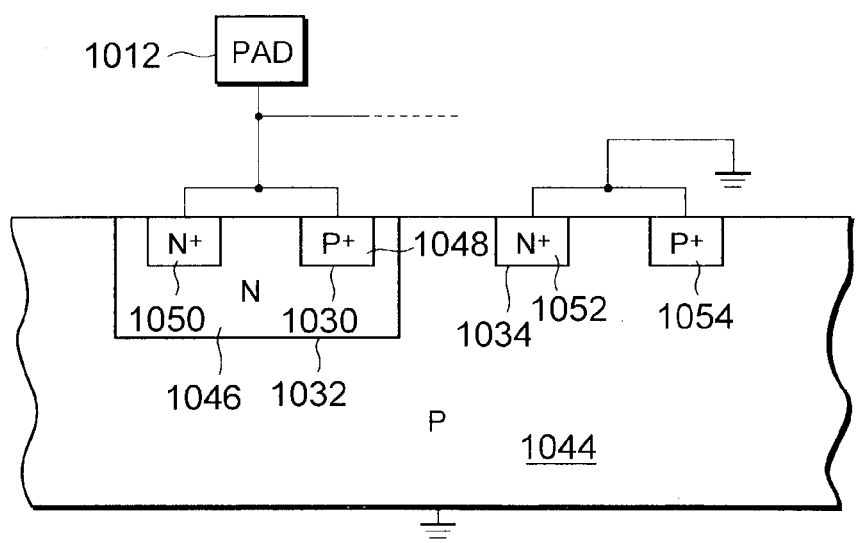
FIG. 1C depicts a sectional view for explaining a conventional SCR type electrostatic discharge protection device.
Figure 2:
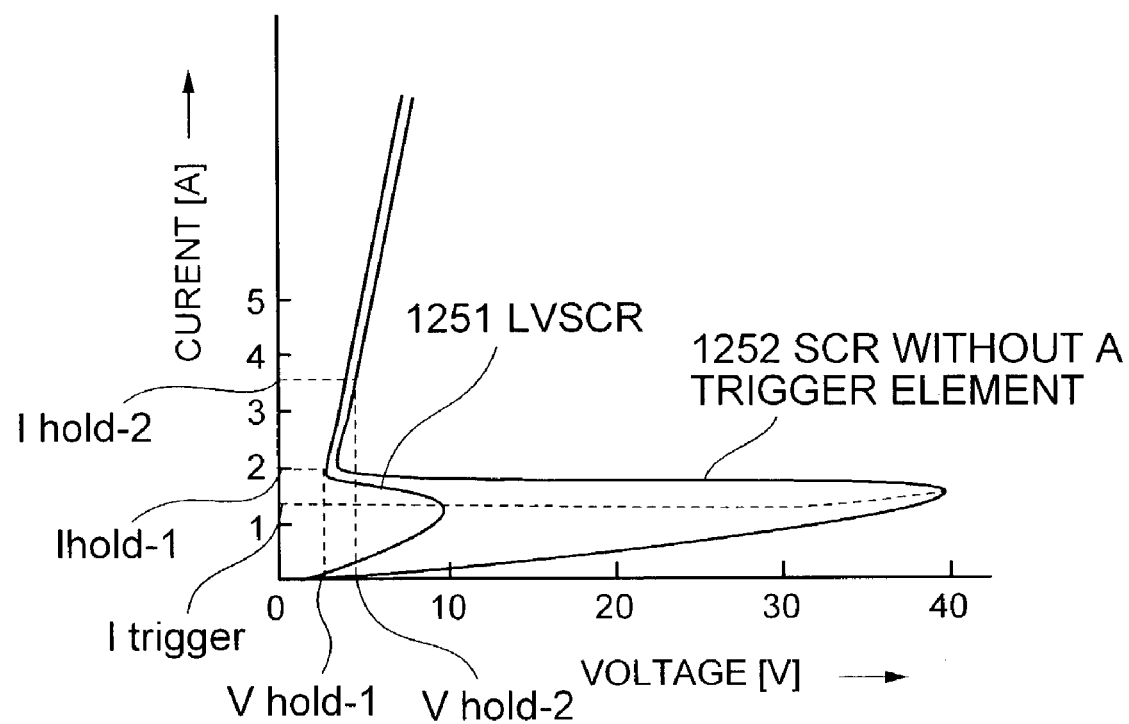
FIG. 2 depicts an I-V charastristic view for explaining an example of a method for supplying a substrate current triggering an ESD protection device.
Figure 3A:
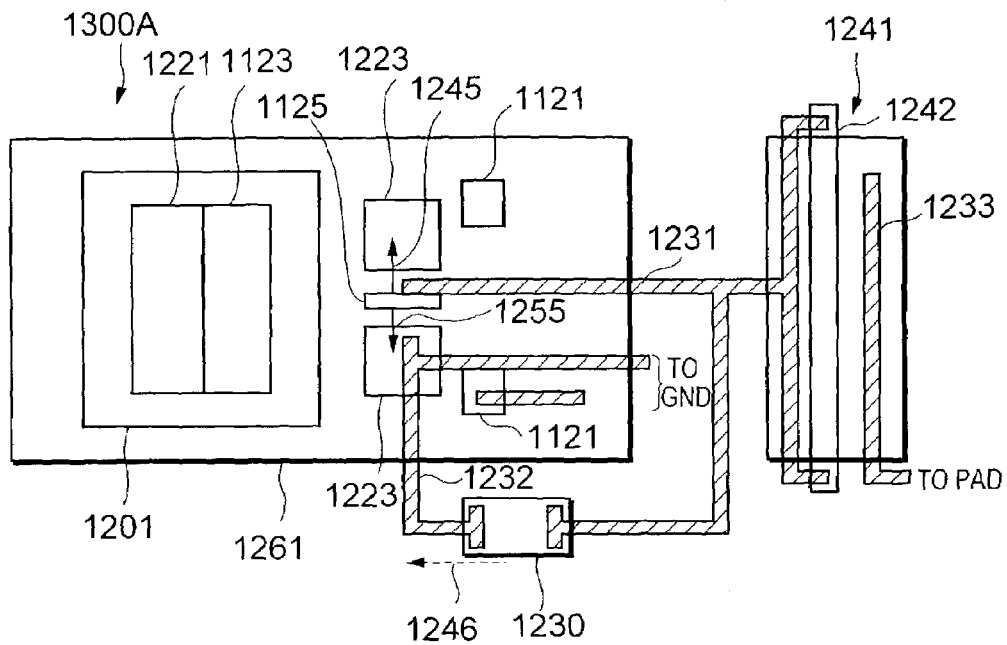
FIG. 3A depicts a plan view for explaining an example of a conventional substrate trigger type ESD protection device.
Figure 3B:
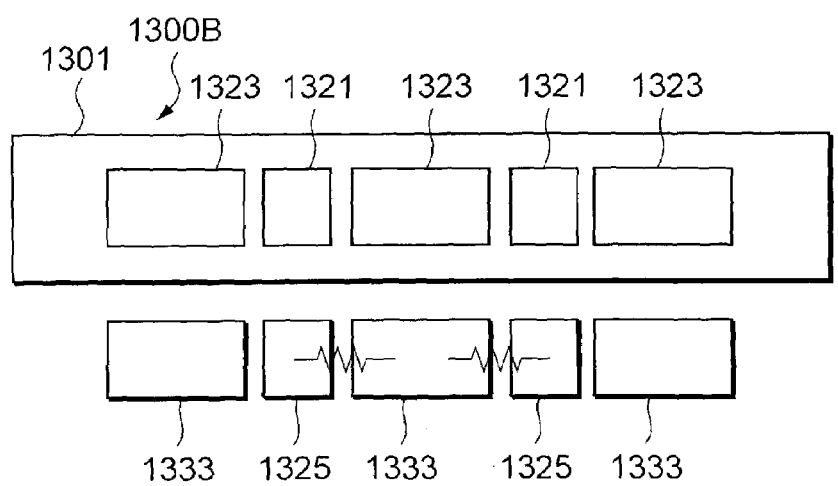
FIG. 3B depicts a plan view for explaining an example of a conventional HHI-SCR type ESD protection device.
Figure 19A:
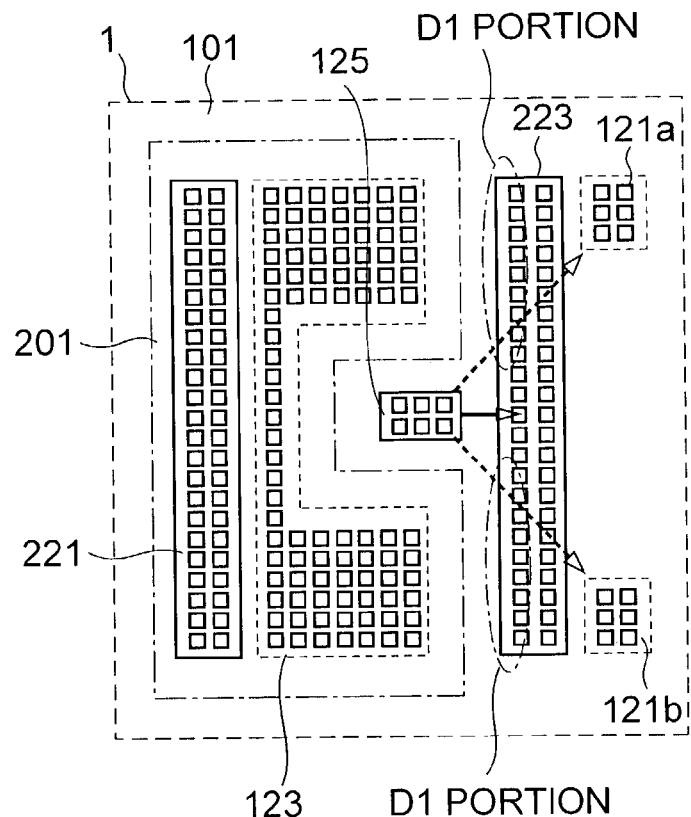
FIG. 19A depicts a view for more specifically explaining an operation of an ESD protection device and an operation of a GGSCR in FIG. 3 of a first embodiment of the present invention, and depicts a view additionally and schematically drawing to a schematic plan view of FIG. 4 passages of a first current flowing at first and a second current flowing when a PN conjunction diode having been turned on, when surge currents have been applied to respective ESD protection devices.
Figure 19B:
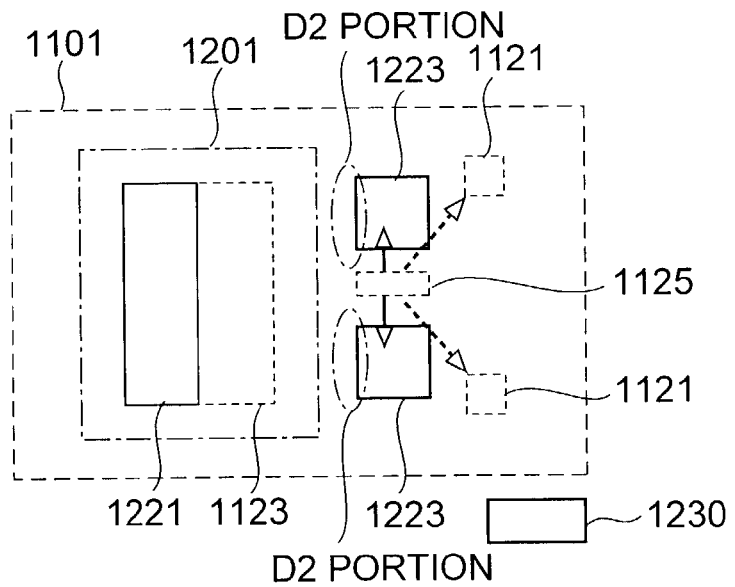
FIG. 19B depicts a view for more specifically explaining an operation of an ESD protection device and an operation of a GGSCR in FIG. 3 of a first embodiment of the present invention, and depicts a view additionally and schematically drawing to schematic plan views of FIG. 4 and FIG. 3A passages of a first current flowing at first and a second current flowing when a PN conjunction diode having been turned on, when surge currents have been applied to respective ESD protection devices.

Here, the operation of the ESD protection device 1 and the operation of GGSCR in FIG. 3A will be compared with each other. FIG. 19A and FIG. 19B are views more specifically explaining the operation of the ESD protection device 1 and the operation of the GGSCR in FIG. 3A. FIG. 19A and FIG. 19B are views additionally and schematically drawing passages of a first current and second current on a schematic plan view of FIG. 4 and FIG. 3A. The first current flows at first from the third P diffusion region 125 functioning as a trigger-tap or a P+ diffusion region 1121 toward the first P diffusion regions 121a and 121b connected to the GND interconnection not shown, or the P+ diffusion region 1121 when the surge current has been applied to respective ESD protection devices. The second current flows when a PN junction diode, constructed of the first P well region 101 or a P well 1101, and the second N diffusion region 223 constituting the cathode at the time of SCR operation or a N+ diffusion region 1223, has been turned on. Hereinafter, the operation will be explained with reference to the drawing FIG. 19A and FIG. 19B.

In the ESD protection device 1, since the first current flows by spreading as shown in FIG. 19A, the potential in the vicinity of D1 portion (PN junction of bottom surface) can efficiently be increased. On the other hand, in case of the GGSCR, since the P+ diffusion region 1125 serving as the trigger-tap is arranged at the side of the N+ diffusion region 1223 functioning as the cathode, as the result the first current flows as shown in FIG. 19B, it will be understood that an increase of the potential in the vicinity of D2 portion (PN junction of bottom surface) is very difficult in comparison with a case where the potential of the D1 portion of the ESD protection device 1 is increased.

Furthermore, in the ESD protection device 1, when the device such as capable of supplying a great deal of trigger current to the first trigger device is used, more uniformly the trigger is produced and the overshoot voltage can be restrained together with more quick creation of the SCR operation.

Meanwhile, a position of the first P diffusion regions 121a and 121b of the present embodiment, is not restricted to the above description, as long as the position, is set on an opposite side to the third P diffusion region 125 in X direction by sandwiching the second N diffusion region 223, regarding the position of Y direction, only with condition that they may be opposed to the second N diffusion region 223, and depending on manufacturing process or the substrate to be used the position of the more pertinent Y direction can be properly selected.

Figure 6:
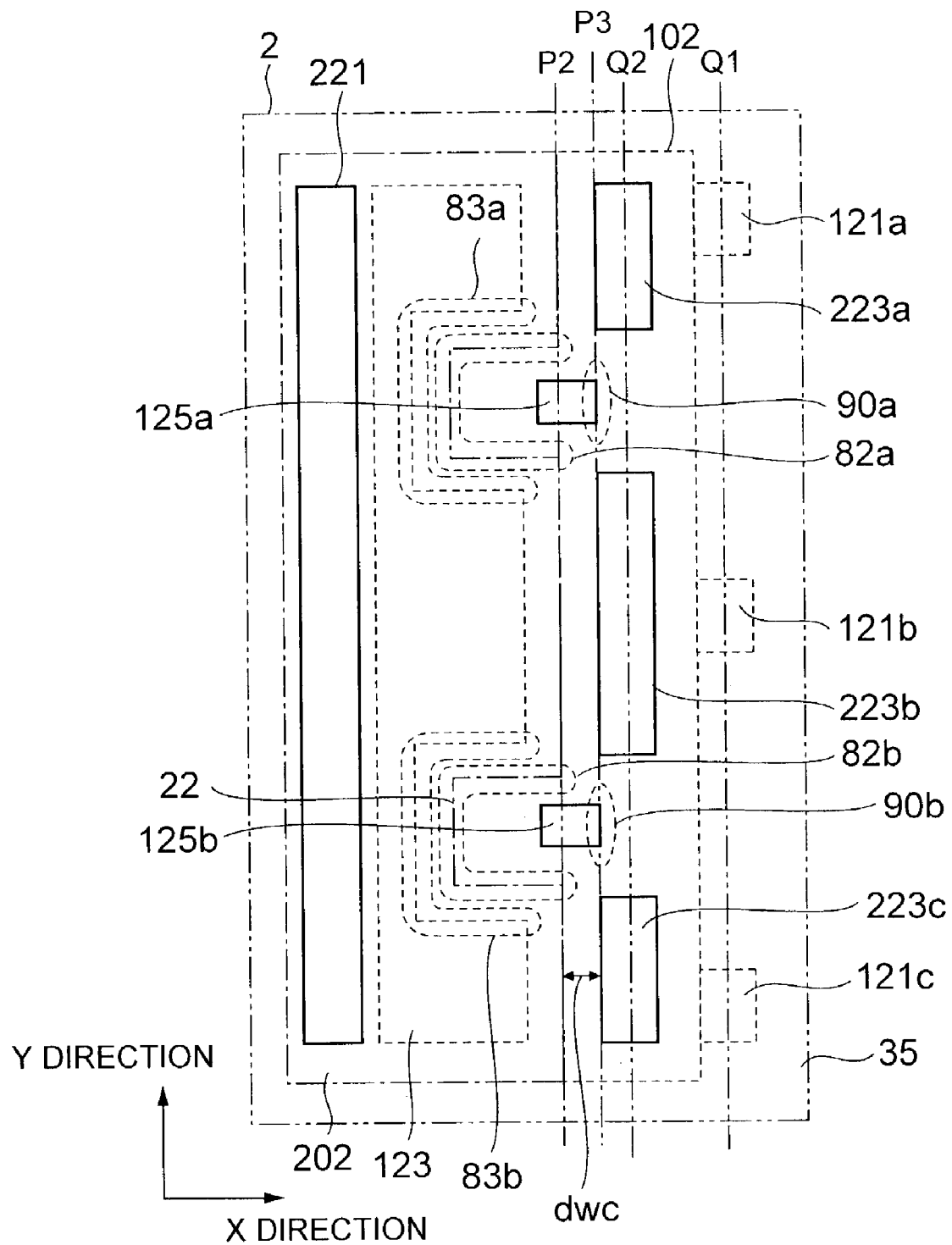
FIG. 6 depicts a schematic plan view showing a planar outline configuration of a second embodiment of an ESD protection device of the present invention.

Next, a second embodiment of an ESD protection device of the present invention will be explained. FIG. 6 is a schematic plan view showing a planner outline configuration of the second embodiment of the ESD protection device of the present invention. Meanwhile, in this embodiment, also similar to the first embodiment, a P+ substrate 30 deposited on a surface thereof with a P type epitaxial layer 31 having a prescribed thickness is used, and illustration of a sectional shape thereof will be omitted. (If necessary FIG. 5A, FIG. 5B will be referenced.)

Referring to FIG. 6, an ESD protection device 2 of the present embodiment is provided with a P conductive type second P well 102, first P diffusion regions 121a, 121b, and 121c, a second P diffusion region 123, third P diffusion regions 125a and 125b, a second N well 202, a first N diffusion region 221, and second N diffusion regions 223a, 223b, and 223c formed respectively on the P type epitaxial layer 31.

Meanwhile, outline configurations of the first P diffusion regions 121a, 121b, and 121c, the third P diffusion regions 125a and 125b, the first N diffusion region 221, and the second N diffusion regions 223a, 223b, and 223c are constituted by a rectangular shape, and the outline configurations of the second P well 102, the second P diffusion region 123, and the second N well 202 are substantially all constituted by a rectangular shape.

Next, these positional relationships thereof and if necessary, detailed configurations thereof will be explained. First, the first P diffusion regions 121a, 121b, and 121c are arranged in the substrate region 35 of P conductive type of the outside of the second P well 102 by being directly brought into contact with the second P well 102, the third P diffusion regions 125a and 125b and the second N diffusion regions 223a, 223b, and 223c are arranged within the second P well 102. Further, the second N well 202 is arranged by being direct contact with the second P well 102 on a boundary on a side opposed to the boundary to be brought into contact with the first P diffusion regions 121a, 121b, and 121c, and the second P diffusion region 123 and the first diffusion region 221 are arranged within the second N well 202.

Meanwhile, in FIG. 6, an example corresponding to k=2 is shown, the first P diffusion regions 121a, 121b, and 121c are arranged on an imaginary first straight line Q1 by isolating therefrom so that each one boundary thereof is in parallel with the first straight line Q1, the second N diffusion regions 223a, 223b, and 223c are arranged on an imaginary second straight line Q2 being parallel with the first straight line Q1 such that each one boundary thereof are in parallel with the second straight line Q2, and the third P diffusion regions 125a and 125b are arranged by isolating therefrom.

Two directions orthogonal to each other are set respectively X direction and Y direction, and the direction of the first straight line Q1 and the second straight line Q2 is set as Y direction. In that case, the second N diffusion regions 223a, 223b, and 223c are arranged such that by the second N well 202 and the first P diffusion regions 121a, 121b, and 121c are sandwiched from X direction and isolated therefrom. A second boundary side 22 constituting a boundary in which the second P well 102 and the second N well 202 being brought into contact with each other, has a first recessed portion 82a and a first recessed portion 82b in X direction incised on a side of the second N well 202. Meanwhile, the other boundaries excluding the second boundary side 22 of the second N well 202 are all in shapes of straight lines.

The third P diffusion regions 125a and 125b are arranged by corresponding to respectively the first recessed portion 82a and 82b. Specifically, they are arranged such that at least a portion of them being entered into the first recessed portions 82a and 82b and having overlapped portion 90a and 90b including a case of being brought into contact with a straight line P 3 in Y direction along the boundary opposed to the second boundary side 22 of the second N diffusion regions 223a, 223b, and 223c.

The second P diffusion region 123 is arranged between the first N diffusion region 221 and the second boundary side 22 being isolated therefrom, a boundary opposing to the second boundary side constituting a boundary between the second P diffusion region 123 and the second N well 202 is in parallel with the second boundary side 22, and has the second recessed portion 83a along the first recessed portion and the second recessed portion 83b along the first recessed portion 82b. An interval between the boundary of the second P diffusion region 123 opposed to the second boundary side 22 and a portion in parallel with the second boundary side 22 is set constant. Meanwhile, in the second P diffusion region 123 also, other boundaries including the boundary opposed to the first N diffusion region 221 are all in a shape of straight line.

Three portions of second N diffusion regions 223a, 223b, and 223c are respectively arranged between portions where the second N well 202 of the second boundary side 22 constitutes projected portions and the first P diffusion regions 121a, 121b, and 121c and such that respectively corresponding for the second N diffusion region 223a to the first P diffusion region 121a, for the second N diffusion region 223b to the first P diffusion region 121b, and for the second N diffusion region 223c to the first P diffusion region 121c.

Furthermore, the first N diffusion region 221 is connected to the VDD interconnection not shown of the LSI being mounted thereon the ESD protection device 2, all of the first P diffusion regions 121a, 121b, and 121c and the second N diffusion regions 223a, 223b, and 223c are connected to the GND interconnection not shown of the LSI being mounted thereon the ESD protection devices 2, the second P diffusion region 123 is connected to the external connection electrode (not shown) connected to the protected device, and the third P diffusion regions 125a and 125b are connected to the output end of the first trigger device not shown.

Furthermore, the input end of the first trigger device is connected to the external connection electrode connecting to the protected device. Meanwhile, in the ESD protection device 2 of the present embodiment, protect operation when the surge current being applied is similar to the ESD protection device 1 of the first embodiment, therefore detailed explanation will be omitted.

The ESD protection device 2 of the present embodiment, as shown in FIG. 6, the third P diffusion regions 125a and 125b constituting trigger-tap electrodes supplying the trigger current are arranged so as to cross the first P well region 101 portion between the second boundary side 22 of the second N well 202 and the second N diffusion regions 223a, 223b, and 223c, in other words, arranged such that a portion of the third P diffusion regions 125a and 125b are entered into the first recessed portions 82a and 82b together with having overlapped portions 90a and 90b with a straight line P3, therefore the flow of the trigger current crosses the base of the horizontal type NPNTr constituted by the second N diffusion regions 223a, 223b, and 223c, the P+ substrate 30, and the second N well 202, thus the horizontal type NPNTr can quickly be turned on.

Furthermore, by arranging the first P diffusion regions 121a, 121b, and 121c at a position as remote as possible from the third P diffusion regions 125a and 125b while they are opposing to the second N diffusion regions 223a, 223b, and 223c from X direction, the trigger current is made flow so as to spread over the entire bottom surface of the second N diffusion regions 223a, 223b, and 223c constituting the cathode at the time of the SCR operation, and the potential in the vicinity of the PN junction portion of respective bottom surfaces of the second N diffusion regions 223a, 223b, and 223c can uniformly be increased. Therefore, the trigger is produced uniformly on the all of the ESD protection device 2 at the time of protecting operation, the voltage of the external connection electrode connecting to the protected device can be clamped at high speed and at low voltage.

Figure 7:
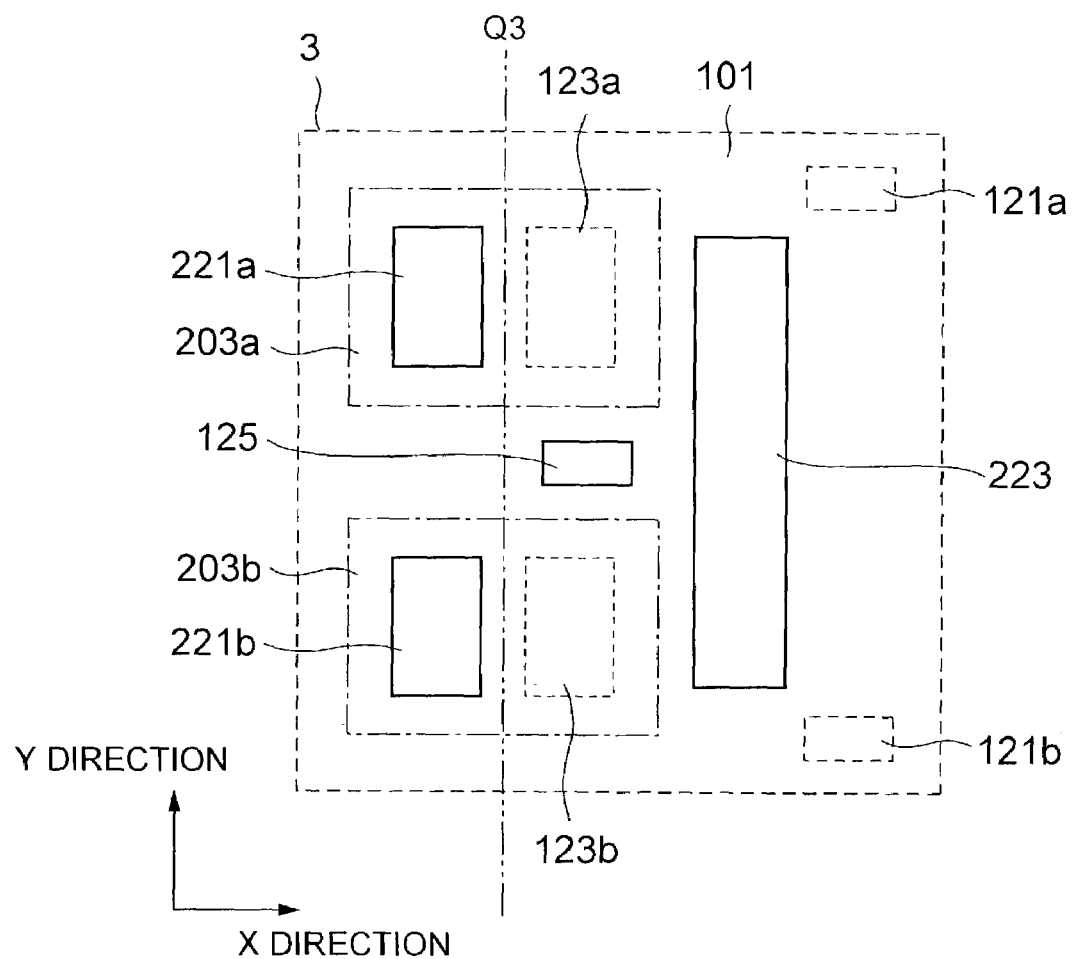
FIG. 7 depicts a schematic plan view showing a planar outline configuration of a third embodiment of an ESD protection device of the present invention.

Next, a third embodiment of an ESD protection device of the present invention will be explained. FIG. 7 depicts a schematic plan view showing a planner outline configuration of the third embodiment of the ESD protection device of the present invention. Meanwhile, in this embodiment, also similar to the first embodiment, a P+ substrate 30 deposited on a surface thereof with a P type epitaxial layer 31 having a prescribed thickness is used, and illustration of a sectional shape thereof will be omitted. (If necessary, FIG. 5A, FIG. 5B will be referenced.)

Referring to FIG. 7, now, an ESD protection device 3 of the present embodiment is provided with a first P well region 101, first P diffusion regions 121a and 121b, second P diffusion regions 123a and 123b, a third P diffusion region 125, two N conductive type third N wells 203a and 203b peripheries thereof being respectively surrounded by a first P well region 101, first N diffusion regions 221a and 221b, and a second N diffusion region 223 and all are formed on a P type epitaxial layer 31.

Meanwhile, outline configurations of the first P diffusion regions 121a and 121b, the second P diffusion regions 123a and 123b, the third P diffusion region 125, the third N wells 203a and 203b, the first N diffusion regions 221a and 221b, and the second N diffusion region 223 are all constituted by a rectangular shape.

All of the first P diffusion regions 121a and 121b, the third P diffusion region 125, and the second N diffusion region 223 are arranged within the first P well region 101, the second P diffusion region 123a and the first N diffusion region 221a are arranged within the third N well 203a, the second P diffusion region 123b and the first N diffusion region 221b are arranged within the third N well 203b. Further, the two third N wells 203a and 203b are the same sizes and each one boundary thereof are arranged on a imaginary first straight line Q3 to be in parallel therewith and by being isolated therefrom.

Furthermore, two directions orthogonal to each other are set respectively in X direction and Y direction, when the direction of the first straight line Q3 is set as Y direction, the second N diffusion region 223 is arranged between by the third N wells 203a and 203b in X direction. Furthermore, the first P diffusion regions 121a and 121b, are arranged between the third N wells 203a and the second N diffusion region 223, and are arranged, with respect to Y direction, one by one to both outsides of the second N diffusion region 223 (in drawing, first P diffusion region 121a is disposed above second N diffusion region 223, and first P diffusion region 121b is disposed below second N diffusion region 223).

The third P diffusion region 125 is arranged between the third N well 203a and the third N well 203b by being isolated therefrom, and in proximity to the second N diffusion region 223. However the third P diffusion region 125 never comes closer to the side of the second N diffusion region 223 beyond the imaginary line along the boundary of the third N wells 203a and 203b opposed to the second N diffusion region 223.

The first N diffusion region 221a and the second P diffusion region 123a are arranged side by side in X direction such that the second P diffusion region 123a comes closer to the second N diffusion region 223 within the third N well 203a, the first N diffusion region 221b and the second P diffusion region 123b are arranged by lining up in X direction such that the second P diffusion region 123b comes closer to the second N diffusion region 223 similarly within the third N well 203b.

Furthermore, the first N diffusion regions 221a and 221b are connected to a VDD interconnection not shown of an LSI mounted ESD protection device 3 thereon, the first P diffusion regions 121a and 121b and the second N diffusion region 223 are both connected to a GND interconnection not shown of the LSI mounted the ESD protection device 3 thereon, the second P diffusion regions 123a and 123b are connected to an external connection electrode (not shown) connecting to a protected device, and the third P diffusion region 125 is connected to an output end of a first trigger device not shown.

Furthermore, the input end of the first trigger device is connected to the external connection electrode connecting to the protected device. Meanwhile, in the ESD protection device 3 of the present embodiment, protect operation when the surge current being applied is similar to the ESD protection device 1 of the first embodiment, therefore detailed explanation will be omitted.

In the ESD protection device 3 of the present embodiment, as shown in FIG. 7, the third P diffusion region 125a constituting a trigger-tap electrode for supplying a trigger current is arranged between the third N wells 203a and 203b, and the first P diffusion regions 121a and 121b are arranged at the more outside than the second N diffusion region 223 as remote as possible from the third P diffusion region 125 with regard to Y direction. Accordingly, since it is possible to spread the trigger current on an entire wall surface of regions between the third N wells 203a and 203b functioning as a base region of a horizontal type NPNTr at the time of SCR operation, a trigger phenomenon can be produced uniformly over an entire body of the ESD protection device 3 at the time of protecting operation, and voltage of the external connection electrode connecting to the protected device can be clamped at high speed and at low voltage.

Figure 8A:
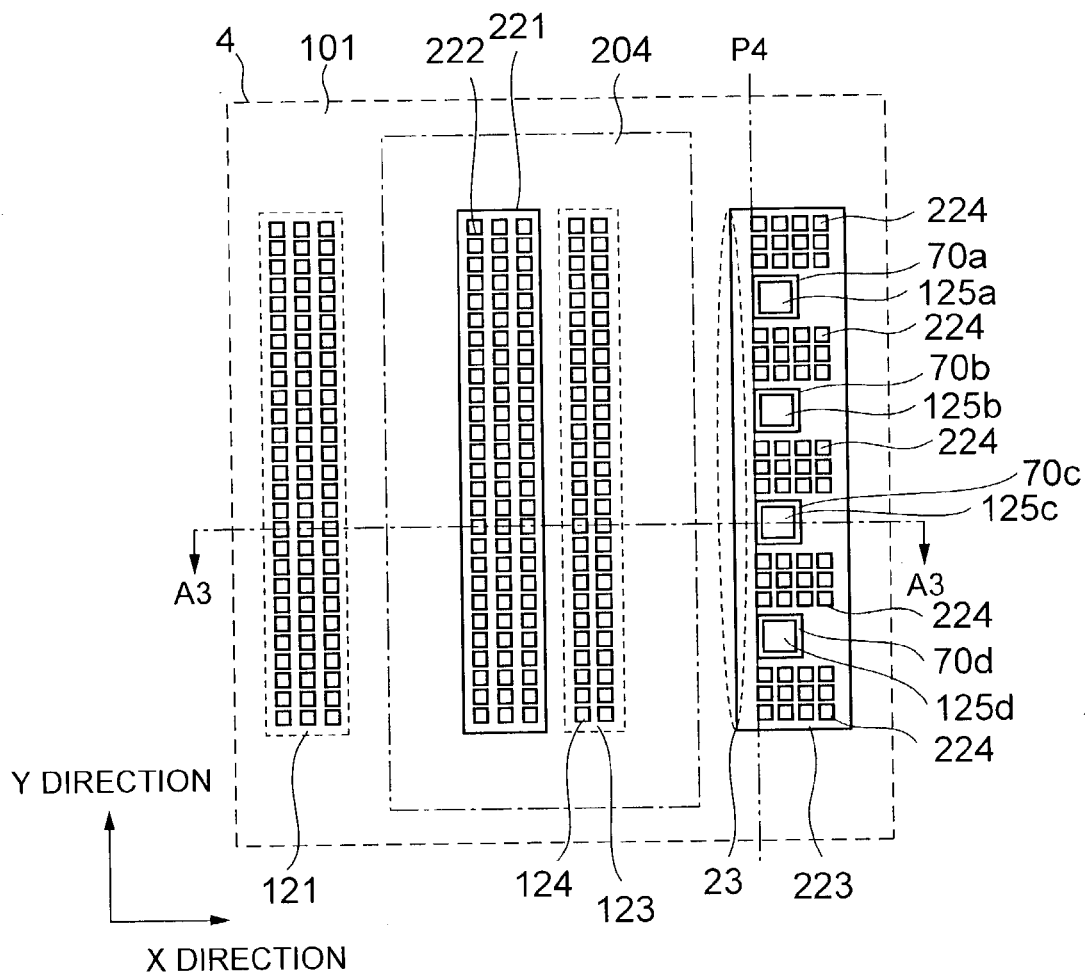
FIG. 8A depicts a view for explaining a fourth embodiment of an ESD protection device of the present invention, and depicts a schematic plan view showing a planar outline configuration thereof.
Figure 8B:
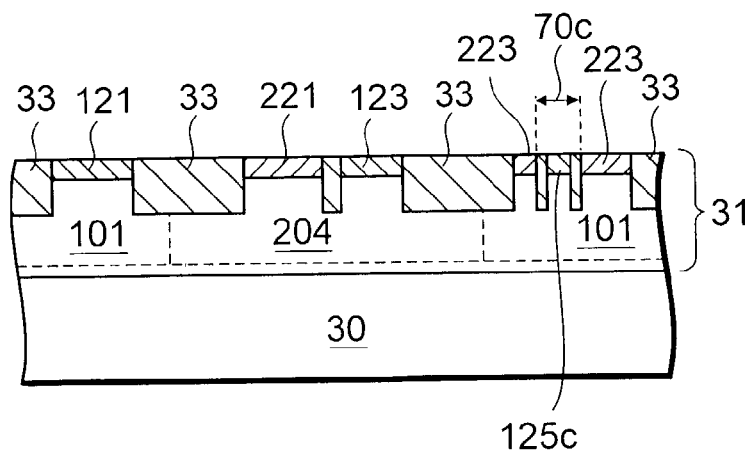
FIG. 8B depicts a view for explaining a fourth embodiment of an ESD protection device of the present invention, and depicts a cross sectional view showing a model of a cross section taken on line A3—A3 of FIG. 8A.

Next, a fourth embodiment of an ESD protection device of the present invention will be explained. FIG. 8A depicts a view for explaining the fourth embodiment of the ESD protection device of the present invention, and depicts a schematic plan view showing a planner outline configuration of an ESD protection device 4. FIG. 8B depicts a schematic sectional view showing a model of a cross section taken on line A3—A3 of FIG. 8A. Meanwhile, in this embodiment, also similar to the first embodiment, a P+ substrate 30 deposited on a surface thereof with a P type epitaxial layer 31 having a prescribed thickness is used. Referring to FIG. 8A, the ESD protection device 4 of the present embodiment, a first P well region 101, an N conductive type fourth N well 204 peripheries thereof are brought into direct contact with and surrounded by a first P well region 101, a first P diffusion region 121 and a second N diffusion region 223 arranged within the first P well region 101, a second P diffusion region 123 and a first N diffusion region 221 arranged within the fourth N well 204, a plurality of first blank portions 70a, 70b, 70c, and 70d left the first P well region 101 as it is in the second N diffusion region 223, and third P diffusion regions 125a, 125b, 125c, and 125d arranged respectively in the respective first blank portions 70a, 70b, 70c, and 70d are provided, which are respectively formed on the P type epitaxial layer 31.

Meanwhile, the outline configurations of the first P diffusion region 121, the second P diffusion region 123, the third P diffusion regions 125a, 125b, 125c, and 125d, the fourth N well 204, the first N diffusion region 221, the second N diffusion region 223, and the first blank portions 70a, 70b, 70c, and 70d are all constituted by a rectangular shape.

The fourth N well 204 is arranged between the first P diffusion region 121 and the second N diffusion region 223 by being opposed thereto and isolated therefrom. Further, the first N diffusion region 221 and the second P diffusion region 123 are arranged side by side so that the first N diffusion region 221 comes closer to a side of the first P diffusion region 121 and the second P diffusion region 123 goes near to the side of the second N diffusion region 223.

The first blank portions 70a, 70b, 70c, and 70d are arranged along the third boundary side 23 constituting a boundary between the second N diffusion region 223 and the first P well region 101 and opposed to the fourth N well 204 linearly and being isolated therefrom, for example at equal intervals. The first blank portions 70a, 70b, 70c, and 70d occur when implanting the impurities in order to form the second N diffusion region 223, for example, by masking an unprocessed portions by using a photo resist and others and as the result the first P well region 101 has been left as it is as a region.

Further, the third P diffusion regions 125a, 125b, 125c, and 125d are respectively arranged in the first blank portions 70a, 70b, 70c, and 70d.

Meanwhile, in the ESD protection device 4 of the present embodiment, two directions orthogonal to each other are set respectively as a X direction and Y direction, when the direction of the third boundary side 23 is set as Y direction, contact holes 224 (in sectional view of FIG. 8B illustration is omitted) of the second N diffusion region 223 are provided in the region on an opposite side to the side of the third boundary side 23 with regard to a straight line P4 of Y direction passing through the boundary on the side of the third boundary side 23 of the first blank portions 70a, 70b, 70c, and 70d. In other words, in the region between the third boundary side 23 and the straight line P3, no contact holes 224 are arranged.

Furthermore, the first N diffusion region 221 is connected to a VDD interconnection not shown of an LSI mounted the ESD protection device 4 thereon, both of the first P diffusion region 121 and the second N diffusion region 223 are connected to a GND interconnection not shown of the LSI mounted the ESD protection device 4 thereon, the second P diffusion region 123 is connected to an external connection electrode (not shown) connecting a protected device, and the third P diffusion regions 125a, 125b, 125c, and 125d are connected to an output end of the first trigger device not shown. Furthermore, an input end of a first trigger device is connected to the external connection electrode connecting to the protected device. Meanwhile, in the ESD protection device 4 of the present embodiment, a protecting operation at the time of application of surge current is similar to the ESD protection device 1 of the first embodiment, to thereby omits the detailed description.

In the ESD protection device 4 of the present embodiment, as shown in FIG. 8A, the first blank portions 70a, 70b, 70c, and 70d to have been the region where the first P well region 101 has been left as it is on the side close to the second P diffusion region 123 in the second N diffusion region 223 is provided. Further, the third P diffusion regions 125a, 125b, 125c, and 125d functioning as trigger-tap electrodes for supplying a trigger current are arranged within the first blank portions as well as arranging the first P diffusion region 121 on an opposite side to the third P diffusion regions 125a, 125b, 125c, and 125d by sandwiching the fourth N well 204 therebetween.

Accordingly, although the trigger current at the time of a start of the protecting operation flows to the first P diffusion region 121 via the first P well region 101, since current density of a bottom surface of the second N diffusion region 223 functioning as a cathode at the time of the SCR operation can be made high, a potential of the first P well region 101 in the vicinity of the second N diffusion region 223 can quickly be increased, voltage of the desired external connection electrode can be clamped at low voltage by quickly starting the SCR operation.

Furthermore, in the region between the third boundary side 23 and the straight line P3, the contact holes 224 have not arranged. Therefore partial excessive current concentration at the time of the SCR operation can be constrained as well as constraining a thermal damage caused by heat evolution.

Furthermore, since configurations of the second P diffusion region 123 and others which functions as an anode at the time of SCR operation are not altered, many of the third P diffusion regions serving as the trigger-tap electrodes can be arranged, in a case where current supply capability of the trigger device can be made high, and such a structure is more effective.

Meanwhile, when the ESD protection device aims at clamping the voltage at the low voltage, it is a matter of course that trigger voltage of the trigger device is made low, until the ESD protection device becomes at the low voltage after a start of the SCR operation, a current is discharged by the trigger device. Accordingly, current absorptive capability of the trigger device must be enhanced. In that case, a current from the trigger device is absorbed by and from the first P diffusion region 121 connected to GND interconnection via the P+ substrate 30, therefore, unless a number of the third P diffusion regions have not been arranged, the voltage at that portions is increased largely, and the ESD protection device cannot be clamped at the low voltage. That is, in order to use effectively the trigger current, not only lower the resistance of the trigger device, but also it is better to arrange a majority of third P diffusion regions serving as the trigger-tap electrodes like the present embodiment.

Figure 9A:
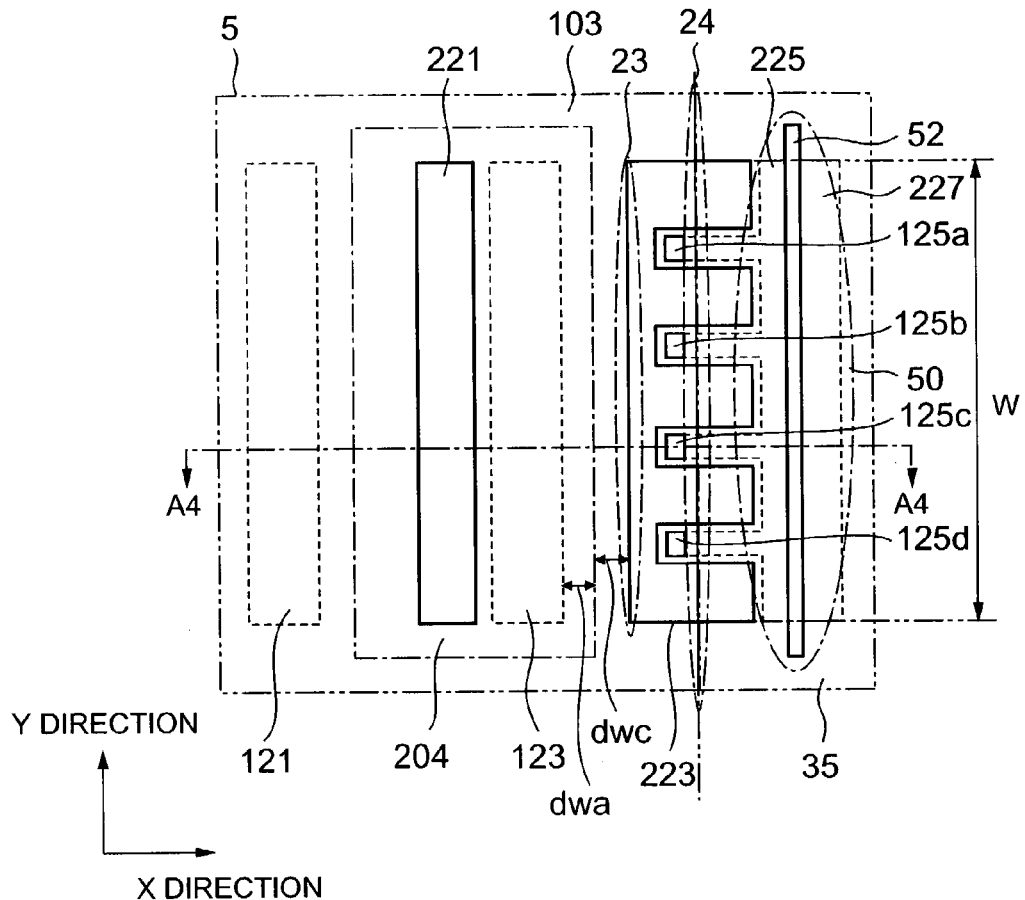
FIG. 9A depicts a view for explaining a fifth embodiment of an ESD protection device of the present invention, and depicts a schematic plan view showing a planar outline configuration thereof.
Figure 9B:
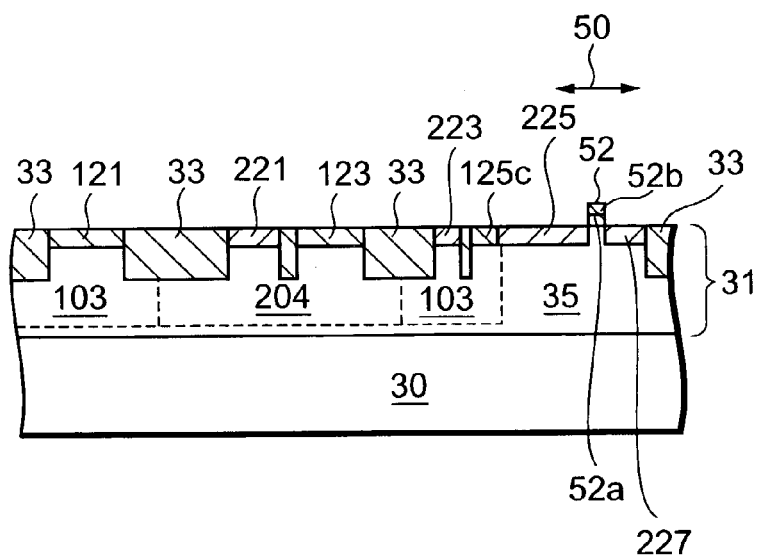
FIG. 9B depicts a view for explaining a fifth embodiment of an ESD protection device of the present invention, and depicts a cross sectional view showing a model of a cross section taken on line A4—A4 of FIG. 9A.

Next, a fifth embodiment of an ESD protection device of the present invention will be explained. FIG. 9A depicts a view for explaining the fifth embodiment of the ESD protection device of the present invention, and depicts a schematic plan view showing a planner outline configuration of an ESD protection device 5. FIG. 9B depicts a schematic sectional view showing a model of a cross section taken on line A4—A4 of FIG. 9A. Meanwhile, in this embodiment, also similar to the first embodiment, a P+ substrate 30 deposited on a surface thereof with a P type epitaxial layer 31 having a prescribed thickness is used.

Referring to FIG. 9A, an ESD protection device 5 of the present embodiment, is provided with a P conductive type third P well region 103, an N conductive type third N diffusion region 225 and an N conductive type fourth N diffusion region 227, a gate region 52, a fourth N well 204 periphery thereof being surrounded by the third P well region 103, a first P diffusion region 121 and third P diffusion regions 125a, 125b, 125c, and 125d arranged in the third P well region 103, a second P diffusion region 123 and a first N diffusion region 221 arranged within the fourth N well 204 and a second N diffusion region 223 arranged by striding over a fourth boundary side 24 serving as the boundary between the third P well region 103 and a substrate region 35 respectively formed on a P type epitaxial layer 31.

Meanwhile, an outline configuration of the first P diffusion region 121, the second P diffusion region 123, the third P diffusion regions 125a, 125b, 125c, and 125d, the fourth N well 204, the first N diffusion region 221, the gate region 52 and the fourth N diffusion region 227 are all constituted by a rectangular shape, and a second N diffusion region 223 and a third N diffusion region 225 are substantially constituted by a rectangular shape and have a irregularity on each one boundary.

Next, these positional relationships thereof and if necessary, detailed configurations thereof will be explained. First, when two directions orthogonal to each other are set respectively as a X direction and Y direction, and the direction of the fourth boundary side 24 is set as Y direction, the fourth N well 204 is arranged between the first P diffusion region 121 and the second N diffusion region 223 such that by being opposed thereto and isolated therefrom in X direction and the direction of a boundary opposed thereto constituting Y direction in parallel with the fourth boundary side 24.

Furthermore, the first N diffusion region 221 and the second P diffusion region 123 are arranged side by side in X direction such that the first N diffusion region 221 coming closer to a side of the first P diffusion region 121 and the second P diffusion region 123 going near to a side of the second N diffusion region 223.

Furthermore, the second N diffusion region 223 constitutes the boundary between the second N diffusion region 223 and the third P well region 103, the boundary on an opposite side to the third boundary side 23 opposing to the fourth N well 204 constitutes an irregularity side having respectively a plurality of projected portions reaching to the substrate region 35 and recessed portions reaching to the third P well region 103.

The third P diffusion regions 125a, 125b, 125c, and 125d are arranged in a portion of the third P well region 103 of respective projected portions of the second N diffusion region 223. The third N diffusion region 225 is arranged by opposing to the irregularity side constituting the boundary on an opposite side to the third boundary side 23 of the second N diffusion region 223. The gate region 52 is arranged by being brought into contact with the boundary of the opposite side of the boundary opposing to the third N diffusion region 225 to the second N diffusion region 223. The fourth N diffusion region 227 is arranged by being opposed to the third N diffusion region 225 via the gate region 52 and brought into contact with the gate region 52.

Further, the boundary opposing to the second N diffusion region 223 of the third N diffusion region 225 has the projected portions to be brought into direct contact with the third P diffusion regions 125a, 125b, 125c, and 125d by passing through the recessed portions of the irregularity side of the second N diffusion region 223.

With above-described arrangement and constitution, the first N diffusion region 221 is connected to a VDD interconnection not shown of an LSI mounted the ESD protection device 5 thereon. In addition, all of the first P diffusion region 121, the second N diffusion region 223 and gate electrodes 52b provided on gate insulating films 52a of the gate region 52 are connected to GND interconnections not shown of the LSI mounted the ESD protection device 5 thereon. The second P diffusion region 123 and the fourth N diffusion region 227 are connected to an external connection electrodes (not shown) connected to a protected device.

In the ESD protection device 5 of the present embodiment, an NMOS 50 constructed of the third N diffusion region 225, the fourth N diffusion region 227 and the gate region 52 functions as the trigger device. The NMOS 50 is formed in the substrate region 35, therefore, a snapback is easy to occur more than a case where the NMOS 50 is formed in the third P well region 103, and when surge current is applied to the external connection electrode connected to the fourth N diffusion region 227 the trigger current is easy to flow.

Meanwhile, in the ESD protection device 5 of the present embodiment, a protecting operation after the surge current is applied and the trigger current is started to flow is similar to the ESD protection device 1 of the first embodiment, to thereby omit the detailed description.

The ESD protection device 5 of the present embodiment, practically, has a constitution added the NMOS 50 functioning as a trigger device to the ESD protection device 4 of the fourth embodiment. Accordingly, an operation effect thereof is similar to a case of the fourth embodiment, thus the detailed description will be omitted. However, in the present embodiment, connection of the third N diffusion region 225 constituting an output end of the trigger device and the third P diffusion regions 125a, 125b, 125c, and 125d are arranged and formed such that respective diffusion regions are brought into direct contact with each other. As the result, there is no need interconnection connecting a trigger-tap electrode to the output end of the trigger device, and the ESD protection device can be made in smaller size.

Furthermore, with an attempt not to arrange contact holes 224 at least to the second N diffusion region 223 between the third P diffusion regions 125a, 125b, 125c, and 125d and the third boundary side 23 in the case of the present embodiment also, partially excessive current concentration can be restrained during a SCR operation as well as restraining a thermal damage caused by heat evolution.

Figure 10A:
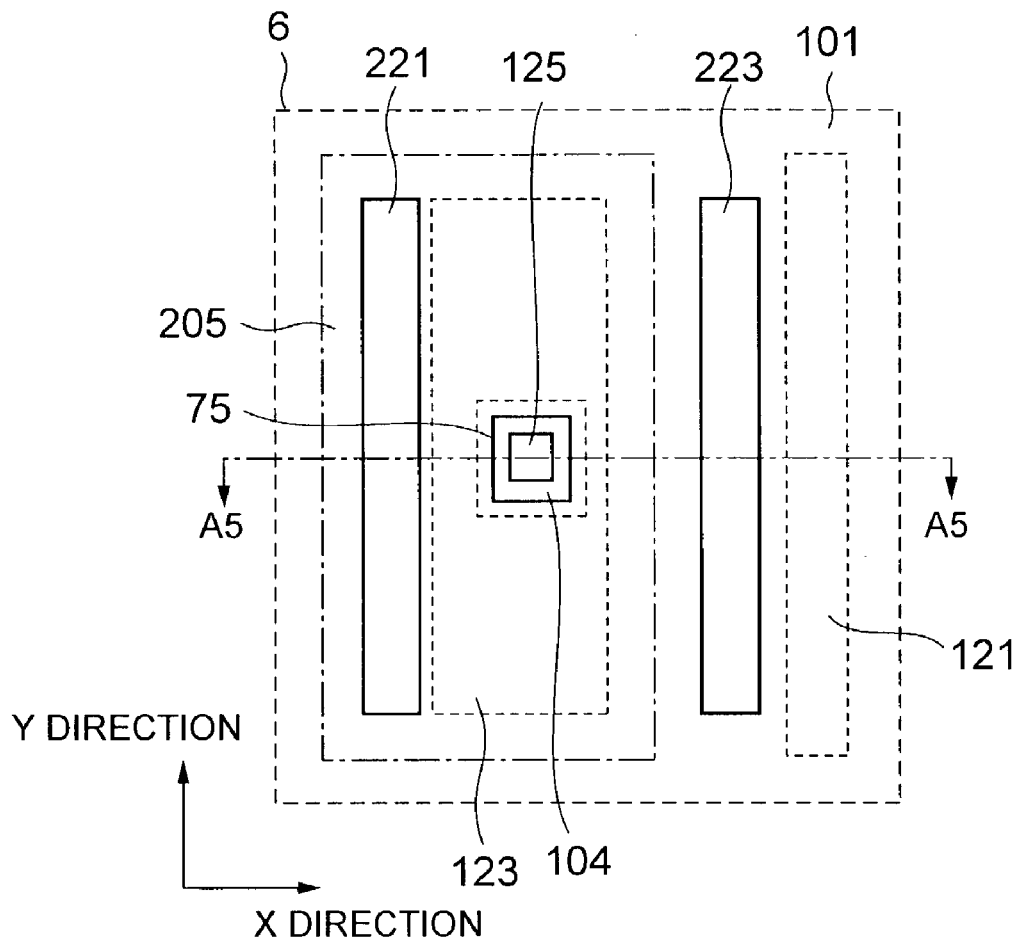
FIG. 10A depicts a view for explaining a sixth embodiment of an ESD protection device of the present invention, and depicts a schematic plan view showing a planar outline configuration thereof.
Figure 10B:
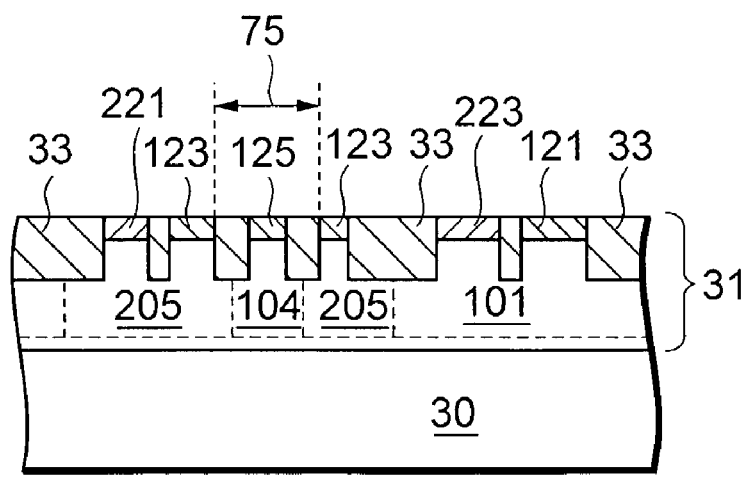
FIG. 10B depicts a view for explaining a sixth embodiment of an ESD protection device of the present invention, and depicts a cross sectional view showing a model of a cross section taken on line A5—A5 of FIG. 10A.

Next, according to a sixth embodiment of an ESD protection device of the present invention will be described. FIG. 10A is a view for explaining the sixth embodiment of the ESD protection device of the present invention, and is a schematic plan view showing a planner outline configuration of an ESD protection device 6 of the present embodiment. FIG. 10B is a sectional view showing a model of a cross section taken on line A5—A5 of FIG. 10A. Meanwhile, in the present embodiment also, similar to a case of the first embodiment, a P+ substrate 30 deposited a P type epitaxial layer 31 thereon having a prescribed thickness on a surface thereof will be used.

Referring to FIG. 10A, the ESD protection device 6 of the present embodiment is provided with a P conductive type first P well region 101, a fifth N well 205 a periphery thereof being brought into direct contact with and surrounded by the first P well region 101, a fourth P well 104 the periphery thereof being brought into direct contact with and surrounded by the fifth N well 205, a first P diffusion region 121, a second N diffusion region 223, a second P diffusion region 123 and first N diffusion region 221 arranged in the fifth N well region 205, a second blank portion 75 provided in the second P diffusion region 123, and a third P diffusion region 125 arranged within the fourth P well 104 respectively formed on the P type epitaxial layer 31.

Meanwhile, an outline configuration of the first P diffusion region 121, the second P diffusion region 123, the third P diffusion region 125, the fourth P well 104, the first N diffusion region 221, and the second blank portion 75 are all constituted by a rectangular shape.

In addition, the second N diffusion region 223 is arranged between the fifth N well 205 and the first P diffusion region 121 by being isolated therefrom and opposed thereto. Further, the second P diffusion region 123 is arranged between the first N diffusion region 221 and the second N diffusion region 223 by being isolated therefrom and being opposed thereto. The second P diffusion region 123 surrounds a periphery of the fourth P well 104 by being isolated therefrom, and an inside of a boundary of the second P diffusion region 123 opposing to the fourth P well 104 constitutes the second blank portion 75.

Furthermore, each length of respective boundaries opposing the first N diffusion region 221 and the second N diffusion region 223, and the second P diffusion region 123 to each other is substantially equal, and each length of respective boundaries opposing the fifth N well 205 and the first P diffusion region 121 to each other via the second N diffusion region 223 is also substantially equal.

In the above-described arrangement, the first N diffusion region 221 is connected to a VDD interconnection not shown of an LSI mounted the ESD protection device 6 thereon. In addition, the first P diffusion region 121 and the second N diffusion region 223 are connected to a GND interconnection not shown of the LSI mounted the ESD protection device 6 thereon. Further, the second P diffusion region 123 and the third P diffusion region 125 are connected to an external connection electrodes (not shown) connecting to a protected device.

In the ESD protection device 6 of the present embodiment also, a protecting operation when surge current is applied is similar to the ESD protection device 1 of the first embodiment, therefore, detailed description will be omitted. Furthermore, in the ESD protection device 6 of the present embodiment, the periphery of the third P diffusion region 125 serving as a trigger-tap electrode is surrounded by the fifth N well 205, and the second N diffusion region 223 is arranged between the fifth N well 205 and the first P diffusion region 121. Accordingly, a relative positional relationship between the third P diffusion region 125, the fifth N well 205 and the first P diffusion region 121 is similar to the case of the fourth and fifth embodiments, the operation al effect thereof is similar to the fourth and fifth embodiments.

Figure 11:
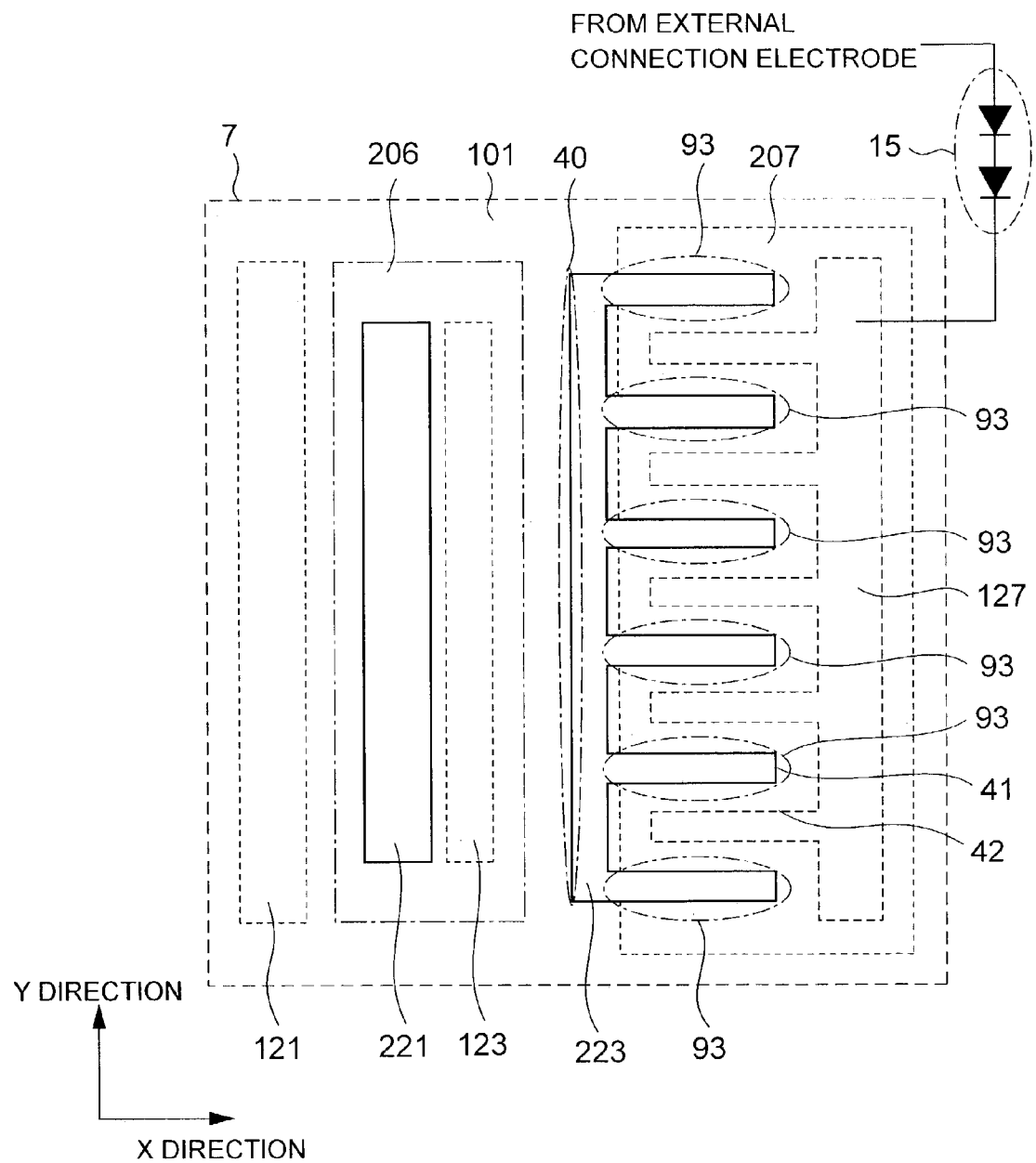
FIG. 11 depicts a schematic plan view showing a planar outline configuration of a seventh embodiment of an ESD protection device of the present invention.

Next, according to a seventh embodiment of an ESD protection device of the present embodiment will be explained. FIG. 11 is a schematic plan view showing a planner outline configuration of the seventh embodiment of the ESD protection device of the present invention. Meanwhile, in this embodiment, also similar to the first embodiment, a P+ substrate 30 deposited on a surface thereof with a P type epitaxial layer 31 having a prescribed thickness is used, and illustration of a sectional shape thereof will be omitted. (If necessary FIG. 5A, FIG. 5B will be referenced.)

Referring to FIG. 11, an ESD protection device 7 of the present embodiment is provided with a P conductive type first P well region 101, an N conductive type sixth N well 206 and N conductive type seventh N well 207 respective periphery thereof are brought into direct contact with and surrounded by a first P well region 101, a first P diffusion region 121 and a second N diffusion region 223 arranged within the first P well region 101, a second P diffusion region 123 and a first N diffusion region 221 arranged within the sixth N well 206, and a P conductive type fourth P diffusion region 127 arranged within seventh N well 207 respectively formed on a P type epitaxial layer 31.

Meanwhile, an outline configuration of the first P diffusion region 121, the second P diffusion region 123, the sixth N well 206 and the seventh N well 207 are all constituted by a rectangular shape, the outline configuration of the second N diffusion region 223 and the fourth P diffusion region 127 are substantially constituted by a rectangular shape and both have irregularity portions on one boundary side.

Next, these positional relationships thereof and if necessary, detailed configurations thereof will be explained. First, the sixth N well 206 is arranged between the first P diffusion region 121 and the second N diffusion region 223 by being isolated therefrom and opposed thereto, and a boundary opposed to each other being made in parallel.

Further, the first N diffusion region 221 are arranged between the first P diffusion region 121 and the second P diffusion region 123 by being isolated therefrom and opposed thereto, and the boundary opposed to mutually being made in parallel. The boundary of the second N diffusion region 223 opposing to the sixth N well 206 is a straight line side 40, and the boundary on an opposite side of the straight line side 40 constitutes a first irregularity side 41 having comb shaped irregularities. In addition, projected portions of the first irregularity side 41 constitute a plurality of N—N overlapped portions 93 overlapped with the seventh N well 207.

Furthermore, the fourth P diffusion region 127 is arranged by being isolated therefrom and opposed thereto the first irregularity side 41, and the boundary of the fourth P diffusion region 127 opposing to the first irregularity side 41 constitutes a second irregularity side 42 having the comb shaped irregularities. The second N diffusion region 223 and the fourth P diffusion region 127 are arranged such that one projected portion of the first irregularity side 41 and the second irregularity side 42 being entered into and brought in mesh with other recessed portion thereof. Meanwhile, the boundary of the fourth P diffusion region 127 on the opposite side of the second irregularity side 42 is constituted in a straight line shape. Furthermore, the recessed portions between the projected portion and the projected portion of the first irregularity side 41 of the second N diffusion region 223 are arranged so as to have no overlapped portions with the seventh N well 207.

Further, lengths of the respective boundaries opposing the first P diffusion region 121 and the sixth N well 206 to mutually are substantially equal, the lengths of respective boundaries opposing the third P diffusion region 123 and the first N diffusion region 221 to mutually are also substantially equal. Furthermore, regarding the respective boundaries opposing the sixth N well 206 and the seventh N well 207 to mutually via the second N diffusion region 223, the length of the boundary of the sixth N well 206 never exceeds the length of the boundary of the seventh N well 207, and regarding the respective boundaries opposing the sixth N well 206 and the second N diffusion region 223 to mutually, the length of the boundary of the second N diffusion region 223 never exceeds the length of the boundary of the sixth N well 206.

With above-described constitution and arrangement, the first N diffusion region 221 is connected to a VDD interconnection not shown of an LSI mounted thereon the ESD protection device 7. The first P diffusion region 121 and the second N diffusion region 223 are connected to a GND interconnection not shown of the LSI being mounted thereon the ESD protection device 7. The second P diffusion region 123 is connected to an external connection electrode (not shown) connecting the second P diffusion region 123 to a protected device, and the fourth P diffusion region 127 is connected to an output end of a first trigger device 15 connected an input end to an external connection electrode.

Next, a protecting operation when surge current is applied to the external connection electrode not shown connected thereto the ESD protection device 7 of the present embodiment via the first trigger device 15 will be described. Meanwhile, the first trigger device 15 has a constitution connected two pieces of diodes to mutually in series in a forward direction. Namely, an anode and cathode of a first diode are respectively connected to the prescribed external connection electrode and an anode of the second diode, and a cathode of the second diode is connected to the fourth P diffusion region 127 of the ESD protection device 7. In the ESD protection device 7 although the third P diffusion region constituting a trigger-tap electrode is not provided, a PN junction diode is formed by the fourth P diffusion region 127 and the second N diffusion region 223.

Accordingly, from when voltage of the external connection electrode exceeds 2V the current starts to flow into the ESD protection device 7. In such processing, a parasitic PNPTr is constituted by the fourth P diffusion region 127, the second N diffusion region 223 and the seventh N well 207, the first P well region 101, and a P+ substrate 30, as the result current flows even into the P+ substrate 30, the voltage increases, and trigger is produced to a SCR operation. The current flows into the P+ substrate 30 is caused by a parasitic bipolar operation and is not so large.

However, such as the present embodiment, the fourth P diffusion region 127 and the second N diffusion region 223 are formed in a comb shape and brought in mesh with mutually, on condition that the junction area of the diode formed by these diffusion regions is made considerably wide, the SCR can sufficiently be triggered. Meanwhile, in the present embodiment before the start of the SCR operation, diode formed by the fourth P diffusion region 127 and the second N diffusion region 223 is required to be brought the diode into conductive state, and special attention should be paid for the design of the trigger voltage of the first trigger device 15.

Specifically, when calculating the trigger voltage it may be favorable to consider the fact of addition of forward direction al lowered voltage (normally, approximately 0.7V) to conduction start voltage of the first trigger device 15.

The ESD protection device 7 of the present embodiment is designed such that, when starting the protecting operation by applying the surge current to the external connection electrode, a trigger signal is inputted to the fourth P diffusion region 127. Accordingly, absorptive capability of a trigger current can be enhanced, and the trigger current can be effectively used. Particularly, there is no limit of capacitance in protection of an electric source and others, therefore, the ESD protection device 7 with the enlarged fourth P diffusion region 127 is effective.

Figure 12:
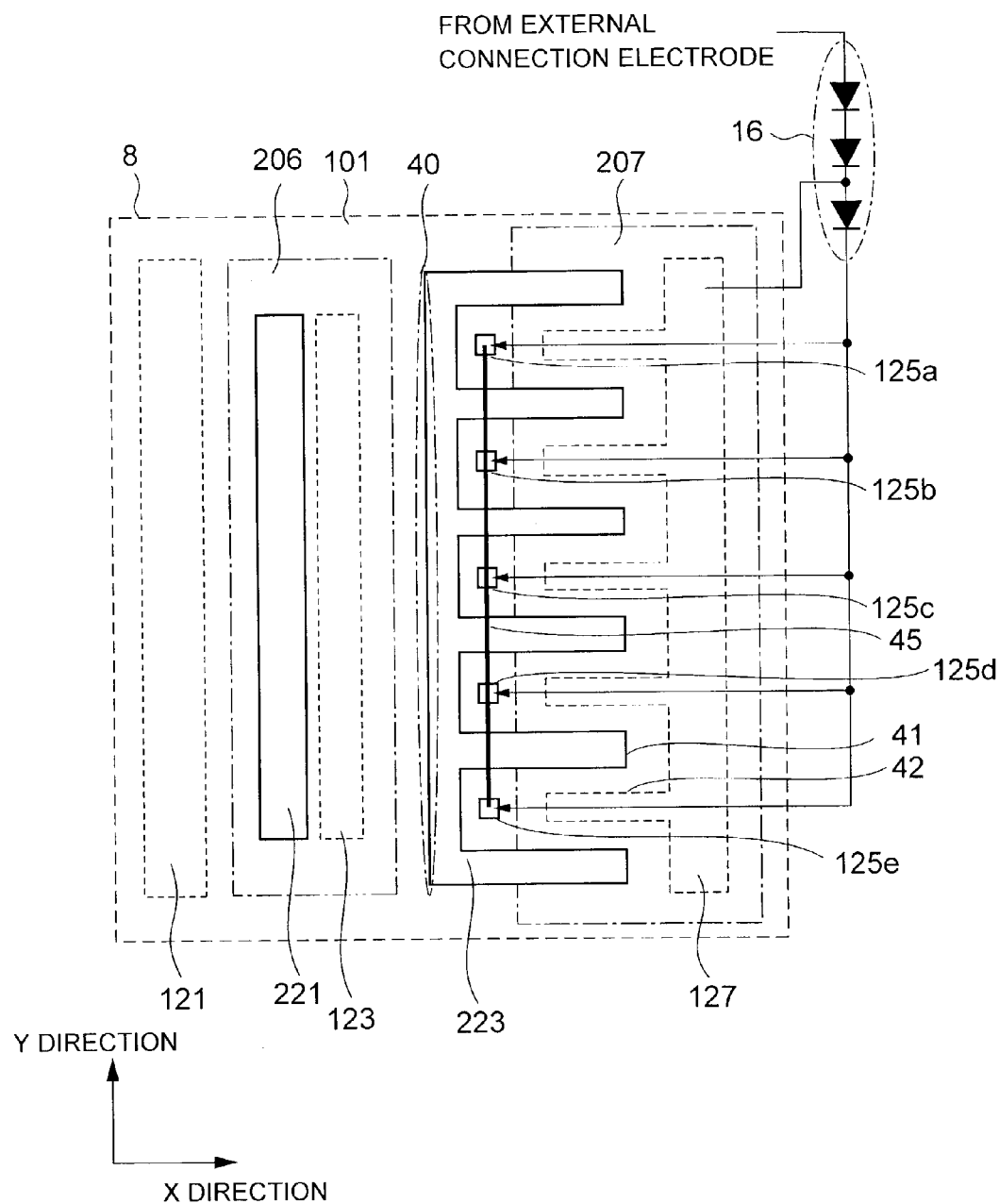
FIG. 12 depicts a schematic plan view showing a planar outline configuration of a modified example of a seventh embodiment of an ESD protection device of the present invention.

Next, modified example of the present embodiment will be explained. FIG. 12 is a schematic plan view showing a planner outline configuration of the ESD protection device 8 of the modified example. The ESD protection device 8 is different from the ESD protection device 7 in terms of further having third P diffusion regions 125a, 125b, 125c, 125d, and 125e between respective boundaries of recessed portions of the second N diffusion region 223 and the boundary of the seventh N well 207 opposing thereto and interconnection 45 commonly connecting the third P diffusion regions.

In association with that, in the ESD protection device 8, a first N diffusion region 221 is connected to a VDD interconnection not shown of an LSI being mounted thereon the ESD protection device 8, both of the first P diffusion region 121 and the second N diffusion region 223 are connected to a GND interconnection not shown of the LSI being mounted thereon the ESD protection device 8, and the second P diffusion region 123 is connected to an external connection electrode (not shown) connecting to a protected device.

In addition, in the ESD protection device 8, all of the third P diffusion regions 125a, 125b, 125c, 125d, and 125e are connected to a first output end of a second trigger device 16 connected input end thereof to the external connection electrode, and a fourth P diffusion region 127 is connected to a second output end of the second trigger device 16. The second trigger device 16 is formed, for example, by adding one piece of diode having an anode connected to an output end thereof to the first trigger device 15 and a cathode and the anode of the added diode constitute respectively the first output end and the second output end of the second trigger device 16. With this constitution, at the time of protecting operation, trigger currents are injected from the third P diffusion regions 125a, 125b, 125c, 125d, and 125e. Therefore, voltage of the first P well region 101 in the vicinity of the second N diffusion region 223 quickly increases, and a start of a SCR operation can be made at further high speed.

Figure 13:
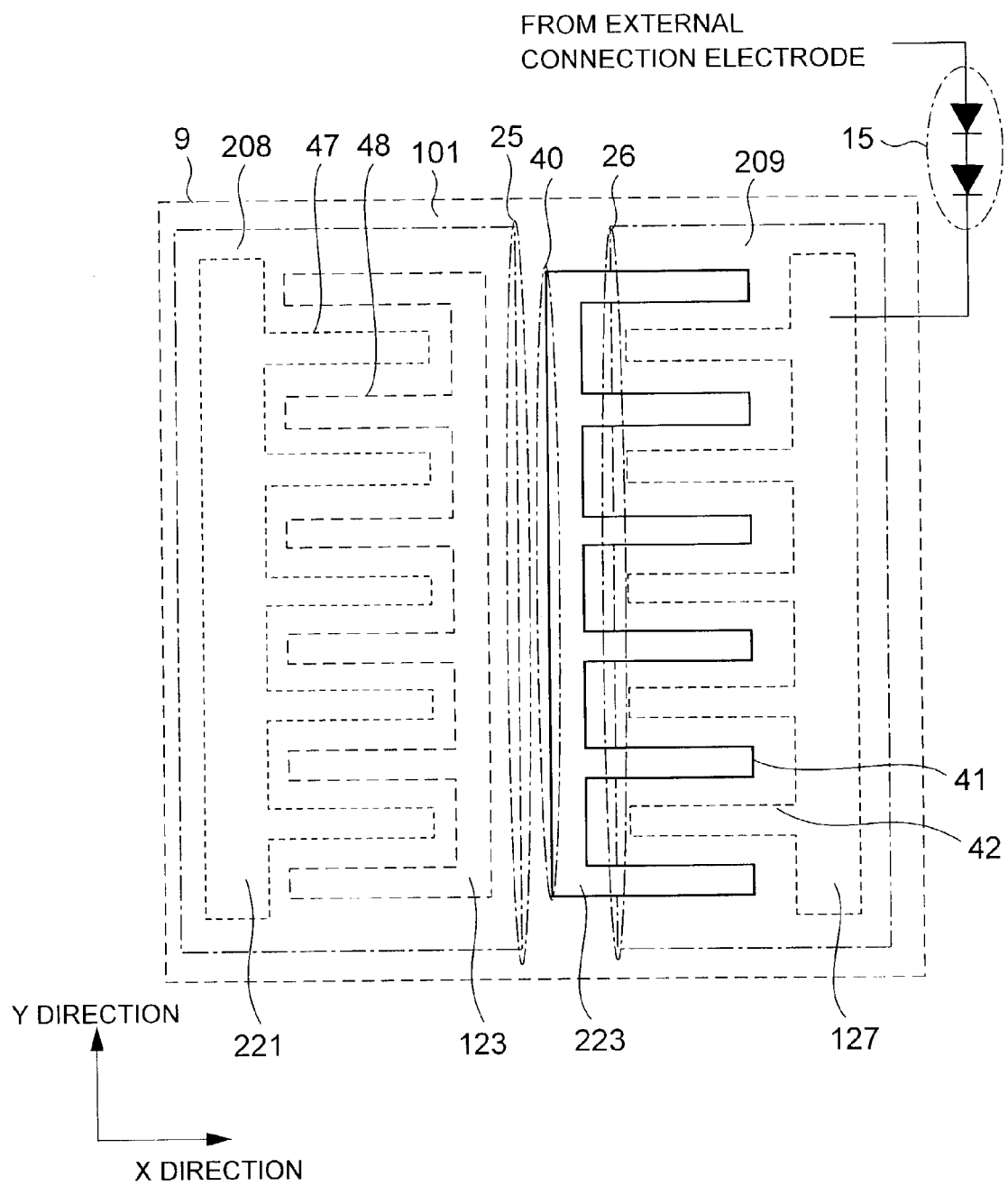
FIG. 13 depicts a schematic plan view showing a planar outline configuration of an eighth embodiment of an ESD protection device of the present invention.

Next, according to a eighth embodiment of an ESD protection device of the present embodiment will be explained. FIG. 13 is a schematic plan view showing a planner outline configuration of the eighth embodiment of the ESD protection device of the present invention. Meanwhile, in this embodiment, also similar to the first embodiment, a P+ substrate 30 deposited on a surface thereof with a P type epitaxial layer 31 having a prescribed thickness is used, and illustration of a sectional shape thereof will be omitted. (If necessary FIG. 5A, FIG. 5B will be referenced.)

Referring to FIG. 13, an ESD protection device 9 of the present embodiment is provided with a P conductive type first P well region 101, an N conductive type eighth N well 208 and an N conductive type ninth N well 209 peripheries thereof being brought into direct contact with and surrounded by the first P well region 101, a second N diffusion region 223 arranged within the first P well region 101, a second P diffusion region 123 and first N diffusion region 221 arranged within the eighth N well 208, and a P conductive type fourth P diffusion region 127 arranged within the ninth N well 209 formed respectively on a P type epitaxial layer 31.

Meanwhile, both of outline configurations of the eighth N well 208 and ninth N well 209 are constituted by a rectangular shape, and outline configurations of the first N diffusion region 221, the second N diffusion region 223, the second P diffusion region 123, and the fourth P diffusion region 127 are substantially constituted by a rectangular shape and each has a irregularity portion on each one boundary side.

Next, positional relationships thereof and if necessary, detailed configurations thereof will be explained. First, the second N diffusion region 223 is arranged between a fifth boundary side 25 constituting a boundary between the eighth N well 208 and the first P well region 101 and a sixth boundary side 26 constituting a boundary between the ninth N well 209 and the first P well region 101 by isolating therefrom and opposing thereto the fifth boundary side 25. Further, the boundary of the second N diffusion region 223 opposing to the fifth boundary side 25 is a straight line shaped straight line side 40, and the boundary on the opposite side of the straight line side 40 constitutes as a first irregularity side 41 having a comb shaped irregularity. In addition, projected portions of the first irregularity side 41 cross the sixth boundary side 26, and constitute N—N overlapped portion overlapped with the ninth N well 209.

Furthermore, the fourth P diffusion region 127 is arranged by opposing to the first irregularity side 41 within the ninth N well 209. In addition, the boundary of the fourth P diffusion region 127 opposing to the first irregularity side 41 constitutes a second irregularity side 42 having a comb shaped irregularity. In addition, the projected portions of the second irregularity side 42 are opposed to the sixth boundary side 26. The second N diffusion region 223 and fourth P diffusion region 127 are arranged by being isolated therefrom and such that one projected portion of the first irregularity side 41 and the second irregularity side 42 being entered into and brought in mesh with other recessed portion thereof.

Furthermore, regarding the boundary between the first N diffusion region 221 and the second P diffusion region 123, respective boundaries opposing to each other constitute a third irregularity side 47 and a fourth irregularity side 48 both having a irregularity shape. Then, the first N diffusion region 221 and the second P diffusion region 123 are arranged by being isolated therefrom and such that one projected portion of the third irregularity side 47 and the fourth irregularity side 48 being entered into and brought in mesh with other recessed portions thereof. Meanwhile, the second P diffusion region 123 is constituted between the first N diffusion region 221 and the second N diffusion region 223.

With above-described constitution and arrangement, the first N diffusion region 221 is connected to a VDD interconnection not shown of an LSI being mounted thereon the ESD protection device 9, the second N diffusion region 223 is connected to a GND interconnection not shown of the LSI being mounted thereon the ESD protection device 9, the second P diffusion region 123 is connected to an external connection electrode (not shown) connecting a protected device, and the fourth P diffusion region 127 is connected to an output end of a first trigger device 15 whose input end is connected to the external connection electrode.

A protecting operation when surge current is applied to the external connection electrode not shown connected thereto the ESD protection device 9 of the present embodiment via the first trigger device 15, fundamentally, similar to a case of the ESD protection device 7 of the seventh embodiment, therefore detailed explanation will be omitted. Meanwhile, in the ESD protection device 9 of the present embodiment, the first N diffusion region 221 and the second P diffusion region 123 are arranged such that respective boundaries opposing to each other constitute irregularity shapes and being brought in mesh with each other, therefore, an impedance of current passage at the time of protective operation that is SCR operation can be further lowered or on condition of the same impedance value, an area of the ESD protection device can be further decreased.

Figure 14A:
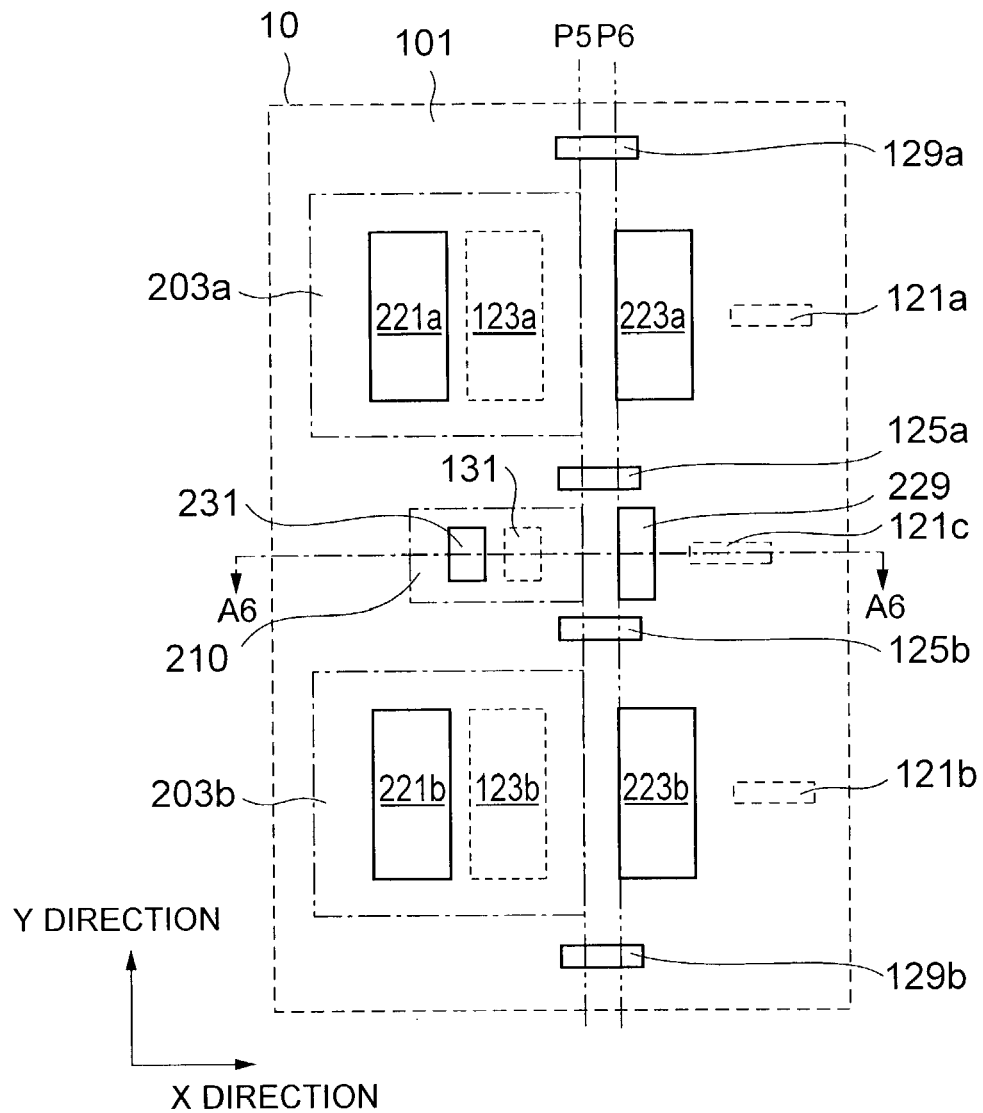
FIG. 14A depicts a view for explaining a ninth embodiment of an ESD protection device of the present invention, and depicts a schematic plan view showing a planar outline configuration thereof.
Figure 14B:
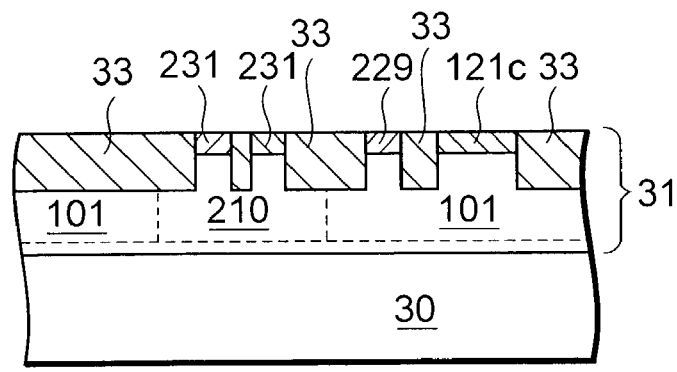
FIG. 14B depicts a view for explaining a ninth embodiment of an ESD protection device of the present invention, and depicts a cross sectional view showing a model of a cross section taken on line A6—A6 of FIG. 14A.

Next, a ninth embodiment of an ESD protection device of the present invention will be explained. FIG. 14A is a view for explaining the ninth embodiment of the ESD protection device of the present invention, and is a schematic plan view showing a planner outline configuration of an ESD protection device 10 in this embodiment. FIG. 14B is a schematic sectional view showing a model of a cross section taken on line A6—A6 of FIG. 14A. Meanwhile, in this embodiment, also similar to the first embodiment, a P+ substrate 30 deposited on a surface thereof with a P type epitaxial layer 31 having a prescribed thickness is used.

Referring to FIG. 14A, an ESD protection device 10 of the present embodiment is provided with a P conductive type first P well region 101, third N wells 203a and 203b and an N conductive type tenth N well 210 being brought into direct contact with and surrounded by the first P well region 101, first P diffusion regions 121a, 121b, and 121c arranged within the first P well region 101, third P diffusion regions 125a and 125b, a P conductive type fifth P diffusion regions 129a and 129b, second N diffusion regions 223a and 223b and an N conductive type fifth N diffusion region 229, and a second P diffusion region 123a and a first N diffusion region 221a arranged within the third N well 203a, a second P diffusion region 123b and a first N diffusion region 221b arranged within the third N well 203b, and a P conductive type sixth P diffusion region 131 and an N conductive type sixth N diffusion region 231 arranged within the tenth N well 210 respectively formed on a P type epitaxial layer 31.

Meanwhile, outline configurations of the first P diffusions 121a, 121b, and 121c, the second P diffusion regions 123a and 123b, the third P diffusion regions 125a and 125b, the fifth P diffusion regions 129a and 129b, the sixth P diffusion region 131, the first N diffusion regions 221a and 221b, the second N diffusion regions 223a and 223b, the fifth N diffusion region 229, the sixth N diffusion region 231, the third N wells 203a and 203b, and the tenth N well 210 are all constituted by a rectangular shape.

Next, positional relationships thereof and if necessary, detailed configurations thereof will be explained. First, the third N well 203a and 203b are arranged in a straight line shape so as to be isolated therefrom and opposed thereto as well as by being constituted respective opposing boundaries in parallel with each other. Further, the tenth N well 210 is arranged between the third N well 203a and the third N well 203b by being isolated therefrom and constituted opposing respective boundaries in parallel with each other.

Furthermore, two directions orthogonal to each other are set as respectively a X direction and Y direction, when the a direction of arranging the third N well 203a and the third N well 203b in the straight line shape is set as Y direction, the second N diffusion region 223a, the first P diffusion region 121a, and the third N well 203a are aligned in the straight line shape in X direction such by being isolated therefrom and constituted so as opposing respective boundaries to be in parallel with each other, the second N diffusion region 223b, the first P diffusion region 121b, and the third N well 203b are aligned in the straight line shape in X direction by being isolated therefrom and constituted so as opposing respective boundaries to be in parallel with each other, and the fifth N diffusion region 229, the first P diffusion region 121c and the tenth N well 210 are aligned in the straight line shape in X direction by being isolated therefrom, and constituted so as opposing respective boundaries to be in parallel with each other.

In that case, the second N diffusion region 223a is arranged between the third N well 203a and the first P diffusion region 121a, the second N diffusion region 223b is arranged between the third N well 203b and the first P diffusion region 121b, and the fifth N diffusion region 229 is arranged between the tenth N well 210 and the first P diffusion region 121c.

In addition, respective boundaries of the third N wells 203a and 203b, and the tenth N well 210 respectively opposing to the second N diffusion regions 223a and 223b, and the fifth N diffusion regions 229 are all overlapped on an imaginary straight line P5 in Y direction. Further, respective boundaries of the second N diffusion regions 223a and 223b, and the fifth N diffusion region 229 respectively opposing to the third N well 203a and 203b, and the tenth N well 210 are all overlapped on an imaginary straight line P6 in Y direction. That is, an interval between the third N well 203a and the second N diffusion region 223a, an interval between the third N well 203b and the second N diffusion region 223b, and an interval between the tenth N well 210 and the fifth N diffusion region 229 are respectively to become equal.

Furthermore, the first N diffusion region 221a and the second P diffusion region 123a are arranged within the third N well 203a by aligning in X direction while the second P diffusion region 123a is set on a side of the second N diffusion region 223a, furthermore, the first N diffusion region 221b and the second P diffusion region 123b are arranged within the third N well 203b by aligning in X direction while the second P diffusion region 123b is set on a side of the second N diffusion region 223b, furthermore, the sixth N diffusion region 231 and the sixth P diffusion region 131 are arranged within the tenth N well 210 by aligning in X direction while the sixth P diffusion region 131 is set on a side of the fifth N diffusion region 229. Meanwhile, size of the tenth N well 210 is sufficiently small compared with the third N wells 203a and 203b.

Positions and sizes in X direction of the third P diffusion regions 125a and 125b and the fifth P diffusion regions 129a and 129b are set such that both of the imaginary straight line P5 and P6 of Y direction are respectively crossing or overlapping with respective boundaries thereof.

Furthermore, regarding the position in Y direction, the third P diffusion region 125a is arranged between a group of the third N well 203a and the second N diffusion region 223a and a group of the tenth N well 210 and the fifth N diffusion region 229 by coming closer to a side of a group of the tenth N well 210 and the fifth N diffusion region 229, furthermore the third P diffusion region 125b is arranged between the group of the third N well 203b and the second N diffusion regions 223b and the group of the tenth N well 210 and the fifth N diffusion region 229 by coming closer to the side of the group of the tenth N well 210 and the fifth N diffusion region 229.

Furthermore, the fifth P diffusion region 129a is arranged by sandwiching the group of the third N well 203a and the second N diffusion region 223a with the third P diffusion region 125a by setting on an opposite side thereof, and the fifth P diffusion region 129b is arranged by sandwiching the group of the third N well 203b and the second N diffusion region 223b with the third P diffusion region 125b by setting on an opposite side thereof.

With above-described constitution and arrangement, the first N diffusion regions 221a and 221b and the sixth N diffusion region 231 are all connected to a VDD interconnection not shown of a LSI being mounted thereon the ESD protection device 10. In addition, the second N diffusion regions 223a and 223b and the first P diffusion regions 121a, 121b, 121c, and 121d are all connected to a GND interconnection not shown of a LSI being mounted thereon the ESD protection device 10. Both of the second P diffusion regions 123a and 123b and the sixth P diffusion region 131 are connected to an external connection electrode (not shown) connecting to an protected device, the third P diffusion regions 125a and 125b are all connected to an output end of a first trigger device (not shown) connected input end thereof to the external connection electrode, and the fifth N diffusion region 229 is connected to respective the fifth P diffusion region 129a and the fifth P diffusion region 129b.

Next, a protective operation when surge current is applied to the external connection electrode not shown connected thereto the ESD protection device 10 of the present embodiment via the first trigger device will be explained. The ESD protection device 10 of the present embodiment, as it is understood from the above-described description, is constituted by providing a small sized SCR structure constructed of the sixth P diffusion region 131, the tenth N well 210, the first P well region 101 and the fifth N diffusion region 229 and a large sized SCR structure respectively constructed of the second P diffusion region 123a, the third N well 203a, the first P well region 101 and the second N diffusion region 223a and the second P diffusion region 123b, the third N well 203b, and the first P well region 101 and the second N diffusion region 223b. Accordingly, the ESD protection device 10 has a preferable constitution when as the first trigger device for example such as FET a device with comparatively a small current drive capability is used.

When the surge current is applied to the external connection electrode, first the trigger current is injected into the third P diffusion regions 125a and 125b. The third P diffusion regions 125a and 125b are arranged with the small sized SCR structure, and the injected trigger current can efficiently increase voltage of the first P well region 101 surrounded by the third P diffusion regions 125a and 125b, the tenth N well 210 and the fifth N diffusion region 229. As the result, a SCR operation constituting the sixth P diffusion region 131 and the fifth N diffusion region 229 respectively as an anode and cathode can be started at high speed. Then, since the fifth N diffusion region 229 is connected to the fifth P diffusion region 129a and the fifth P diffusion region 129b, the sufficient current starts to be injected at high speed from the fifth N diffusion region 229 to the fifth P diffusion region 129a and the fifth P diffusion region 129b, and the large sized SCR structure portion starts the SCR operation.

Namely, the ESD protection device 10 of the present embodiment, even when the first trigger device is the device with small driving capability such as FET, by using this as a primary trigger, when it is devised that first the SCR operation is started at high speed to the small sized SCR structure portion, then the trigger current is supplied from the small sized SCR structure portion to the large sized SCR structure portion, since even the small sized SCR structure, a resistance value at the time of conductive state is low, therefore, large current can be supplied and overshoot of the voltage can be reduced.

Next, regarding a method of manufacturing an ESD protection device of the present invention, as an example, a case of an ESD protection device 5 will briefly be described. From FIGS. 15A to 15D and FIG. 16 are views for explaining the method of manufacturing, and sectional views for respective main process showing a model of a section taken on line A4—A4 of FIG. 9A. Meanwhile, main size of the ESD protection device 5, is the width in Y direction of a second P diffusion region 123 and a second N diffusion region 223, that is a length of the third boundary side 23 is set as W=60 μm, an interval between the second P diffusion region 123 and a boundary of a fourth N well 204 opposing to X direction is set as dwa=0.5 μm, and the interval between the third boundary side 23 and the boundary of the fourth N well 204 opposing to the second P diffusion region 123 in X direction is set as dwc=0.4 μm. However, the drawings above-described dimensions are shown by expanding pertinently without no relation with actual dimensions in order for a person to make easily understandable.

Figure 15A:
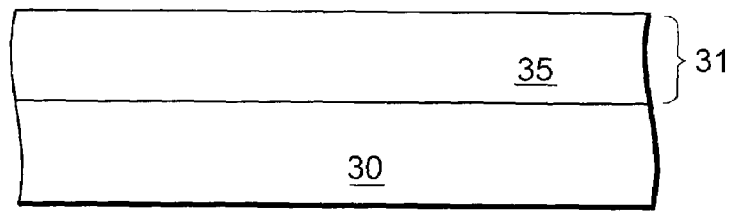
FIG. 15A depicts a view for explaining a method of manufacturing an ESD protection device of the present invention.

First, a substrate deposited thereon a P type epitaxial layer 31 having a thickness 4 μm on a surface of P+ substrate 30 of low resistance (specific resistance is about 7 Ω·cm) as a semiconductor substrate is prepared (FIG. 15A).

Figure 15B:
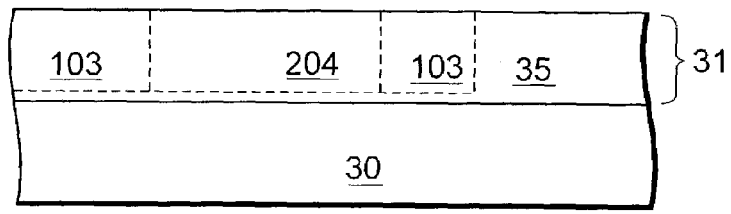
FIG. 15B, continues to processes of FIG. 15A, and depicts a view for explaining a method of manufacturing an ESD protection device of the present invention.

Next, for example, by ion implantation technique, a third P well region 103 and a fourth N well 204 are respectively formed. For example boron (B) is implanted about $5 \times 10^{18}$ $cm^{-3}$ in the third P well region 103, and for example phosphorus (P) is implanted about $5 \times 10^{18}$ $cm^{-3}$ in the fourth N well 204 (FIG. 15B).

Figure 15C:
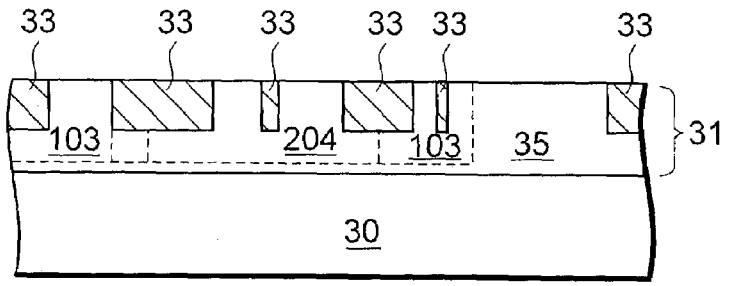
FIG. 15C, continues to processes of FIG. 15B, and depicts a view for explaining a method of manufacturing an ESD protection device of the present invention.

Next, an isolation region 33 for defining a prescribed device region is formed by using, for example, a trench isolation technique (FIG. 15C).

Figure 15D:
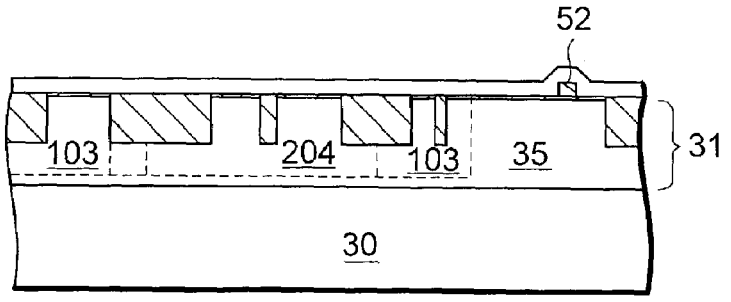
FIG. 15D, continues to processes of FIG. 15C, and depicts a view for explaining a method of manufacturing an ESD protection device of the present invention.

Next, a gate insulating film glows, further for example polycrystalline silicone and others constituting a gate electrode are deposited then process by patterning, and a gate region 52 is formed (FIG. 15D).

Figure 16A:
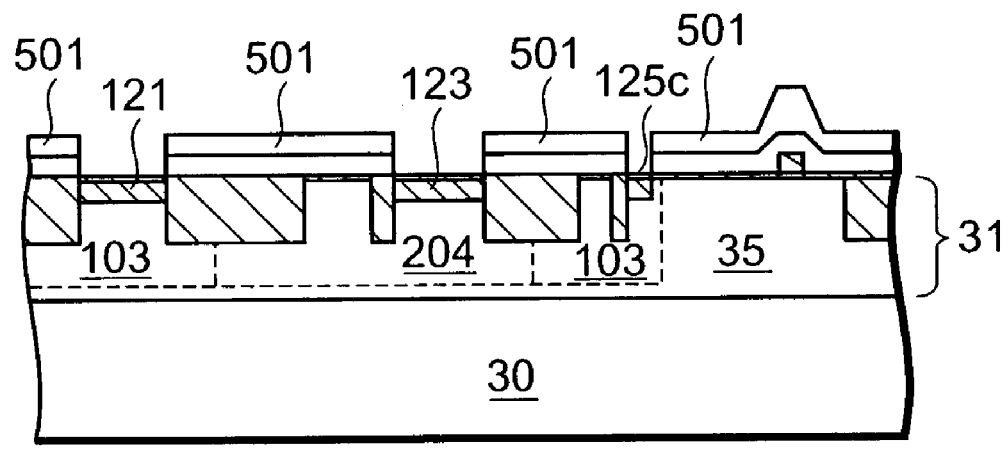
FIG. 16A, continues to processes of FIG. 15D, and depicts a view for explaining a method of manufacturing an ESD protection device of the present invention.

Next, a region except the desired region is covered by a photo resist (hereinafter, referred to as PR) 501 and others, and a prescribed P diffusion region including a first P diffusion region 121, a second P diffusion region 123, and a third P diffusion region 125c are formed by implanting for example B about $1\times10^{20}$ cm$^{-3}$ by the ion implantation technique (FIG. 16A).

Figure 16B:
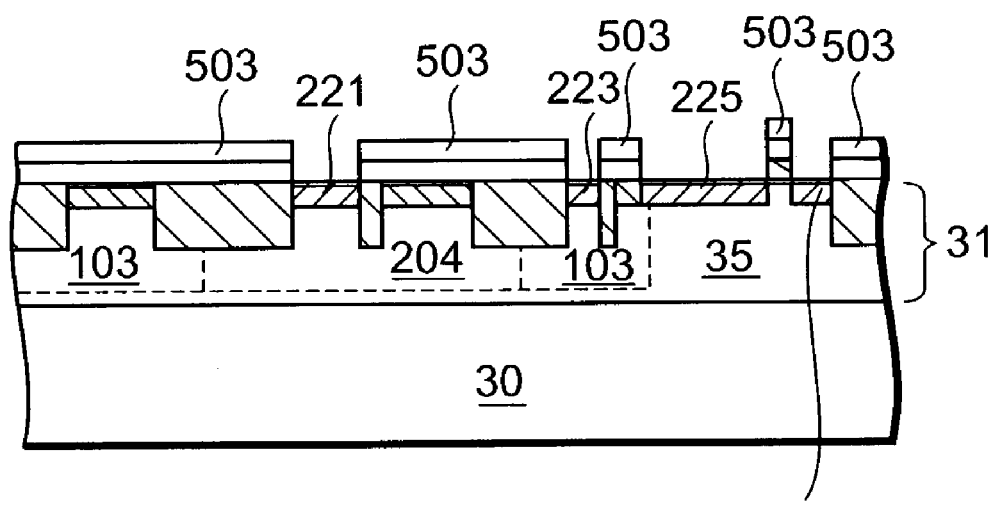
FIG. 16B, continues to processes of FIG. 16A, and depicts a view for explaining a method of manufacturing an ESD protection device of the present invention.

Next, the region except the desired region is covered by the photo resist (hereinafter, referred to as PR) 502 and others, and a prescribed N diffusion region including a first N diffusion region 221, a second N diffusion region 223, a third N diffusion region 225, and a fourth N diffusion region 227 are formed by implanting for example As about $1\times10^{20}$ cm$^{-3}$ by the ion implantation technique (FIG. 16B).

Thereafter, by a well known method, contact holes are opened in prescribed regions, and a prescribed interconnection may well be formed, if necessary, by making interconnection into a multilayer, therefore, description will be omitted.

Furthermore, a trigger device, although not restricted particularly, several constitution examples will be shown from FIGS. 17A to 17D. FIG. 17A and FIG. 17B are examples of a first trigger device, and FIG. 17C and FIG. 17D are examples of a second trigger device. The numbers of diode k may be determined according to trigger voltage.

Furthermore, connection examples of the ESD protection device of the present invention to an external connection electrode are shown in FIG. 18A and FIG. 18B. An ESD protection device (1, 2, 3, 4, 6, 7, 9, or 10) described in the above embodiment constitute a connection structure replaced a first ESD protection device of FIG. 18A, an ESD protection device 8 constitutes a connection structure replaced a second ESD protection device of FIG. 18B. Furthermore, the ESD protection device 5 constitutes a connection structure replaced the first ESD protection device and the first trigger device of FIG. 18A.

Meanwhile, the present invention is not restricted to the description of the above embodiment, variously capable of changing in a scope of specification. For example, as an external connection electrode connecting the ESD protection device of the present invention may be either an electrode for a signal input, an electrode for a signal output, or an electrode for an electric source. Furthermore, a specific resistance of a P+ substrate 30, a thickness or impurity concentration of a P type epitaxial layer, an impurity concentration of respective P diffusion regions and N diffusion regions and others may pertinently be determined according to characteristics of LSI, applied manufacturing technique, necessary ESD durability and others.

Meanwhile, in the above respective embodiment, examples where a first N diffusion region and a second P diffusion region or a sixth N diffusion and a fifth P diffusion region are arranged by being isolated therefrom are explained, however, these may be arranged by being brought into direct contact with respective boundaries opposed to each other.

As described above, an ESD protection device of the present invention and an LSI having the ESD protection device, even if a surge current by the static electricity is applied to an external connection electrode, a SCR operation of the ESD protection device is turned on in a very short period of time, for circuit devices of inside the LSI a safe and low resistance discharge passage is formed, thereby capable of discharging static electricity discharge current pulses. Accordingly, by restraining overshoot of voltage of the corresponding external connection electrode as low as possible, an effect capable of protecting the LSI can be obtained.

Figure 20:
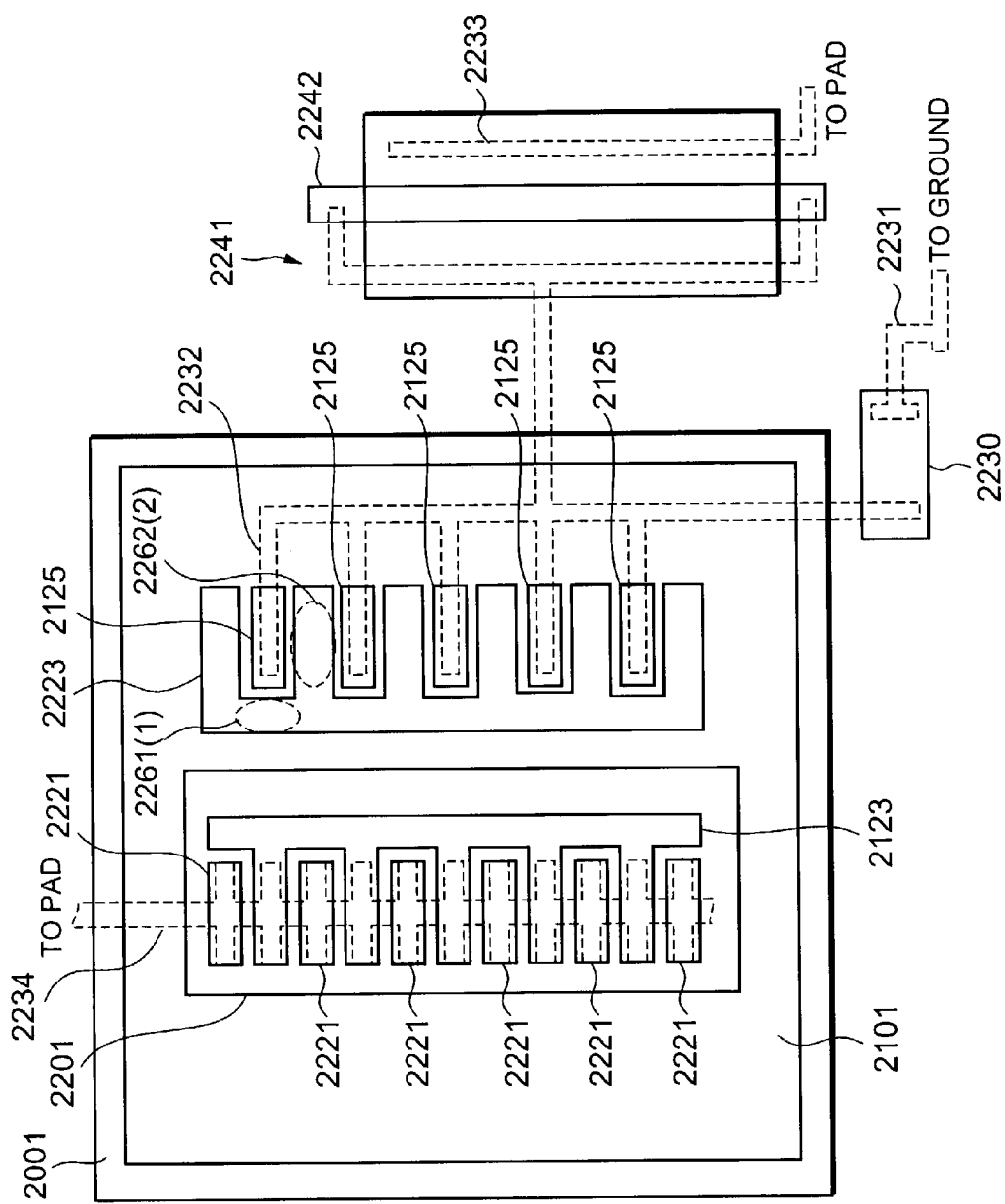
FIG. 20 depicts a view for explaining a tenth embodiment of an ESD protection device of the present invention, and depicts a schematic plan view showing a planar outline configuration thereof.
Figure 21:
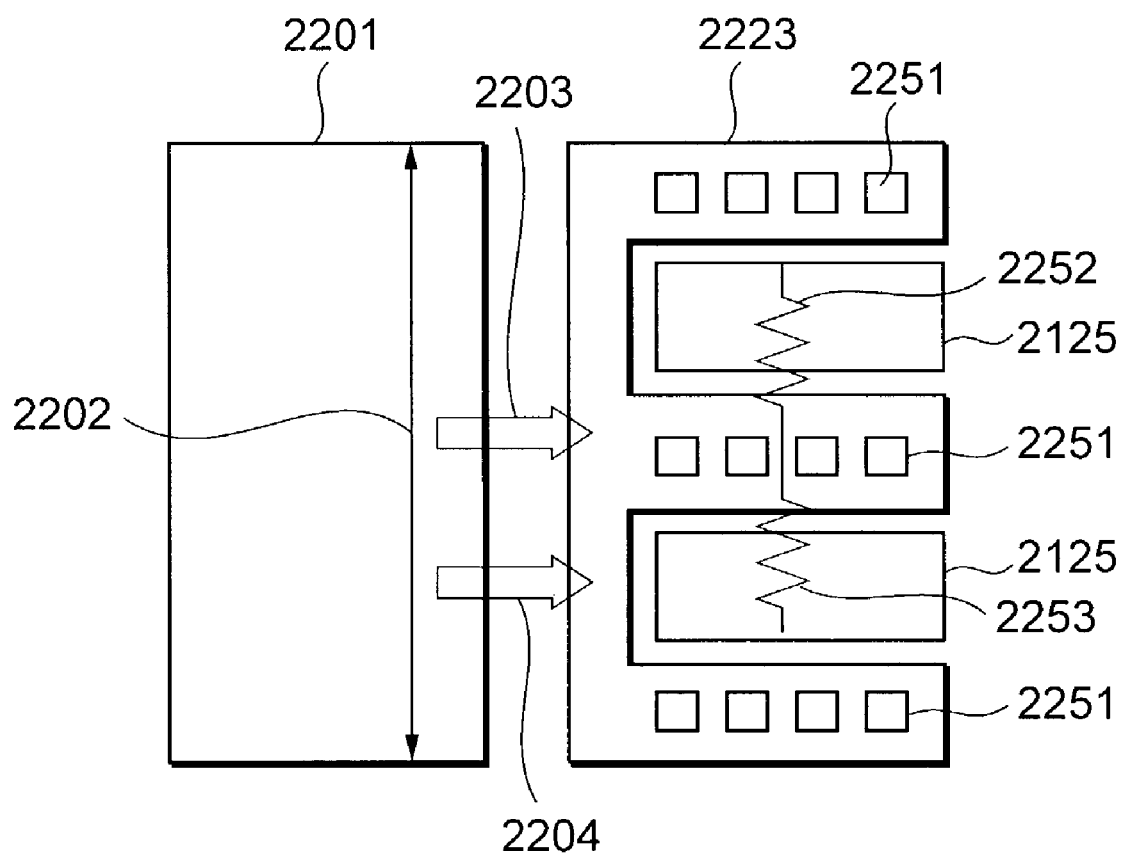
FIG. 21 depicts a view for explaining an operation of a tenth embodiment of an ESD protection device of the present invention.

Next, a tenth embodiment of an ESD protection device of the present invention will be explained. FIG. 20 depicts a schematic plan view showing a planner outline configuration of the tenth embodiment of the ESD protection device of the present invention.

Referring to FIG. 20, now, an ESD protection device 11 of the present embodiment is provided with a first P well region 2101, second P diffusion regions 2123 (an anode electrode), a third P diffusion region 2125 (a trigger tap electrode), N conductive type third N wells 2201 peripheries thereof being respectively surrounded by a first P well region 2001, first N diffusion regions 2221, and a second N diffusion region (a cathode electrode) 2223 and all are formed on a P type substrate (not shown).

Meanwhile, outline configurations of the second P diffusion regions 2123, the third P diffusion region (a trigger electrode) 2125, the third N well 2201, the first N diffusion regions 2221, are all constituted by a rectangular shape and outline configurations of the second N diffusion region 2223 is constituted by a comb shape.

All of, the third P diffusion region 2125, and the second N diffusion region 2223 are arranged within the first P well region 2101, the second P diffusion region 2123 and the first N diffusion region 2221 are arranged within the third N well 2201.

The third P diffusion region 2125 is arranged being respectively surrounded by the second N diffusion region 2223 with being isolated from, and in proximity to the second N diffusion region 2223. However the third P diffusion region 2125 never comes closer to the side of the second N diffusion region 2223.

The first N diffusion region 2221 and the second P diffusion region 2123 are arranged side by side in X direction such that the second P diffusion region 2123 comes closer to the second N diffusion region 2223 within the third N well 2201, the first N diffusion region 2221 is arranged by lining up in X direction such that the second P diffusion region 2123 comes closer to the second N diffusion region 2223 similarly within the third N well 2201.

Furthermore, the first N diffusion regions 2221 is connected to a VDD interconnection not shown of an LSI mounted ESD protection device 11 thereon, the second N diffusion region 2223 is connected to a GND interconnection not shown of the LSI mounted the ESD protection device 11 thereon, the second P diffusion regions 2123 is connected to an external connection electrode (not shown) connecting to a protected device, and the third P diffusion region 2125 is connected to an output end of a N-MOS transistor trigger device 2241.

Furthermore, the input end of the N-MOS transistor trigger device 2241 is connected to the external connection electrode connecting to the protected device. Meanwhile, in the ESD protection device 11 of the present embodiment, protect operation when the surge current being applied is similar to the ESD protection device 1 of the first embodiment, therefore detailed explanation will be omitted.

In the ESD protection device 11 of the present embodiment, as shown in FIG. 20, the third P diffusion region 2125 constituting a trigger-tap electrode for supplying a trigger current is arranged in the third N well 2201. Accordingly, since it is possible to spread the trigger current on an entire wall surface of regions in the third N well 2201 functioning as a base region of a horizontal type NPNTr at the time of SCR operation, a trigger phenomenon can be produced uniformly over an entire body of the ESD protection device 11 at the time of protecting operation, and voltage of the external connection electrode connecting to the protected device can be clamped at high speed and at low voltage.

Meanwhile, in this embodiment, also similar to the first embodiment, a P+ substrate 30 deposited on a surface thereof with a P type epitaxial layer 31 having a prescribed thickness also can be used, and illustration of a sectional shape thereof will be omitted. (If necessary, FIG. 5A, FIG. 5B will be referenced.)

However, in the ESD protection device 11 of the present embodiment, as shown in FIG. 20, the P diffusion region 2125 constituting a trigger-tap electrode for supplying a trigger current is arranged in the third N well 2201. And the third P diffusion region 2125 is connected to a drein electrode of a N-MOS transistor trigger device 2241. Furthermore, a source electrode of the N-MOS transistor trigger device 2241 is connected to GND potential.

HHI-SCR controls the holding current by external resistor, and provides a trigger current P+ diffusion region. Consequently, a PN diode consisted between the cathode electrode and the anode electrode is not able to turn on. And, more trigger current needs to turn the PN diode on that is a current drive capability of a N-MOS transistor is more needed. HHI-SCR has a disadvantage regarding a chip area in the device.

Now, a first modified example of a tenth embodiment of an ESD protection device of the present invention improve above-mentioned problems. Referring FIG. 22, a first modified example is explained as following.

Figure 22:
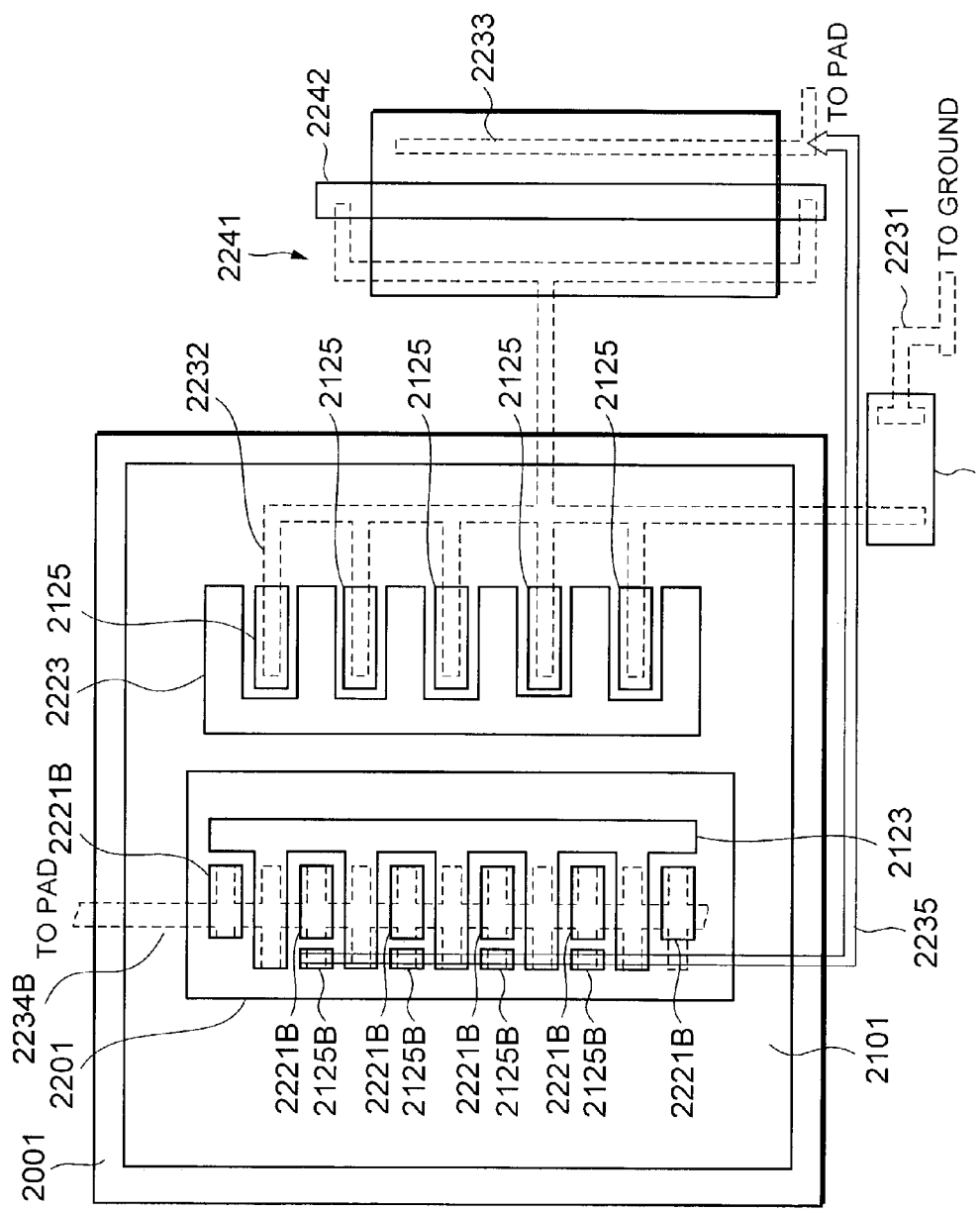
FIG. 22 depicts a view for explaining a first modification of tenth embodiment of an ESD protection device of the present invention, and depicts a schematic plan view showing a planar outline configuration thereof.

As shown in FIG. 22, a first modified example of a tenth embodiment of an ESD protection device of the present invention comprises a first P well region 2101, second P diffusion regions 2123 (an anode electrode), a third P diffusion region 2125 (a trigger tap electrode), N conductive type third N wells 2201 peripheries thereof being respectively surrounded by a first P well region 2001, first N diffusion regions 2221, and a second N diffusion region (a cathode electrode) 2223 and all are formed on a P type substrate (not shown).

Furthemor the first modified example of a tenth embodiment of an ESD protection device of the present invention comprises a substrate control electrode and a N-well electrode for control of substrate, which are alternately located like comb-shape so as to make up the difference of resistance of both electrode. the first N diffusion regions 2221 are arranged within the third N well 2201. A first modified example divide at least one of the first N diffusion region 2221 to an N diffusion region 2221B and an N diffusion region 2125B. The N diffusion region 2125B is connected to an output end of a N-MOS trigger transistor device 2241.

A P.sup.− substrate having high resistibity is suitable to form the ESD protection device 11 of the present embodiment therein. A P.sup.+ diffusion layer for control of substrate resistance is connected to GND through a series poly-silicon resistor 2230.

The series poly-silicon resistor 2230 controls a holding voltage of SCR. The ESD protection device 11 of the present embodiment has an advantage of a length surrounding an anode electrode or cathode electrode from the viewpoint of substrate resistance and well resistance.

Meanwhile, an HHI-SCR is configured to divide a cathode into a number of sub-cathodes to reduce the resistance of substrate.

Accordingly, when dividing the anode and the cathode into a number of sub-anodes and sub-cathodes, the corners of sub-anodes and sub-cathodes are rounded in the steps of exposure and etching and the profile of sub-anodes and sub-cathodes is difficult to control.

According to the ESD protection device 11 of the present embodiment, anode and cathode are divided into fine sub-anodes and sub-cathodes and the width in the diffusion layers are divided into fine width having only one contact hole therein.

The ESD protection device 11 of the present invention does not make the corners of P-diffusion layer (connection portion (2261)) and P-diffusion layer is not rounded in the steps of exposure and etching. Therefore, the ESD protection device 11 of the present invention need not have contact hole in P-diffusion layer.

A current of the ESD protection device 11 is predicted to follow in a range 0.5 micron meter from the edge of N-well 2201 by the device simulator. That is, the current of the ESD protection device 11 follows in non contact hole area (connection portion (2261)),and is absorbed to electrode 2223 in contact hole area (connection portion (2262)) via siliside layer in the surface of the diffusion layer.

A current distribution of the ESD protection device 11 is in consideration to follow in a portion of high resistance in a silicon substrate. The resistance in a silicon substrate is decided on the configuration of the diffusion layer, whether a silicon substrate resistance is lower in non contact hole area (connection portion (2261)), or in contact hole area (connection portion (2262)).

A size of the anode electrode and a size of the cathode electrode are freely changeable in order to have a predetermined resistor value. A size of the N-well contact layer and a size of the P.sup. diffusion layer for control of substrate are also freely changeable in order to have a predetermined substrate resistor value. Therefore, a predetermined substrate resistor value depends on the current path in non contact hole area (connection portion (2261)), and in contact hole area (connection portion (2262)). The holding current of the SCR is fixed by a higher substrate resistor value in non contact hole area (connection portion (2261)), or in contact hole area (connection portion (2262)). Consequently, some problems obviously occur in the ESD protection device 11 of the present embodiment regarding to the depend of the layout design, or difficulty of SCR designing.

Now, a second modified example of a tenth embodiment of an ESD protection device of the present invention improves above-mentioned problems.

The second modified example improves a dependence of a layout of the both electrode. Referring FIG. 23, a second modified example is explained as following.

Figure 23:
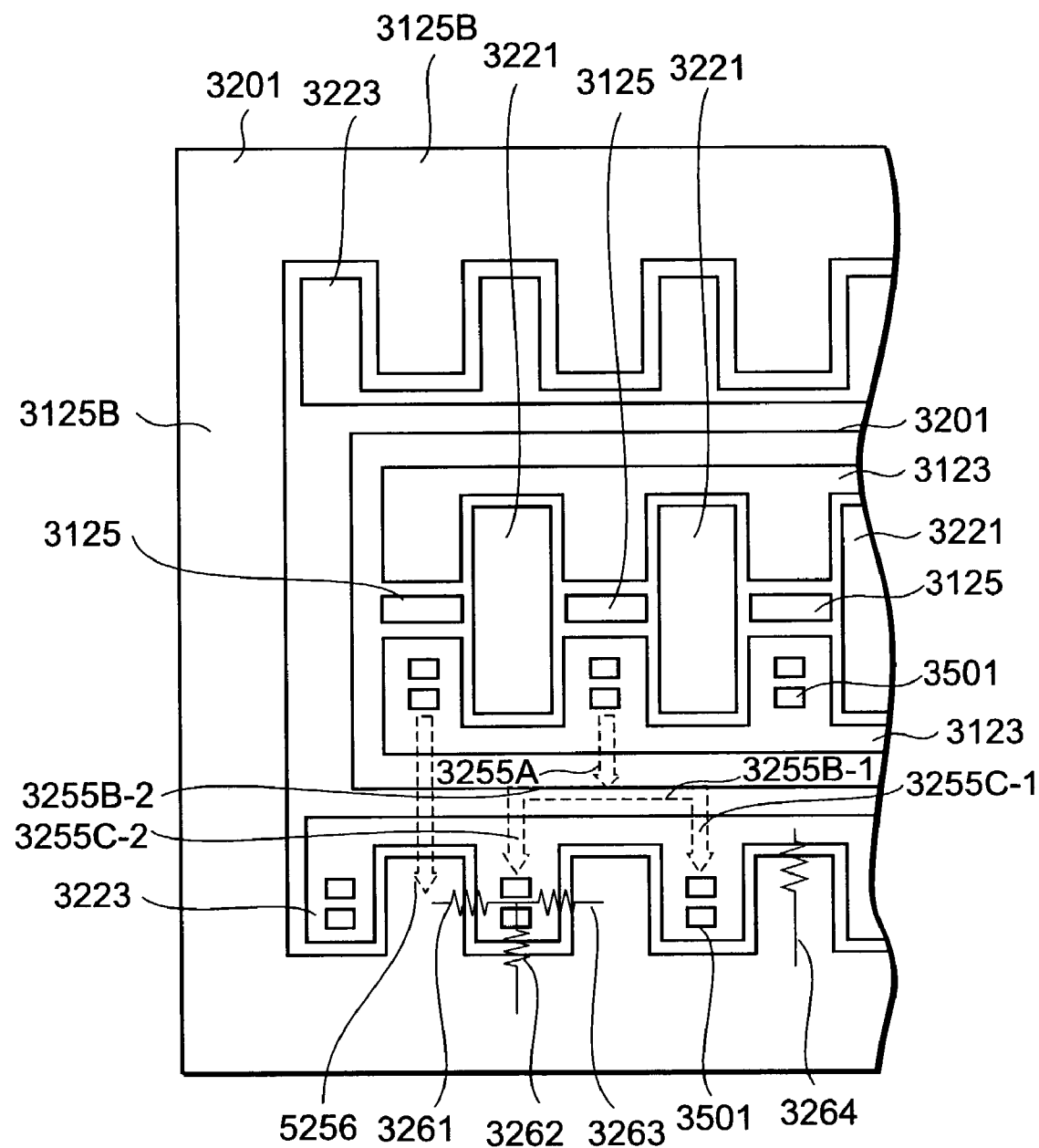
FIG. 23 depicts a view for explaining a second modification of tenth embodiment of an ESD protection device of the present invention, and depicts a schematic plan view showing a planar outline configuration thereof.

FIG. 23 depicts a schematic plan view showing a planner outline configuration of the second modified example of the tenth embodiment of the ESD protection device of the present invention.

Referring to FIG. 23, now, an ESD protection device 13 of the present embodiment is provided with a first P well region (not shown), second P diffusion regions 3123 (an anode electrode), a third P diffusion region 3125 (a trigger tap electrode), a P+ diffusion region 3125B (a controled electrode for controlling subslate current), N conductive type third N wells 3201 peripheries thereof being respectively surrounded by a first P well region (not shown), first N diffusion regions 3221, and a second N diffusion region (a cathode electrode) 3223 and all are formed on a P type substrate (not shown).

Meanwhile, outline configurations of the third P diffusion region (a trigger electrode) 3125, the third N well 3201, the first N diffusion regions 3221 (N-well contact region), are all constituted by a rectangular shape. And outline configurations of the second N diffusion region (a cathode electrode) 3223, the second P diffusion regions (an anode electrode)

3123, the P+ diffusion region 3125B (a controled electrode for controlling subslate current) are constituted by a comb shape.

Futhermore, the P+ diffusion region 3125B (a controled electrode for controlling subslate current) and the N diffusion region (a cathode electrode) 2223 are altenatly constituted by a comb shape. Likewise, P diffusion regions (an anode electrode) 3123 and the P diffusion region (a trigger electrode) 3125 are altenatly constituted by a comb shape.

A plurality of contact holes 3501 are placed within P diffusion regions (an anode electrode) 3123 and, also, are placed within the N diffusion region (a cathode electrode) 2223.

As shown in FIG. 23, an ESD protection device 13 of the present embodiment has the P+ diffusion region 3125B (a controled electrode for controlling subslate current) at a outer bailey of the ESD protection device 13.

The SCR hole curent of the ESD protection device 13 fllows from P diffusion regions (an anode electrode) 3123 indicated by arrows (3255A), and splits flow indicated by arrows (3255B-1 to 3255C-1), (3255B-2 to 3255C-2). The SCR electron [electronic] current of the ESD protection device 13 fllows from P diffusion regions (an anode electrode) 3123 indicated by arrows (5256).

Meanwhile, in the second modified example of the tenth embodiment, also similar to the first embodiment, a P+ substrate 30 deposited on a surface thereof with a P type epitaxial layer 31 having a prescribed thickness also can be used, and illustration of a sectional shape thereof will be omitted. (If necessary, FIG. 5A, FIG. 5B will be referenced.)

Figure 24:
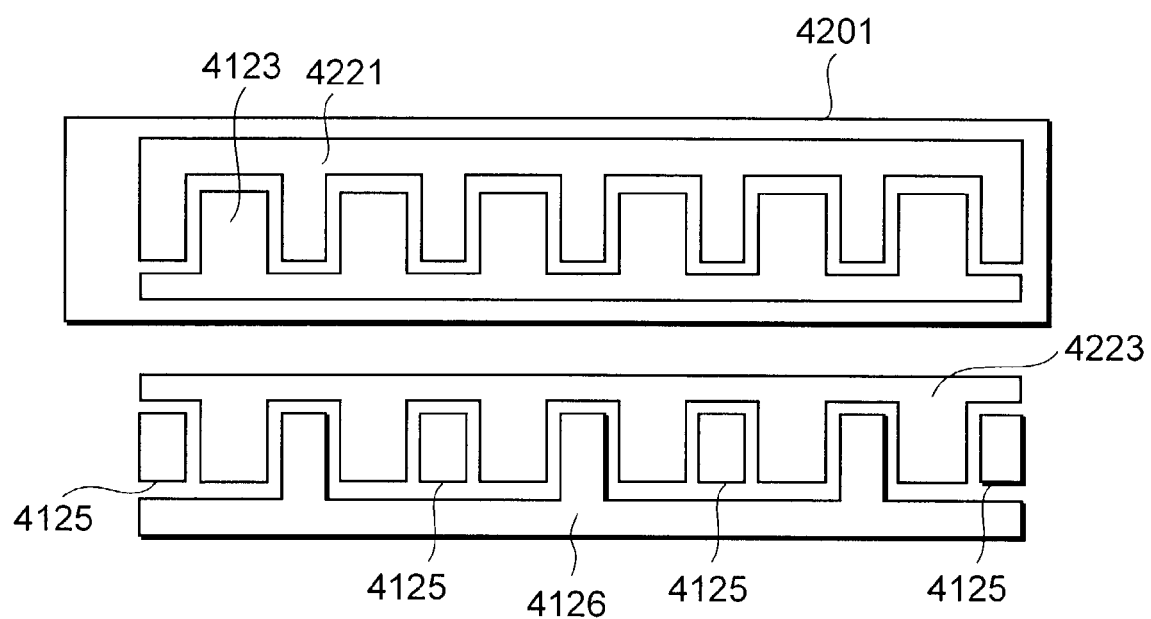
FIG. 24 depicts a view for explaining a third modification of tenth embodiment of an ESD protection device of the present invention, and depicts a schematic plan view showing a planar outline configuration thereof.

Next, referring FIG. 24, a third modified example is explained. Referring FIG. 24, a third modified example comprises a first P well region (not shown), second P diffusion regions 4123 (an anode electrode), a third P diffusion region 4125 (a trigger tap electrode), N conductive type third N wells 4201 peripheries thereof being respectively surrounded by a first P well region, first N diffusion regions 4221, and a second N diffusion region (a cathode electrode) 4223 and all are formed on a P type substrate (not shown).

Outline configurations of the P+ diffusion region (a trigger electrode) 4125 is constituted by a rectangular shape. And outline configurations of the second N diffusion region (a cathode electrode) 4223, the second P diffusion regions (an anode electrode) 4123, the P+ diffusion region 4126 (a controled electrode for controlling subslate current) are constituted by a comb shape.

Futhermore, the P+ diffusion region (a trigger electrode) 4125 is closly placed the second N diffusion region (a cathode electrode) 4223.

Figure 25:
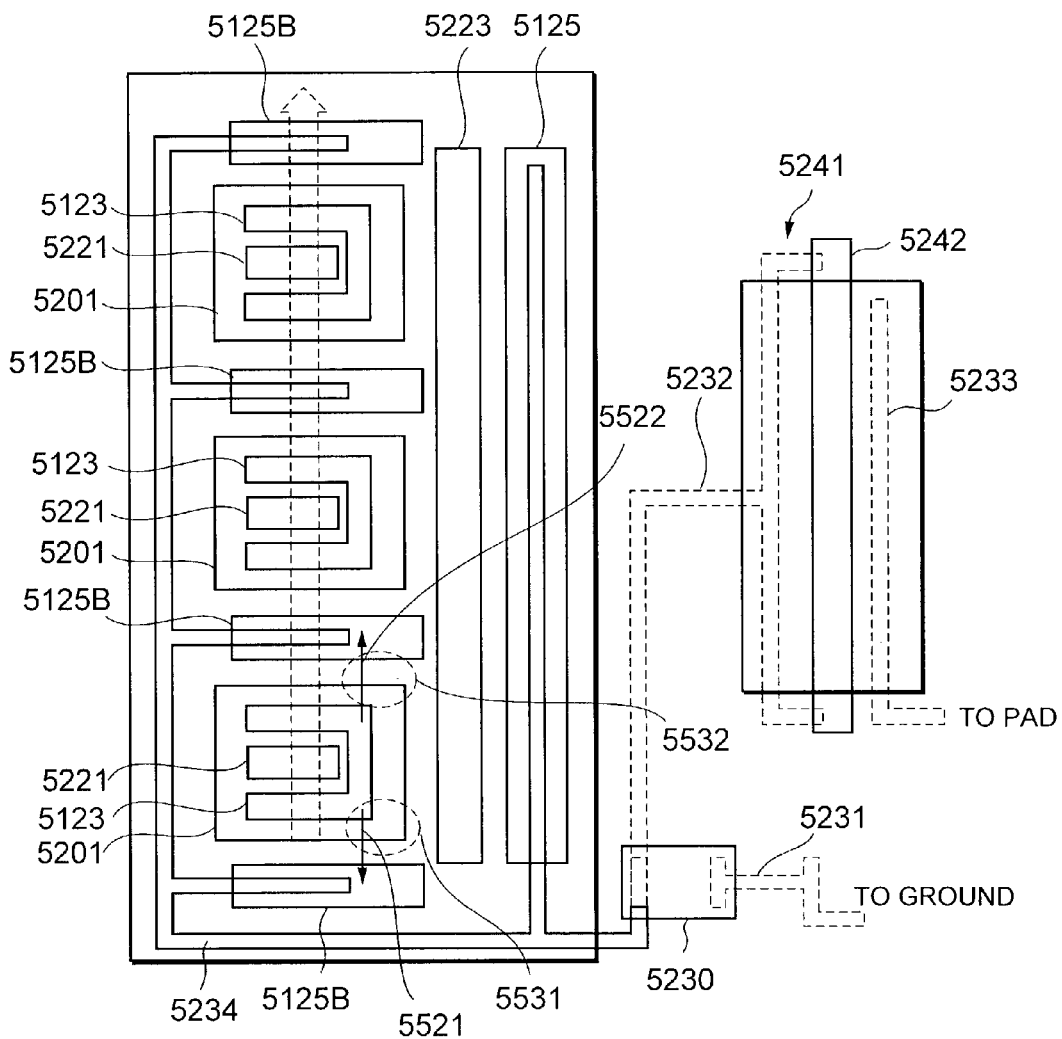
FIG. 25 depicts a view for explaining an eleventh embodiment of an ESD protection device of the present invention, and depicts a schematic plan view showing a planar outline configuration thereof.

Next, a eleventh embodiment of an ESD protection device of the present invention will be explained. FIG. 25 depicts a schematic plan view showing a planner outline configuration of the tenth embodiment of the ESD protection device of the present invention.

Referring to FIG. 25, now, an ESD protection device 15 of the present embodiment is provided with a first P well region 5001, a second P diffusion regions 5123 (an anode electrode), a third P diffusion region 5125 (a trigger tap electrode), a P+ diffusion region 5125B (a controled electrode for controlling subslate current), N conductive type third N wells 5201 peripheries thereof being respectively surrounded by a first P well region 5001, first N diffusion regions 5221, and a second N diffusion region (a cathode electrode) 5223 and all are formed on a P type substrate (not shown).

Meanwhile, outline configurations of the N well 5201, the third P diffusion region (a trigger electrode) 2125, a second N diffusion region (a cathode electrode) 5223, the first N diffusion regions 5221, are all constituted by a rectangular shape. And outline configurations of the second P diffusion regions 5123 (an anode electrode) is constituted by a comb shape surrounding with N diffusion regions 5221.

The P+ diffusion region 5125B (a controled electrode for controlling subslate current) are placed between one of the N well 5201 and another N well 5201. Consequently, the silicon substrate current (5521, 5522) from vertical PNP transistor (hole current) passes through the P+ diffusion region 5125B (a controled electrode for controlling subslate current).

Figure 26:
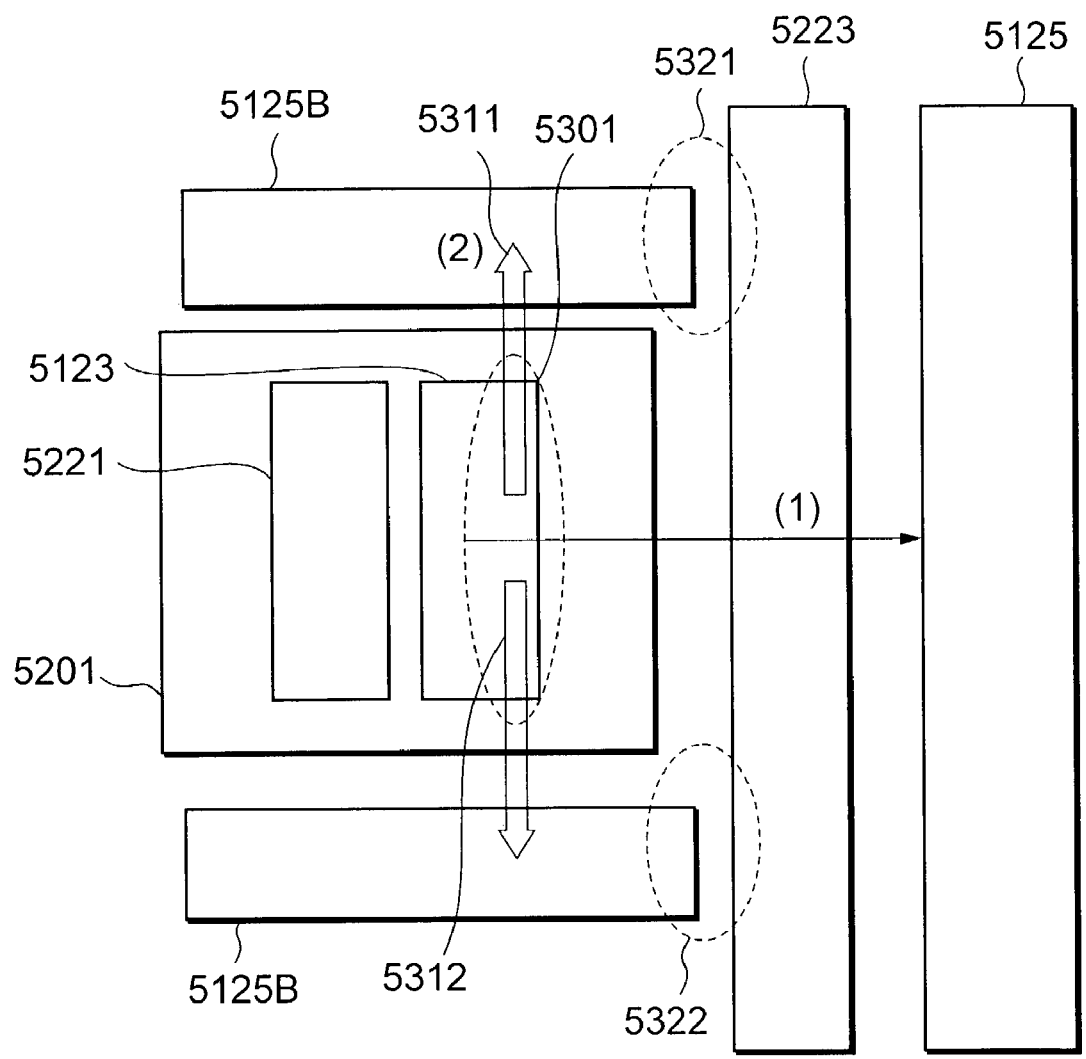
FIG. 26 depicts a view for explaining an operation of an eleventh embodiment of an ESD protection device of the present invention.

As shown FIG. 26, according to the silicon substrate current (5311, 5312), SCR curent can uniformly flow in regions (5321, 5322).

Figure 27:
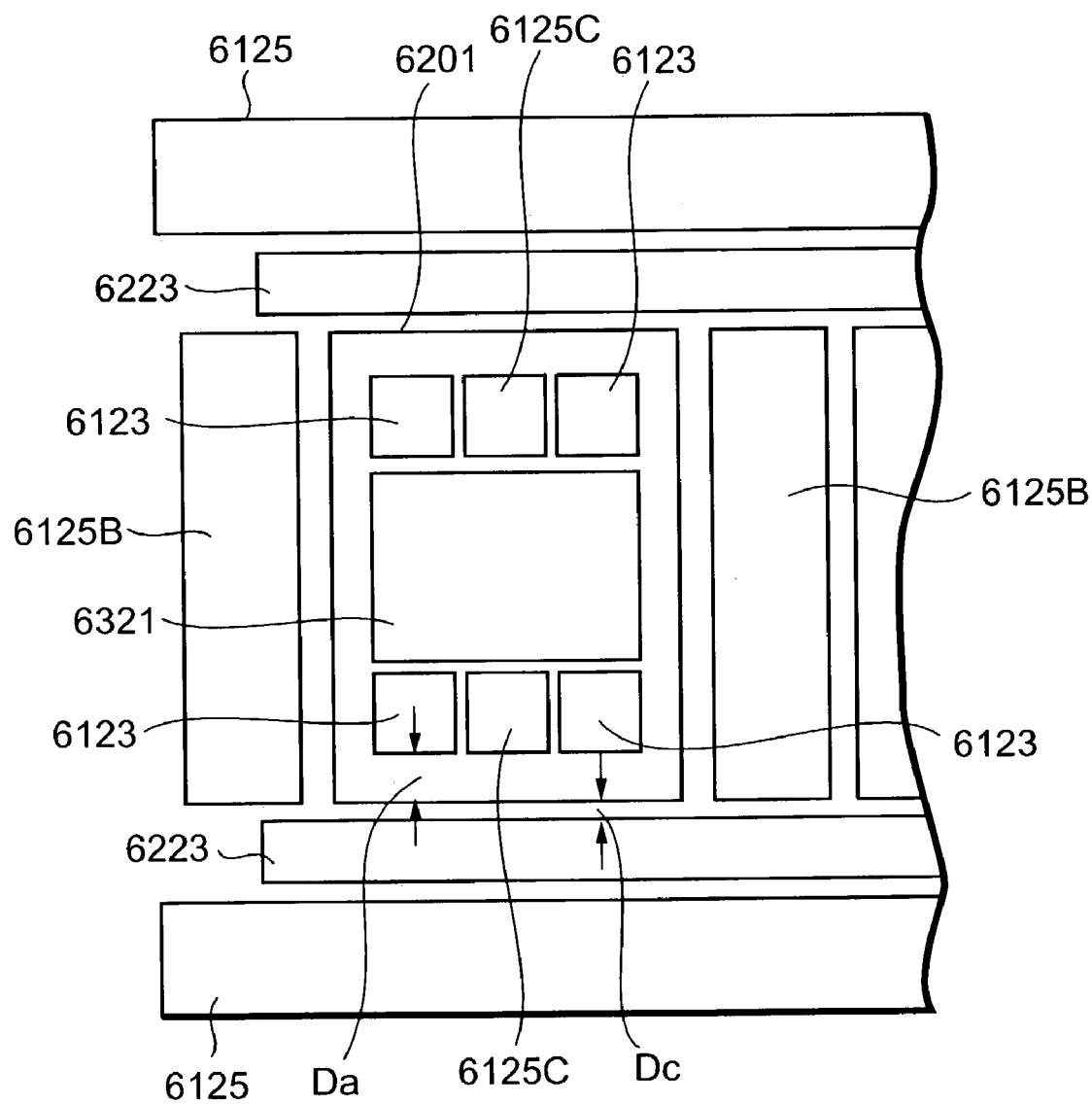
FIG. 27 depicts a view for explaining a first modification of an eleventh embodiment of an ESD protection device of the present invention, and depicts a schematic plan view showing a planar outline configuration thereof.

Next, Referring to FIG. 27, now, a first modified example of a eleventh embodiment of an ESD protection device 16 of the present embodiment is provided with a first P well region (not shown), second P diffusion regions 6123 (an anode electrode), a third P diffusion region 6125C (a trigger tap electrode), a P+ diffusion region ((6125, 6125B) (a controled electrode for controlling subslate current)), N conductive type third N wells 6201 peripheries thereof being respectively surrounded by a first P well region (not shown), first N diffusion regions 6221, and a second N diffusion region (a cathode electrode) 6223 and all are formed on a P type substrae.

Meanwhile, outline configurations of the third P diffusion region (a trigger electrode) 6125C, the third N well 6201, the first N diffusion regions 6221 (N-well contact region), the P+ diffusion region ((6125, 6125B) (a controled electrode for controlling subslate current)), the second N diffusion region (a cathode electrode) 6223, the second P diffusion regions (an anode electrode) 6123, are all constituted by a rectangular shape.

Futhermore, the P+ diffusion region 6125B (a controled electrode for controlling subslate current) is replaced near the third N well 6201, and the P+ diffusion region 6125 (a controled electrode for controlling subslate current) is replaced nearby the second N diffusion region (a cathode electrode) 6223.

Consequently, the silicon substrate current from the second P diffusion regions (an anode electrode) 6123 to the P+ diffusion region 6125B (a controled electrode for controlling subslate current).

Figure 28A:
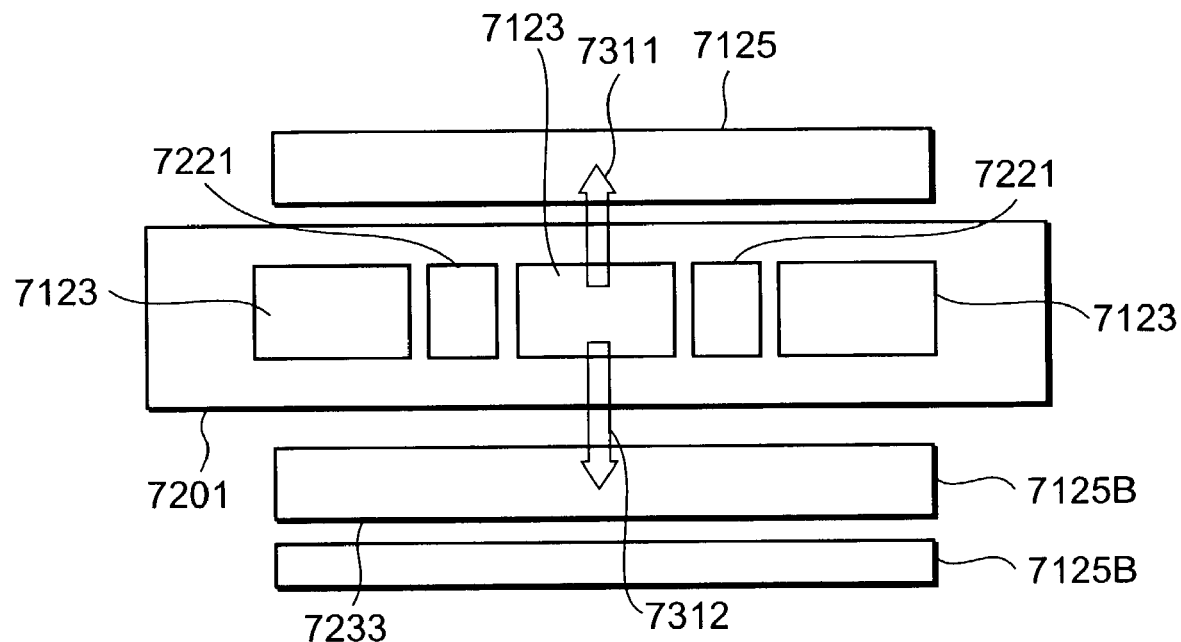
FIG. 28A depicts a view for explaining a second modification of an eleventh embodiment of an ESD protection device of the present invention, and depicts a schematic plan view showing a planar outline configuration thereof.
Figure 28B:
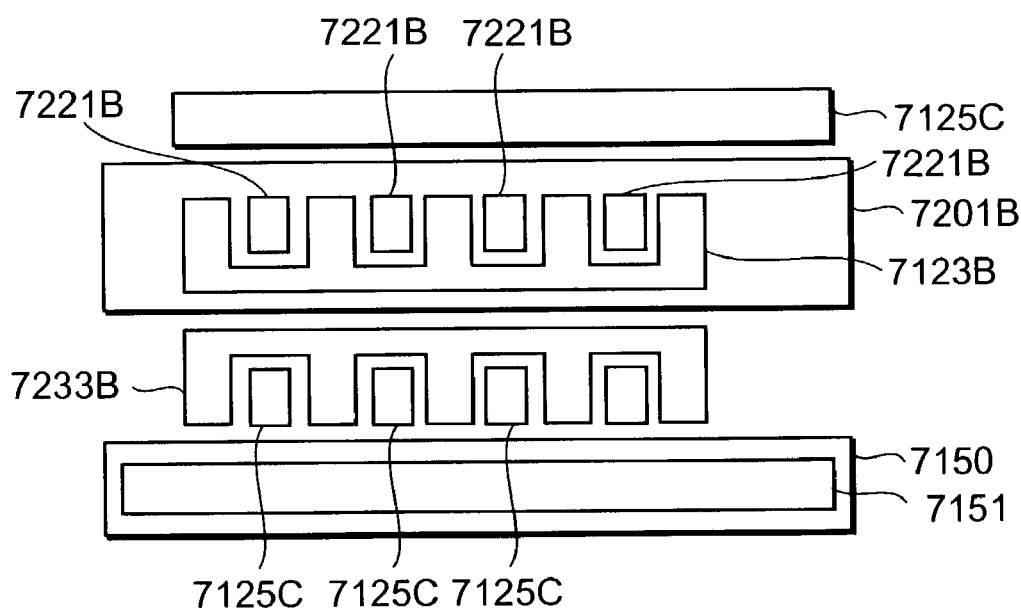
FIG. 28B depicts a view for explaining a third modification of an eleventh embodiment of an ESD protection device of the present invention, and depicts a schematic plan view showing a planar outline configuration thereof.

Next, a second modified example of a eleventh embodiment is shown in FIG. 28A and a third modified example of a eleventh embodiment is shown in FIG. 28B.

As shown in FIG. 28A, a second modified example of a eleventh embodiment of an ESD protection device 17 of the present embodiment is provided with a first P well region (not shown), second P diffusion regions 7123 (an anode electrode), a third P diffusion region 7125B (a trigger tap electrode), a P+ diffusion region ((7125) (a controled electrode for controlling subslate current)), N conductive type third N wells 7201 peripheries thereof being respectively surrounded by a first P well region (not shown), first N diffusion regions 7221, and a second N diffusion region (a cathode electrode) 7223 and all are formed on a P type substrae.

In the second modified example of a eleventh embodiment, the P+ diffusion region 7125 (a controled electrode for controlling subslate current) is replaced opposite sides of the second N diffusion region (a cathode electrode) 7233. Likewise, in the third modified example of a eleventh embodiment, the P+ diffusion region 7125C (a controled electrode for controlling subslate current) is replaced opposite sides of the second N diffusion region (a cathode electrode) 7233B.

As shown in FIG. 28B, a third modified example of a eleventh embodiment of an ESD protection device 18 of the present embodiment is provided with a first P well region (not shown), second P diffusion regions 7123B (an anode electrode), a third P diffusion region 7125B (a trigger tap electrode), a P+ diffusion region ((7125C) (a controled electrode for controlling subslate current)), N conductive type third N wells 7201B peripheries thereof being respectively surrounded by a first P well region (not shown), first N diffusion regions 7221B, and a second N diffusion region (a cathode electrode) 7223B and all are formed on a P type substrae.

In the second modified example of a eleventh embodiment, the P+ diffusion region 7125C (a controled electrode for controlling subslate current) is replaced opposite sides of the second N diffusion region (a cathode electrode) 7233B. Likewise, in the third modified example of a eleventh embodiment, the P+ diffusion region 7125C (a controled electrode for controlling subslate current) is replaced opposite sides of the second N diffusion region (a cathode electrode) 7233B, and is formed by a comb shape with the second N diffusion region (a cathode electrode) 7233B.

Figure 29:
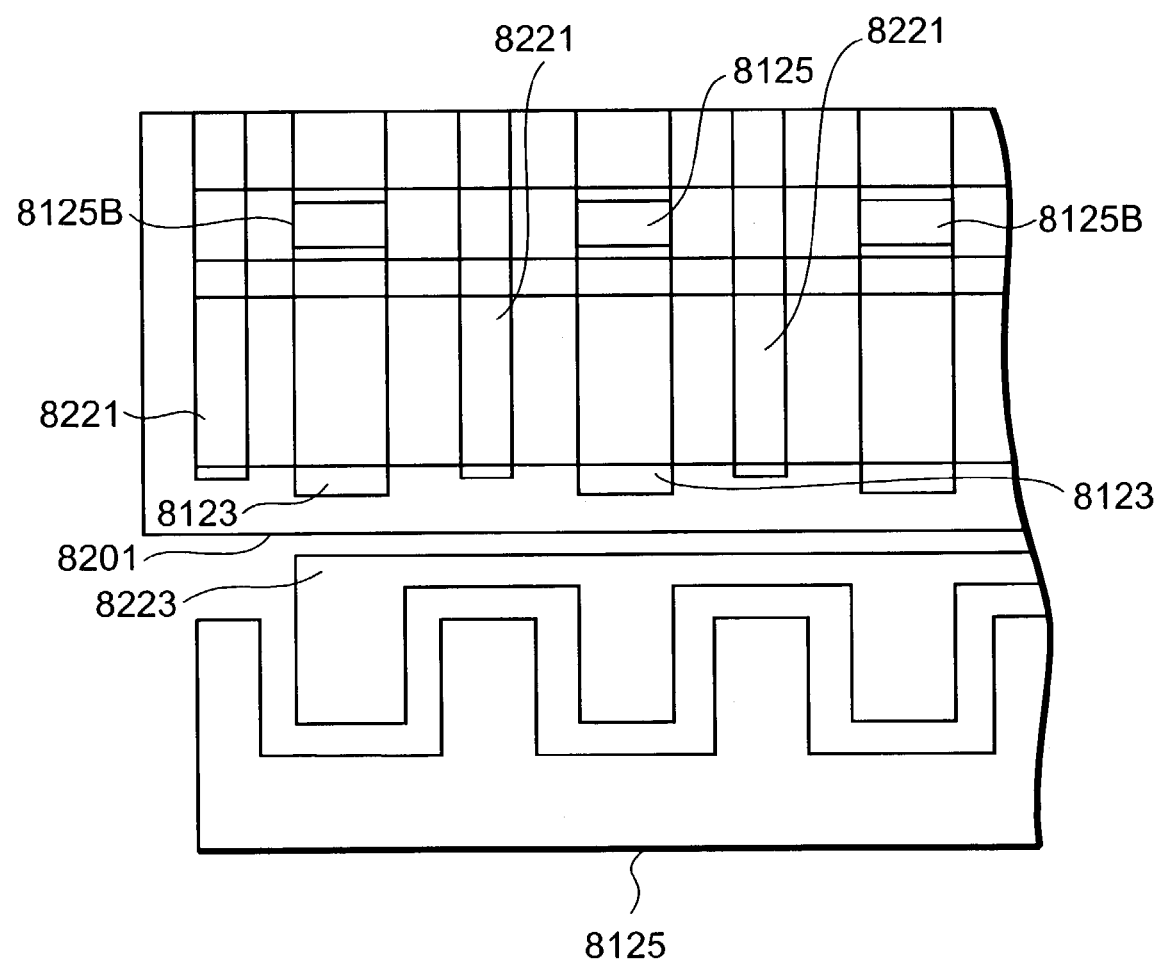
FIG. 29 depicts a view for explaining a twelfth embodiment of an ESD protection device of the present invention, and depicts a schematic plan view showing a planar outline configuration thereof.

Next, a twelevth embodiment of an ESD protection device of the present invention will be explained. FIG. 29 depicts a schematic plan view showing a planner outline configuration of the tenth embodiment of the ESD protection device of the present invention.

As shown FIG. 29, a twelevth embodiment of an ESD protection device 19 of the present embodiment is provided with a first P well region (not shown), a third P diffusion region 8125B (a trigger tap electrode), a P+ diffusion region ((8125) (a controled electrode for controlling subslate current)), N conductive type third N wells 8201 peripheries thereof being respectively surrounded by a first P well region (not shown), first N regions 8221, and a second N region (a cathode electrode) 8223 and all are formed on a P type substrae.

A twelevth embodiment of an ESD protection device of the present invention has regions 8123 (an anode electrode) and well contact regions 8221 which are fabricated by Ion implantation.

A twelevth embodiment of an ESD protection device of the present invention utilize non STI isolation when regions 8123 (an anode electrode) and well contact regions 8221 are fabricated. An electrode of the well contact regions 8221 is connected to regions 8123 (an anode electrode). That is, N+ injection regions 8221 and P+ injection regions are divided in the same diffusion regions.

Figure 30:
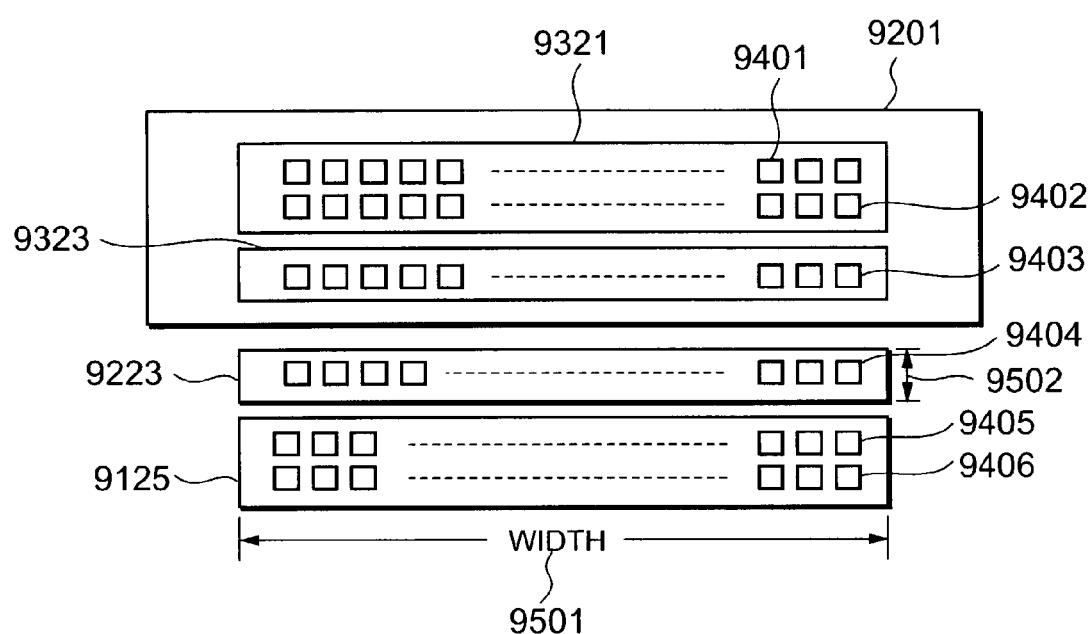
FIG. 30 depicts a view for explaining a thiteenth embodiment of an ESD protection device of the present invention, and depicts a schematic plan view showing a planar outline configuration thereof.

Next, a thirteenth embodiment of an ESD protection device of the present invention will be explained. FIG. 30 depicts a schematic plan view showing a planner outline configuration of the tenth embodiment of the ESD protection device of the present invention.

As shown FIG. 30, a thirteenth embodiment of of an ESD protection device 20 of the present embodiment is provided with a first P well region (not shown), a third P diffusion region (a trigger tap electrode, not shown), a P+ diffusion region ((9125) (a controled electrode for controlling subslate current)), N conductive type third N wells 9201 peripheries thereof being respectively surrounded by a first P well region (not shown), first N regions 9221, P diffusion regions 9323 (an anode electrode),a second N region (a cathode electrode) 9223 and all are formed on a P type substrae.

N conductive type third N wells 9201 has a lot of contact holes (9401, 9402), P diffusion regions 9323 (an anode electrode) has a lot of contact holes (9403), a second N region (a cathode electrode) 9223 has a lot of contact holes (9404).

A thirteenth embodiment of an ESD protection device of the present invention has a width 9502 of the regions 9323 (an anode electrode) which only one contact hole can be set therin, and a width 9502 of the regions 9223 (an cathode electrode) which only one contact hole can be set therin.

What is claimed is:

1. An electrostatic discharge protection device comprising:
 a P conducive type first P well region formed in a P conductive type semiconductor layer of a semiconductor substrate having said P conductive type semiconductor layer having a prescribed thickness on a surface thereof;
 an N conductive type first N well, a periphery thereof being surrounded by said first P well region, a second N diffusion region, P conductive type first P diffusion regions, and a P conductive type third P diffusion region arranged within said first P well; and
 a P conductive type second P diffusion region and N conductive type first N diffusion region arranged in said first N well,
 wherein said second N diffusion region is arranged between said first P diffusion regions and said first N well by being opposed thereto, a first boundary side constituting a boundary between said first N well and said first P well region and opposed to said second N diffusion region includes a first recessed portion incised on a side of said first N well,
 wherein said second P diffusion region is arranged between said first N diffusion region and said first boundary side, said third P diffusion region is arranged between said second N diffusion region and said first boundary side such that at least a part thereof is brought into said first recessed portion,
 wherein said first N diffusion region is connected to a high potential side electric source, both of said second N diffusion region and said first P diffusion regions are connected to a low potential side electric source, said second P diffusion region is connected to a desired external connection electrode, and said third P diffusion region is connected to an output end of a first trigger device an input end thereof being connected to said external connection electrode.

2. An electrostatic discharge protection device comprising:
 a P conductive type second P well and P conductive type first P diffusion regions formed in a P type semiconductor layer of a semiconductor substrate having the P conductive type semiconductor layer having a prescribed thickness on a surface thereof;
 an N conductive type second N well being brought into direct contact with the second P well;
 P conductive type third P diffusion regions and N conductive type second N diffusion regions arranged within the second P well; and
 a P conductive type second P diffusion region and an N conductive type first N diffusion region arranged within the second N well,
 wherein said third P diffusion regions are arranged at k portions (where k denotes an integer of 2 or more), said first P diffusion regions and said second N diffusion regions are arranged respectively at (k+1) portions, wherein said first P diffusion regions are arranged at (k+1) portions on a first straight line while are brought into direct contact with said second P well at an outside of said second P well, and said second N diffusion regions are arranged at (k+1) portions on a second straight line being in parallel with said first straight line, wherein a second boundary side constituting a boundary where said second P well and said second N well is brought into contact with each other includes first recessed portions disposed in k portions incised on a side of the second N well, wherein said second P diffusion regions are arranged between the first N diffusion region and said second boundary side, wherein said second N diffusion regions of (k+1) portions are arranged respectively between a portion said second N well of the second boundary side constituting projected portions and said first P diffusion regions and by corresponding the single second N diffusion region to said single first P diffusion region, wherein by corresponding, said single first recessed portion to said single third P diffusion region at least a part of respective third P diffusion regions is arranged to enter said first recessed portion, wherein said first N diffusion region is connected to a high potential side electric source, both of said second N diffusion regions and said first P diffusion regions are connected to a low potential side electric source, said second P diffusion region is connected to a desired external connection electrode, and said third P diffusion regions are connected to output ends of a first trigger device an input end thereof being connected to said external connection electrode.

3. The electrostatic discharge protection device according to claim 2, wherein said third P diffusion regions further have overlapped portions including cases where being brought into contact with a straight line extending along a boundary opposed to said second N well of said second N diffusion regions.

4. An electrostatic discharge protection device comprising:

a P conductive type first P well region formed on a P type semiconductor layer of a semiconductor substrate having the P conductive type semiconductor layer having a prescribed thickness on a surface thereof;

a plurality of N conductive type third N wells peripheries thereof being surrounded by the first P well region;

a P conductive type first P diffusion regions, a P conductive type third P diffusion region, and N conductive type second N diffusion region arranged in the first P well region; and P conductive type second P diffusion regions and N conductive type first N diffusion regions respectively arranged within the third N wells, wherein said plurality of third N wells are arranged on a first straight line by being isolated therefrom, wherein said second N diffusion region is arranged between said third N wells and said first P diffusion regions by being isolated from and opposed to any of the plurality of said third N wells, wherein said first N diffusion regions and said second P diffusion regions are arranged respectively in said third N wells by aligning in a direction orthogonal to a direction of a first straight line so that said second P diffusion regions come closer to said second N diffusion region, wherein said third P diffusion region is arranged between said plurality of third N wells, wherein said first N diffusion regions are connected to a high potential side electric source, both of the second N diffusion region and said first diffusion regions are connected to a low potential side electric source, said second P diffusion regions are connected to desired external connection electrodes, and said third P diffusion region is connected to an output end of a first trigger device an input end thereof being connected to said external connection electrode.

5. The electrostatic discharge protection device according to claim 4, wherein said third P diffusion region is arranged such that, there being existed a straight line in a direction of said first straight line crossing simultaneously with said second P diffusion regions.

6. An electrostatic discharge protection device comprising:

a P conductive type first P well region formed in a P type semiconductor layer of a semiconductor substrate having the P conductive type semiconductor layer having a prescribed thickness on the surface thereof;

a N conductive type fourth N well a periphery thereof being surrounded by the first P well region;

a P conductive type first P diffusion region and N conductive type second N diffusion region arranged within the first P well region;

a P conductive type second P diffusion region and N conductive type first N diffusion region arranged within the fourth N well; and a plurality of first blank portions being exposed the first P well region provided in the second N diffusion region, and third P diffusion regions arranged in the first blank portions, wherein said fourth N well is arranged between said first P diffusion region and said second N diffusion region by being opposed thereto and isolated therefrom, wherein said first N diffusion region and said second P diffusion region are arranged side by side so that said first N diffusion region comes closer to a side of said first P diffusion region, and said second P diffusion region comes closer to a side of the second N diffusion region, wherein said first blank portions are arranged along a third boundary side constituting a boundary between said second N diffusion region and said first P well region and, by being opposed to said fourth N well and isolated therefrom, wherein said first N diffusion region is connected to a high potential side electronic source, both of said second N diffusion region and said first P diffusion region are connected to a low potential side electronic source, and the second P diffusion region is connected to a desired external connection electrode, and said third P diffusion regions are connected to an output end of a first trigger device an input end thereof being connected to the external connection electrode.

7. The electrostatic discharge protection device according to claim 6, wherein contact holes connected to said second N diffusion region are formed in a region on an opposite side to a side of said third boundary side with respect to a straight line in a direction in parallel with said third boundary side passing through a boundary on a side of said third boundary side of said first blank portion.

8. An electrostatic discharge protection device comprising:
- a P conductive type third P well region formed in a P type semiconductor layer of a semiconductor substrate having the P conductive type semiconductor layer having a prescribed thickness on a surface thereof;
- an N conductive type third N diffusion region and a N conductive type fourth N diffusion region;
- a gate region;
- an N conductive type fourth N well a periphery thereof being surrounded by the third P well region;
- a P conductive type first P diffusion region and a P conductive type third P diffusion region being arranged within the third P well region;
- a P conductive type second P diffusion region and a N conductive type first N diffusion region being arranged within the fourth N well; and
- a second N diffusion region arranged by striding over a fourth boundary side constituting a boundary between the third P well region and a P type semiconductor layer region,
- wherein said fourth N well is arranged between said first P diffusion region and said second N diffusion region being opposed thereto and directions of respective boundaries opposing thereto being in parallel with said fourth boundary side,
- wherein said first N diffusion region and said second P diffusion region are arranged side by side so that said first N diffusion region coming closer to a side of said first P diffusion region and said second P diffusion region coming closer to a side of the second N diffusion region,
- wherein the second N diffusion region includes respectively a plurality of projected portions reaching to the P type semiconductor layer region and a plurality of recessed portions reaching to said third P well region on a boundary of on opposite side of a third boundary side constituting said boundary between said second N diffusion region and said third P well region and opposed to said fourth N well,
- wherein said third P diffusion regions are arranged in said third P well region portions of said respective recessed portions, said third N diffusion region is arranged by opposing to a boundary on an opposite side of the third boundary side of said second N diffusion region, said gate region is arranged by being brought into contact with a boundary on an opposite side of said boundary opposed to the second N diffusion region of said third N diffusion region, the fourth N diffusion region is arranged by being opposed to said third N diffusion region via said gate region and being brought into contact with said gate region, and said boundary of said third N diffusion region opposed to said second N diffusion region include projected portions being brought into direct contact with said third P diffusion regions by passing through the recessed portions,
- wherein said first N diffusion region is connected to a high potential side electric source, all of said second N diffusion region, said first P diffusion region, and said gate electrode provided in said gate region are connected to a low potential side electric source, and both of said second P diffusion region and said fourth P diffusion region are connected to desired external connection electrodes. In that case, said boundary where said third N diffusion region and said fourth N diffusion region are respectively brought into contact with said gate region may constitute a straight line shape along a direction of said fourth boundary side.

9. The electrostatic discharge protection device according to claim 8, wherein a boundary being brought into contact respective said third N diffusion region and said fourth N diffusion region with said gate region is in a shape of a straight line along a direction in said fourth boundary side.

10. An electrostatic discharge protection device comprising:
- a P conductive type first P well region formed in a P type semiconductor layer of a semiconductor substrate having the P conductive type semiconductor layer having a prescribed thickness on a surface thereof;
- an N conductive type fifth N well a periphery thereof being surrounded by the first P well region;
- a P conductive type fourth P well a periphery thereof being surrounded by the fifth N well;
- a P conductive type first P diffusion region and a N conductive type second N diffusion region arranged within the first P well region;
- a P conductive type second P diffusion region and a N conductive type first N diffusion region arranged within the fifth N well; and
- a third P diffusion region arranged within the fourth P well,
- wherein said second N diffusion region is arranged between said fifth N well and said first P diffusion region by being opposed thereto,
- wherein said second P diffusion region is arranged between said first N diffusion region and the second N diffusion region by being opposed thereto,
- wherein said second P diffusion region surrounds a periphery of said fourth P well,
- wherein the first N diffusion region is connected to a high potential side electric source, both of said second N diffusion region and said first P diffusion region are connected to a low potential side electric source, said second P diffusion region is connected to a desired external connection electrode, and said third P diffusion region is connected to an output end of a first trigger device an input end thereof being connected to said external connection electrode.

11. An electrostatic discharge protection device comprising:
- a P conductive type first P well region formed on the P type semiconductor layer of a semiconductor substrate having the P conductive type semiconductor layer having a prescribed thickness on a surface thereof;
- an N conductive type sixth N well and a N conductive type seventh N well peripheries thereof being surrounded respectively by the first P well regions;
- a P conductive type first P diffusion region and a N conductive type second N diffusion region arranged within the first P well region;
- a second P diffusion region and a first N diffusion region arranged within the sixth N well;
- a fourth P diffusion region arranged within the seventh N well,
- wherein said sixth N well is arranged between said first P diffusion region and said second N diffusion region by opposing thereto,
- wherein said first N diffusion region is arranged between said first P diffusion region and the second P diffusion region by opposing thereto,
- wherein said second N diffusion region includes a N—N overlapped portion overlapped with said seventh N well and is arranged by being opposed the N—N overlapped portion to said fourth P diffusion region, wherein the first N diffusion region is connected to a high potential side electric source, both of said second N diffusion region and said first P diffusion region are connected to a low potential side electric source, said second P diffusion region is connected to a desired external connection electrode, and said fourth P diffusion region is connected to an output end of a first trigger device an input end thereof being connected to said external connection electrode.

12. The electrostatic discharge protection device according to claim 11, wherein said second N diffusion region has a boundary opposed to said sixth N well constituting a straight line shaped straight line side, a boundary on an opposite side to said straight line side constituting a first irregularity side having a comb shaped irregularity, and a projected portion of said first irregularity side constitutes said N—N overlapped portion overlapped with said seventh P well, said fourth P diffusion region is arranged opposed to said first irregularity side, a boundary of said fourth P diffusion region opposed to said first irregularity side constituting a second irregularity side having a comb shaped irregularity, and said second N diffusion region and said fourth P diffusion region are arranged such that one projected portion of said first irregularity side and said second irregularity side being brought into and brought in mesh with other recessed portion thereof.

13. An electrostatic discharge protection device comprising:
a P conductive type first P well region formed in a P type semiconductor layer of a semiconductor substrate having the P conductive type semiconductor layer having a prescribed thickness on a surface thereof,
an N conductive type sixth N well and a N conductive type sixth N well respective peripheries thereof are surrounded by the first P well region;
a P conductive type first P diffusion region and P conductive type third P diffusion regions and an N conductive type second N diffusion region arranged within the first P well region;
a second P diffusion region and a first N diffusion region arranged within the sixth N well; and
a fourth P diffusion region arranged within the seventh N well,
wherein said sixth N well is arranged between said first P diffusion region and said second N diffusion region,
wherein said first N diffusion region is arranged between said first P diffusion region and said second P diffusion region by opposing thereto,
wherein a boundary of said second N diffusion region opposing to said sixth N well is a straight line shaped straight line side, a boundary on an opposite side to the straight line side constitutes a first irregularity side including a comb shaped irregularity, and a projected portion of said first irregularity side constitutes an N—N overlapped portion overlapped with said seventh N well,
wherein said fourth P diffusion region is arranged opposed to said first irregularity side,
wherein a boundary of said fourth P diffusion region opposed to said first irregularity side constitutes a second irregularity side having a comb shaped irregularity, and said second N diffusion region and said fourth P diffusion region are arranged such that one projected portion of said first irregularity side and said second irregularity side being brought into and brought in mesh with other recessed portion thereof, wherein said third P diffusion regions are arranged within said first P well region of respective recessed portion of said first irregularity side, wherein said first N diffusion region is connected to a high potential side electric source, both of said second N diffusion region and said first P diffusion region are connected to a low potential side electric source, said second P diffusion region is connected to a desired external connection electrode, and said third P diffusion regions are connected to a first output end of a second trigger device having said first output end and a second output end an input end thereof being connected to an external connection electrode, and said fourth P diffusion region is connected to said second output end.

14. The electrostatic discharge protection device according to claim 13, wherein said the EDS protection device has connection interconnection connecting respective said third P diffusion regions each other.

15. An electrostatic discharge protection device comprising:
a P conductive type first P well region formed in a P type semiconductor layer of said semiconductor substrate having said P conductive type semiconductor layer having a prescribed thickness on a surface thereof;
an N conductive type eighth N well and an N conductive type ninth N well respective peripheries thereof are surrounded by said first P well region;
an N conductive type second N diffusion region arranged within said first P well region; and
a second P diffusion region and a first N diffusion region arranged within said eighth N well, and a fourth P diffusion region arranged in said ninth N well,
wherein said second N diffusion region is arranged between said eighth N well and said ninth N well,
wherein a boundary of said second N diffusion region opposed to said eighth N well constitutes a straight line shaped straight line side, a boundary on an opposite side to said straight line side constitutes a first irregularity side having a comb shaped irregularity, and a projected portion of said first irregularity side constitutes an N—N overlapped portion overlapped with said ninth N well,
wherein a boundary where said first N diffusion region and said second P diffusion region opposed to each other has an irregular shape and one projected portion is entered into and brought in mesh with other recessed portion,
wherein said second P diffusion region is arranged between said first N diffusion region and said second N diffusion region by being isolated therefrom, said fourth P diffusion region is arranged by opposing to said first irregularity side, a boundary of said fourth P diffusion region opposed to said first irregularity side constitutes a second irregularity side having a comb shaped irregularity,
wherein said second N diffusion region and said second irregularity side of said fourth P diffusion region are arranged such that one projected portion of said first irregularity side and said second irregularity side being entered into and brought in mesh with other recessed portion thereof,
wherein said first N diffusion region is connected to a high potential side electric source, said second N diffusion region is connected to a low potential side electric source, said second P diffusion region is connected to a desired external connection electrode, and said fourth P diffusion region is connected to an output end of a first trigger device an input end thereof being connected to said external connection electrode.

16. An electrostatic discharge protection device comprising:
a P conductive type first P well region formed in a P type semiconductor layer of a semiconductor substrate having the P conductive type semiconductor layer having a prescribed thickness on a surface thereof;
an N conductive type tenth N well and a plurality of N conductive type third N wells respective peripheries thereof being surrounded by the first P well region;
first P diffusion regions, third P diffusion regions and fifth P diffusion regions of respective P conductive types and N conductive type second N diffusion regions and a fifth N diffusion region arranged within the first P well region, and a P conductive type second P diffusion region and N conductive type first N diffusion region respectively arranged in the third N well; and
a P conductive type sixth P diffusion region and N conductive type sixth N diffusion region arranged within the tenth N well,
wherein a plurality of third N wells are arranged in a straight line shape,
wherein two directions orthogonal to each other constitute respectively X direction and Y direction, when an a direction of arranging of the plurality of third N wells constitute said Y direction,
wherein said tenth N well is arranged between said third N wells, said second N diffusion regions are arranged between said third N wells and said first P diffusion regions and by being isolated from and opposed to said third N wells in said X direction, said first N diffusion regions and said second P diffusion regions are arranged side by side in X direction within respective third N wells by setting said second P diffusion regions on a side of said second diffusion regions, said sixth N diffusion region and said sixth P diffusion region are arranged side by side in said X direction within the tenth N well by setting said sixth P diffusion region on a side of said fifth N diffusion region, and said first P diffusion regions, and being isolated from and opposed to said tenth N well in X direction, said third P diffusion regions arranged between respective third N wells and tenth N well, and the fifth P diffusion regions are arranged on an opposite side to said third P diffusion regions by sandwiching said third N wells in said Y direction.
wherein said first N diffusion region and said sixth N diffusion region are connected to high potential electric sources, both of said first P diffusion regions and said second N diffusion regions are connected to a low potential side electric source, the second P diffusion regions and said sixth P diffusion region are connected to desirable external connection electrodes, said third P diffusion regions is connected to an output end of a first trigger device input end thereof being connected to said external connection electrode, and said fifth N diffusion region is connected to said fifth P diffusion regions.

17. The electrostatic discharge protection device according to claim 16, wherein said third P diffusion region and fifth P diffusion region are arranged on a same straight line of said Y direction.

18. The electrostatic discharge protection device according to claim 16, wherein said third P diffusion region is arranged such that when a straight line passing through an end portion of said X direction of respective said third P diffusion region is extended in said Y direction, a straight line passing through said one end portion crosses said tenth N well, and a straight line passing through said other end portion crosses said fifth N diffusion region.

19. The electrostatic discharge protection device according to claim 16, wherein said fifth P diffusion region is arranged such that when a straight line passing through an end portion in said X direction of said respective fifth P diffusion region is extended in said Y direction, a straight line passing through said one end portion crosses said third N well, a straight line passing through said other end portion crosses said second N diffusion region.

20. The electrostatic discharge protection device according to claim 16, wherein each of said first P diffusion regions is arranged in a central portion of said Y direction of each said second N diffusion regions opposed to said first P diffusion regions in said X direction.

21. The electrostatic discharge protection device according to claim 1, wherein said first trigger device is an N channel type field effect transistor by connecting a gate electrode to a low potential side electric source interconnection, one end of source drain passage is connected to said external connection electrode, and other end constitutes an output end of corresponding first trigger device.

22. The electrostatic discharge protection device according to claim 1, wherein said first trigger device is a first diode row by connecting all of m pieces (however, m denotes positive integer) of PN junction diode in series by constituting such that a cathode of a preceding step is connected to an anode of a following step, an anode of an initial step is connected to said external connection electrode, and a cathode of a final step constitutes an output end of corresponding first trigger device.

23. The electrostatic discharge protection device according to claim 13, wherein said second trigger device is a second diode row by connecting all of (m+1) pieces (however, m denotes a positive integer) of PN junction diode in series by constituting such that a cathode of a preceding step is connected to an anode of a following step, an anode of an initial step is connected to said external connection electrode, and a cathode of a final step and a cathode at m steps constitute a first output end and a second output end of respectively corresponding second trigger device.

24. The electrostatic discharge protection device according to claim 1, wherein said second trigger device includes a N channel type field effect transistor (hereinafter, referred to as NMOS) and PN junction diode, a gate electrode of said NMOS is connected to a low potential side electric source interconnection and a source drain passage are connected between said external connection electrode and the anode of said PN junction diode, and the cathode and anode of said PN junction diode are constituted as a first output end and a second output end of respective corresponding second trigger device.

25. The electrostatic discharge protection device according to claim 1, wherein said first N diffusion region and said second P diffusion region are arranged by being brought into direct contact.

26. The electrostatic discharge protection device according to claim 1, wherein said first N diffusion region and said second P diffusion region are arranged by isolating therefrom.

27. The electrostatic discharge protection device according to claim 16, wherein said first N diffusion region and said second P diffusion region are arranged by being brought into direct contact with and said sixth N diffusion region and said fifth P diffusion region are arranged by being brought into direct contact with each other.

28. The electrostatic discharge protection device according to claim 16, wherein said first N diffusion region and said second P diffusion region are arranged by being isolated therefrom and said sixth N diffusion region and said fifth P diffusion region area arranged by being isolated therefrom.

29. The electrostatic discharge protection device according to claim 1, wherein said semiconductor substrate is fabricated by depositing a prescribed thickness of a P conductive type epitaxial layer on a surface of a P type substrate having resistivity of 10 Ω·cm or less.

30. An electrostatic discharge protection device comprising:
   a P type semiconductor substrate;
   a first N type well region fabricated on a surface of said P type semiconductor substrate;
   a first P type region fabricated in said first N type well region;
   a second N type region fabricated on said surface of said P type semiconductor substrate;
   a silicon controlled rectifier having said first P type region as an anode region, said second N type region as an cathode region;
   a controlled region controlling a first current flowing from said anode region to said cathode region;
   wherein, said controlled region control said first current so as to control said first current uniformly flowing within said semiconductor substrate;
   wherein, said controlled region is formed within at least one of nearest position of said anode region and said cathode region.

31. An electrostatic discharge protection device according to claim 30, wherein said controlled region is formed within a position on said surface of said P type semiconductor substrate so as to control said first current not flowing under said cathode region.

32. An electrostatic discharge protection device according to claim 30, further comprising a first trigger tap region controlling a first trigger current turning on a lateral NPN bipolar transistor formed in said silicon controlled rectifier;
   wherein, said first trigger tap region control said first trigger current so as to control said first trigger current uniformly flowing within said semiconductor substrate.

33. An electrostatic discharge protection device according to claim 32, further comprising a second trigger tap region controlling a second trigger current turning on a vertical PNP bipolar transistor formed in said silicon controlled rectifier;
   wherein, said second trigger tap region control is formed in said on said surface of said P type semiconductor substrate;
   wherein, said second trigger tap region control said second trigger current so as to control said second trigger current uniformly flowing within said semiconductor substrate.

* * * * *